(12) United States Patent
Charles et al.

(10) Patent No.: US 12,437,918 B2
(45) Date of Patent: Oct. 7, 2025

(54) CAPACITOR MOUNT

(71) Applicant: AmRad Manufacturing, LLC, Universal City, TX (US)

(72) Inventors: Jonathan Coburn Charles, Ormond Beach, FL (US); Christopher Roger Baron, Palm Coast, FL (US); Jeffrey Steven Howard, Deltona, FL (US)

(73) Assignee: AmRad Manufacturing, LLC, Universal City, TX (US)

( * ) Notice: Subject to any disclaimer, the term of this patent is extended or adjusted under 35 U.S.C. 154(b) by 0 days.

(21) Appl. No.: 18/891,578

(22) Filed: Sep. 20, 2024

(65) Prior Publication Data

US 2025/0104913 A1 Mar. 27, 2025

Related U.S. Application Data

(60) Provisional application No. 63/584,739, filed on Sep. 22, 2023.

(51) Int. Cl.
*H05K 5/02* (2006.01)
*H01G 2/04* (2006.01)

(52) U.S. Cl.
CPC .................................... *H01G 2/04* (2013.01)

(58) Field of Classification Search
CPC ............................ H05K 5/0017; H05K 5/0217
(Continued)

(56) References Cited

U.S. PATENT DOCUMENTS 1,665,499 A 4/1928 Hotch
1,707,959 A 4/1929 Fried
(Continued)

FOREIGN PATENT DOCUMENTS

CA 2285721 A1 4/2000
CA 188725 A 12/2021
(Continued)

OTHER PUBLICATIONS

[No Author Listed], "AC Capacitors," brochure by AmRad Engineering, Inc., May 19, 2014, 4 pages.
(Continued)

*Primary Examiner* — Hung S. Bui
(74) *Attorney, Agent, or Firm* — Fish & Richardson P.C.

(57) ABSTRACT

A mount includes a rectangular shaped back surface configured to interface to a surface of a separate object, a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter, and a channel configured to receive a strap and that extends through the mount, the channel having a closed channel portion, a first open channel portion, and a second open channel portion, wherein the strap extended through the channel secures the cylindrical-shaped capacitor having a first diameter or the cylindrical-shaped capacitor having a second diameter received by the mount.

30 Claims, 36 Drawing Sheets

(58) Field of Classification Search
USPC .......................... 361/807, 809, 810
See application file for complete search history.

(56) References Cited

U.S. PATENT DOCUMENTS

| | | | |
|---|---|---|---|
| 1,789,949 A | 1/1931 | Georgiev | |
| 1,943,714 A | 1/1934 | Bailey | |
| 2,050,062 A | 8/1936 | Mershon | |
| 2,202,166 A | 5/1940 | Peck | |
| D122,825 S | 10/1940 | Peck, V | |
| D124,726 S | 1/1941 | Shimer | |
| D130,952 S | 12/1941 | Miller | |
| 2,296,123 A | 9/1942 | Stimson | |
| 2,569,925 A | 10/1951 | Deeley | |
| 2,607,833 A | 8/1952 | Schomaker | |
| 2,779,813 A | 1/1957 | Collins | |
| 2,896,008 A | 7/1959 | Putz | |
| 2,968,752 A | 1/1961 | Rubinstein | |
| 2,974,234 A | 3/1961 | Rowe | |
| 3,010,056 A | 11/1961 | Kurland | |
| 3,015,687 A | 1/1962 | Ruscito | |
| 3,041,477 A | 6/1962 | Lucien et al. | |
| 3,181,974 A * | 5/1965 | Mannie | H01M 50/213 |
| | | | 439/153 |
| 3,210,457 A | 10/1965 | Hancock | |
| 3,246,205 A | 4/1966 | Miller | |
| 3,302,081 A | 1/1967 | Grahame | |
| 3,304,473 A | 2/1967 | Netherwood et al. | |
| D209,054 S | 10/1967 | Braiman et al. | |
| D210,210 S | 2/1968 | Braiman et al. | |
| 3,377,510 A | 4/1968 | Rayno | |
| 3,454,858 A | 7/1969 | Robinson | |
| 3,473,088 A | 10/1969 | Ernst | |
| 3,524,614 A | 8/1970 | Sorth | |
| 3,553,542 A | 1/1971 | Stonemetz | |
| 3,555,370 A | 1/1971 | Bowling | |
| 3,593,066 A | 7/1971 | Norman | |
| 3,771,321 A | 11/1973 | Maksy | |
| 3,803,457 A | 4/1974 | Yamamoto | |
| 3,921,041 A | 11/1975 | Stockman | |
| 3,955,170 A | 5/1976 | Geishecker | |
| 3,988,650 A | 10/1976 | Fritze | |
| 4,009,425 A | 2/1977 | Muranaka | |
| 4,028,595 A | 6/1977 | Stockman | |
| 4,095,902 A | 6/1978 | Florer et al. | |
| 4,106,068 A | 8/1978 | Flanagan | |
| 4,107,758 A | 8/1978 | Shirn et al. | |
| 4,112,424 A | 9/1978 | Lapeyre | |
| 4,112,474 A | 9/1978 | Wilson et al. | |
| D253,887 S | 1/1980 | Truner et al. | |
| 4,190,702 A | 2/1980 | Pun et al. | |
| 4,209,815 A | 6/1980 | Rollins et al. | |
| 4,240,126 A | 12/1980 | Sanvito | |
| 4,263,638 A | 4/1981 | Stockman et al. | |
| 4,312,027 A | 1/1982 | Stockman | |
| 4,326,237 A | 4/1982 | Markarian et al. | |
| 4,352,145 A | 9/1982 | Stockman | |
| 4,360,848 A | 11/1982 | Noutko et al. | |
| 4,363,078 A | 12/1982 | Dwyer | |
| 4,388,669 A | 6/1983 | Cichanowski | |
| 4,398,782 A | 8/1983 | Markarian | |
| 4,408,818 A | 10/1983 | Markarian | |
| 4,420,791 A | 12/1983 | Shedigian | |
| 4,447,854 A | 5/1984 | Markarian | |
| 4,459,637 A | 7/1984 | Shedigian | |
| 4,486,809 A | 12/1984 | Deak et al. | |
| 4,546,300 A | 10/1985 | Shaikh | |
| 4,558,394 A | 12/1985 | Stockman | |
| 4,586,107 A | 4/1986 | Price | |
| 4,609,967 A | 9/1986 | Shedigian | |
| 4,621,301 A | 11/1986 | Shedigian | |
| 4,631,631 A | 12/1986 | Hodges et al. | |
| 4,633,365 A | 12/1986 | Stockman | |
| 4,633,367 A | 12/1986 | Strange et al. | |
| 4,633,369 A | 12/1986 | Lapp et al. | |
| 4,639,828 A | 1/1987 | Strange et al. | |
| 4,642,731 A | 2/1987 | Shedigian | |
| 4,698,725 A | 10/1987 | MacDougall et al. | |
| 4,737,785 A | 4/1988 | Zottnik | |
| 4,754,361 A | 6/1988 | Venturini | |
| 4,757,414 A | 7/1988 | Barker et al. | |
| 4,768,129 A | 8/1988 | Sasaki | |
| 4,811,161 A | 3/1989 | Sasaki | |
| 4,812,941 A | 3/1989 | Rice et al. | |
| 4,813,116 A | 3/1989 | Thiel et al. | |
| 4,897,760 A | 1/1990 | Bourbeau | |
| D307,000 S | 4/1990 | Sasaki | |
| 4,992,910 A | 2/1991 | Evans | |
| 5,006,726 A | 4/1991 | Okumura | |
| 5,019,934 A | 5/1991 | Bentley et al. | |
| 5,032,948 A | 7/1991 | Sakai | |
| 5,138,519 A | 8/1992 | Stockman | |
| 5,148,347 A | 9/1992 | Cox et al. | |
| 5,162,718 A | 11/1992 | Schroeder | |
| 5,196,818 A | 3/1993 | Anderson | |
| 5,247,236 A | 9/1993 | Schroeder | |
| 5,280,219 A | 1/1994 | Ghanbari | |
| 5,313,360 A | 5/1994 | Stockman | |
| 5,381,301 A | 1/1995 | Hudis | |
| 5,412,532 A | 5/1995 | Nishimori | |
| 5,528,120 A | 6/1996 | Brodetsky | |
| 5,561,357 A | 10/1996 | Schroeder | |
| 5,673,168 A | 9/1997 | Efford et al. | |
| 5,691,845 A | 11/1997 | Iwatsuka et al. | |
| 5,817,975 A | 10/1998 | Heilmann et al. | |
| 5,847,919 A | 12/1998 | Shimizu et al. | |
| 5,866,276 A | 2/1999 | Ogami et al. | |
| D408,266 S | 4/1999 | Santiago | |
| 5,921,820 A | 7/1999 | Dijkstra | |
| 5,940,263 A | 8/1999 | Jakoubovitch | |
| 6,009,348 A | 12/1999 | Rorvick et al. | |
| 6,014,308 A | 1/2000 | Stockman | |
| 6,031,713 A | 2/2000 | Takeisha et al. | |
| 6,064,563 A | 5/2000 | Yamada et al. | |
| 6,084,764 A | 7/2000 | Anderson | |
| 6,141,205 A | 10/2000 | Nutzman | |
| 6,147,856 A | 11/2000 | Karidis | |
| 6,157,531 A | 12/2000 | Breyen et al. | |
| 6,160,465 A | 12/2000 | Yamaguchi et al. | |
| 6,212,058 B1 | 4/2001 | Huber | |
| 6,222,270 B1 | 4/2001 | Lee | |
| 6,229,236 B1 | 5/2001 | Fisher | |
| 6,233,133 B1 | 5/2001 | Weng | |
| 6,282,078 B1 | 8/2001 | Tsai | |
| 6,282,081 B1 | 8/2001 | Takabayashi et al. | |
| 6,310,756 B1 | 10/2001 | Miura et al. | |
| 6,313,978 B1 | 11/2001 | Stockman et al. | |
| 6,320,348 B1 | 11/2001 | Kadah | |
| 6,373,720 B1 | 4/2002 | Fechtig et al. | |
| 6,385,490 B1 | 5/2002 | O'Phelan | |
| 6,404,618 B1 | 6/2002 | Beard et al. | |
| 6,410,184 B1 | 6/2002 | Horiuchi | |
| D464,028 S | 10/2002 | Clark | |
| 6,466,429 B1 | 10/2002 | Volfkovich et al. | |
| 6,490,158 B1 | 12/2002 | Ellyson et al. | |
| 6,538,544 B1 | 3/2003 | Hardy | |
| 6,552,893 B2 | 4/2003 | Tanaka | |
| 6,697,249 B2 | 2/2004 | Maletin et al. | |
| 6,706,079 B1 | 3/2004 | Shmatko et al. | |
| 6,720,689 B2 | 4/2004 | Agnes et al. | |
| 6,798,677 B2 | 9/2004 | Jakob et al. | |
| 6,807,048 B1 | 10/2004 | Nielsen | |
| 6,816,541 B1 | 11/2004 | Hong | |
| 6,819,545 B1 | 11/2004 | Lobo et al. | |
| 6,842,328 B2 | 1/2005 | Schott | |
| 6,847,517 B2 | 1/2005 | Iwaida et al. | |
| D505,211 S | 5/2005 | Stanchfrield | |
| 6,888,266 B2 | 5/2005 | Burke et al. | |
| 6,922,330 B2 | 7/2005 | Nielson et al. | |
| 6,930,874 B2 | 8/2005 | Lobo et al. | |
| 6,982,539 B1 | 1/2006 | Ward | |
| 6,995,971 B2 | 2/2006 | Norton | |
| 7,031,139 B1 | 4/2006 | Fayram | |
| 7,046,498 B1 | 5/2006 | Huang | |

(56) References Cited

U.S. PATENT DOCUMENTS

| | | | |
|---|---|---|---|
| D522,456 S | 6/2006 | Matsumoto | |
| D524,758 S | 7/2006 | Sweeney | |
| D525,209 S | 7/2006 | Sweeney | |
| D529,202 S | 9/2006 | Nagai et al. | |
| 7,110,240 B2 | 9/2006 | Breyen | |
| 7,184,256 B1 | 2/2007 | Sato | |
| D541,218 S | 4/2007 | Colopy | |
| 7,203,053 B2 | 4/2007 | Stockman | |
| 7,206,186 B1 | 4/2007 | Knight | |
| D541,746 S | 5/2007 | Colopy | |
| 7,251,123 B2 | 7/2007 | O'Phelan | |
| D551,943 S | 10/2007 | Hodjat | |
| D562,237 S | 2/2008 | Tu | |
| 7,337,945 B1 | 3/2008 | Riggs et al. | |
| 7,365,959 B1 | 4/2008 | Ward | |
| D573,008 S | 7/2008 | Sipe | |
| 7,423,861 B2 * | 9/2008 | Stockman | H01G 5/011 361/512 |
| 7,474,519 B2 | 1/2009 | Stockman | |
| 7,474,520 B2 | 1/2009 | Kashihara | |
| 7,492,574 B2 | 2/2009 | Fresard et al. | |
| 7,511,941 B1 | 3/2009 | Gallay | |
| 7,521,148 B2 | 4/2009 | Kim | |
| 7,547,233 B2 | 6/2009 | Inoue et al. | |
| 7,619,420 B2 | 11/2009 | Stockman | |
| 7,667,954 B2 | 2/2010 | Lessner | |
| 7,710,713 B2 | 5/2010 | Restorff | |
| D621,789 S | 8/2010 | Wang et al. | |
| D623,500 S | 9/2010 | Langner | |
| 7,835,133 B2 | 11/2010 | Stockman | |
| 7,848,079 B1 | 12/2010 | Gordin et al. | |
| 7,867,290 B2 | 1/2011 | Nielsen | |
| 7,881,043 B2 | 2/2011 | Hirose et al. | |
| 7,911,762 B2 | 3/2011 | Stockman | |
| 7,911,766 B2 | 3/2011 | Caumont et al. | |
| 7,952,854 B2 | 5/2011 | Stockman | |
| 7,987,593 B1 | 8/2011 | Gorst | |
| 8,029,290 B2 | 10/2011 | Johnson | |
| 8,159,810 B1 | 4/2012 | Gorst et al. | |
| 8,170,662 B2 | 5/2012 | Bocek | |
| 8,174,817 B2 | 5/2012 | Georgopoulos et al. | |
| 8,270,143 B2 | 9/2012 | Stockman | |
| 8,274,778 B2 | 9/2012 | Yoshinaga et al. | |
| 8,310,802 B2 | 11/2012 | Fujii et al. | |
| 8,331,076 B2 | 12/2012 | Tuncer | |
| D681,438 S | 5/2013 | Chen | |
| 8,456,795 B2 | 6/2013 | Stockman | |
| 8,465,555 B2 | 6/2013 | Sherwood | |
| 8,472,164 B2 | 6/2013 | Kim | |
| 8,514,547 B2 | 8/2013 | Galvagni | |
| 8,514,548 B2 | 8/2013 | Miller et al. | |
| 8,531,815 B2 | 9/2013 | Stockman | |
| 8,537,522 B2 | 9/2013 | Stockman | |
| 8,559,161 B2 | 10/2013 | Takeoka et al. | |
| 8,619,409 B2 | 12/2013 | Yawata et al. | |
| D707,639 S | 6/2014 | Rego | |
| 8,761,875 B2 | 6/2014 | Sherwood | |
| 8,842,411 B2 | 9/2014 | Zhang | |
| 8,853,318 B2 | 10/2014 | Tielemans | |
| 8,861,178 B2 | 10/2014 | Terashima et al. | |
| 8,861,184 B2 | 10/2014 | Schmidt | |
| 8,871,850 B2 | 10/2014 | Koh et al. | |
| 8,885,318 B2 | 11/2014 | Stockman | |
| 8,891,224 B2 | 11/2014 | Stockman | |
| D728,480 S | 5/2015 | Chang | |
| D729,164 S | 5/2015 | Chen | |
| 9,105,401 B2 | 8/2015 | Dreissig | |
| D747,225 S | 1/2016 | Decook | |
| 9,318,261 B2 | 4/2016 | Stockman | |
| 9,324,501 B2 | 4/2016 | Stockman | |
| 9,343,238 B2 | 5/2016 | Stockman | |
| 9,378,893 B2 | 6/2016 | Stockman | |
| 9,412,521 B2 | 8/2016 | Stockman | |
| 9,424,995 B2 | 8/2016 | Stockman | |
| 9,466,429 B1 | 10/2016 | Casanova | |
| D771,567 S | 11/2016 | Flohe et al. | |
| 9,496,086 B2 | 11/2016 | Stockman | |
| 9,536,670 B2 | 1/2017 | Stockman | |
| D795,819 S | 8/2017 | Okamoto et al. | |
| 9,859,060 B1 | 1/2018 | Stockman et al. | |
| 9,916,934 B1 | 3/2018 | Casanova et al. | |
| 9,947,467 B2 | 4/2018 | Goodson et al. | |
| D816,470 S | 5/2018 | Green | |
| D818,437 S | 5/2018 | Stockman | |
| D818,959 S | 5/2018 | Stockman | |
| 10,056,194 B2 | 8/2018 | Stockman | |
| 10,056,195 B2 | 8/2018 | Stockman | |
| D829,173 S | 9/2018 | Stockman | |
| 10,134,528 B2 | 11/2018 | Stockman | |
| 10,147,549 B2 | 12/2018 | Stockman | |
| 10,147,550 B1 | 12/2018 | Stockman | |
| 10,163,571 B2 | 12/2018 | Stockman | |
| 10,209,751 B2 | 2/2019 | Zikes | |
| 10,249,439 B2 | 4/2019 | Stockman | |
| 10,256,195 B2 | 4/2019 | Yamamoto | |
| 10,366,840 B1 | 7/2019 | Stockman | |
| 10,475,588 B2 | 11/2019 | Stockman | |
| 10,497,518 B1 | 12/2019 | Stockman | |
| 10,497,520 B1 | 12/2019 | Stockman | |
| 10,586,655 B1 | 3/2020 | Stockman | |
| D886,741 S | 6/2020 | Okajima et al. | |
| D892,741 S | 8/2020 | Biere | |
| D893,441 S | 8/2020 | Rao | |
| D906,247 S | 12/2020 | Stockman | |
| D906,969 S | 1/2021 | Stockman | |
| D914,605 S | 3/2021 | Xin | |
| 11,177,074 B1 | 11/2021 | Stockman | |
| 11,183,330 B2 | 11/2021 | Stockman | |
| 11,183,335 B2 | 11/2021 | Stockman et al. | |
| 11,183,336 B2 | 11/2021 | Stockman et al. | |
| 11,183,337 B1 | 11/2021 | Stockman et al. | |
| 11,183,338 B2 | 11/2021 | Stockman | |
| 11,183,341 B1 | 11/2021 | Stockman | |
| 11,189,425 B1 | 11/2021 | Stockman et al. | |
| 11,189,426 B1 | 11/2021 | Stockman | |
| D937,785 S | 12/2021 | Hess | |
| D938,912 S | 12/2021 | Stockman | |
| 11,195,663 B2 | 12/2021 | Stockman | |
| 11,424,077 B1 | 8/2022 | Stockman et al. | |
| 11,575,298 B2 | 2/2023 | Waldrop et al. | |
| 11,631,550 B2 | 4/2023 | Stockman | |
| 11,651,903 B1 | 5/2023 | Stockman | |
| 2001/0025618 A1 | 10/2001 | Kelling | |
| 2002/0030548 A1 | 3/2002 | Dejima | |
| 2003/0099106 A1 * | 5/2003 | Belknap | H01G 2/04 362/265 |
| 2004/0136170 A1 * | 7/2004 | Tsunezaki | H05K 3/301 361/810 |
| 2005/0272012 A1 | 12/2005 | Logan et al. | |
| 2006/0007387 A1 | 1/2006 | Xiao | |
| 2006/0050468 A1 | 3/2006 | Inoue et al. | |
| 2006/0067031 A1 | 3/2006 | Crane | |
| 2006/0120012 A1 * | 6/2006 | Tsunezaki | H01G 2/04 361/274.1 |
| 2006/0201971 A1 | 9/2006 | Wegman | |
| 2006/0227495 A1 | 10/2006 | Stockman | |
| 2007/0025051 A1 | 2/2007 | Stockman | |
| 2007/0221278 A1 | 9/2007 | Sartorius | |
| 2007/0236860 A1 | 10/2007 | Stockman | |
| 2007/0279015 A1 | 12/2007 | Livingston et al. | |
| 2007/0283707 A1 | 12/2007 | Hatano | |
| 2007/0295877 A1 | 12/2007 | Gaydos | |
| 2008/0025549 A1 | 1/2008 | Avera | |
| 2008/0042641 A1 | 2/2008 | Stockman | |
| 2008/0158780 A1 | 7/2008 | Stockman | |
| 2008/0217053 A1 | 9/2008 | Vojtila et al. | |
| 2009/0001921 A1 | 1/2009 | Mills | |
| 2009/0052109 A1 | 2/2009 | Stockman et al. | |
| 2009/0059463 A1 | 3/2009 | Ward | |
| 2009/0115557 A1 | 5/2009 | Minowa | |
| 2009/0219665 A1 | 9/2009 | Stockman | |
| 2009/0261762 A1 | 10/2009 | Tsuchiya | |
| 2011/0063775 A1 | 3/2011 | Stockman | |
| 2011/0075342 A1 | 3/2011 | Gotham et al. | |

(56) References Cited

U.S. PATENT DOCUMENTS

| | | |
|---|---|---|
| 2011/0134584 A1 | 6/2011 | Stockman |
| 2011/0157764 A1 | 6/2011 | Stockman |
| 2011/0228444 A1 | 9/2011 | Lai et al. |
| 2011/0228446 A1 | 9/2011 | Stockman |
| 2011/0303808 A1* | 12/2011 | Bileth ............... A47G 23/0266 248/311.2 |
| 2011/0317333 A1 | 12/2011 | Chun |
| 2012/0026046 A1 | 2/2012 | Bit-Babik |
| 2013/0003252 A1 | 1/2013 | Stockman |
| 2013/0214720 A1 | 8/2013 | Stockman |
| 2013/0329342 A1 | 12/2013 | Stockman |
| 2013/0343029 A1 | 12/2013 | Stockman |
| 2014/0049205 A1 | 2/2014 | Curiel |
| 2014/0126107 A1 | 5/2014 | Yoda et al. |
| 2014/0138009 A1 | 5/2014 | Lim |
| 2014/0201018 A1 | 7/2014 | Chassin |
| 2014/0232485 A1 | 8/2014 | Bultitude |
| 2014/0285949 A1 | 9/2014 | Stockman |
| 2014/0347784 A1 | 11/2014 | Stockman et al. |
| 2015/0016012 A1 | 1/2015 | Stockman |
| 2015/0022991 A1 | 1/2015 | Stockman et al. |
| 2015/0138690 A1 | 5/2015 | Stockman |
| 2015/0255218 A1 | 9/2015 | Stockman et al. |
| 2015/0287308 A1 | 10/2015 | Shuttleworth |
| 2016/0028230 A1 | 1/2016 | Elfman |
| 2016/0203916 A1 | 7/2016 | Stockman |
| 2016/0233030 A1 | 8/2016 | Stockman |
| 2017/0011855 A1 | 1/2017 | Stockman et al. |
| 2017/0032898 A1 | 2/2017 | Stockman |
| 2017/0110252 A1 | 4/2017 | Stockman |
| 2017/0186554 A1 | 6/2017 | Stockman |
| 2017/0229242 A1 | 8/2017 | Goodson et al. |
| 2017/0236646 A1 | 8/2017 | Stockman |
| 2017/0372838 A1 | 12/2017 | Casanova et al. |
| 2018/0061600 A1 | 3/2018 | Ito |
| 2018/0090278 A1 | 3/2018 | Stockman et al. |
| 2018/0254150 A1 | 9/2018 | Stockman et al. |
| 2018/0261391 A1 | 9/2018 | Stockman |
| 2019/0057815 A1 | 2/2019 | Stockman |
| 2019/0057817 A1 | 2/2019 | Stockman |
| 2020/0066470 A1 | 2/2020 | Mitchell |
| 2020/0143994 A1 | 5/2020 | Stockman |
| 2020/0155983 A1 | 5/2020 | Maeda |
| 2020/0161057 A1 | 5/2020 | Stockman et al. |
| 2020/0211780 A1 | 7/2020 | Stockman |
| 2020/0251285 A1 | 8/2020 | Stockman |
| 2022/0328247 A1 | 10/2022 | Stockman |
| 2022/0328254 A1 | 10/2022 | Stockman |
| 2022/0336156 A1 | 10/2022 | Stockman |
| 2022/0336157 A1 | 10/2022 | Stockman |
| 2022/0336161 A1 | 10/2022 | Stockman |
| 2022/0344101 A1 | 10/2022 | Stockman |
| 2022/0352789 A1 | 11/2022 | Waldrop et al. |
| 2022/0392710 A1 | 12/2022 | Stockman |
| 2023/0261549 A1 | 8/2023 | Waldrop et al. |
| 2023/0307188 A9 | 9/2023 | Stockman |
| 2023/0307189 A1 | 9/2023 | Stockman |
| 2023/0411082 A1 | 12/2023 | Stockman |
| 2024/0006126 A1 | 1/2024 | Stockman |
| 2024/0029961 A1 | 1/2024 | Stockman |
| 2024/0087811 A1 | 3/2024 | Stockman |

FOREIGN PATENT DOCUMENTS

| | | |
|---|---|---|
| CA | 204951 S | 12/2021 |
| CA | 204952 A | 1/2022 |
| CN | 2033169 U | 2/1989 |
| CN | 3607691 | 2/2007 |
| CN | 101991323 A | 3/2011 |
| CN | 301914077 | 5/2012 |
| CN | 104201077 A | 12/2014 |
| CN | 204351550 U | 5/2015 |
| CN | 204539389 U | 8/2015 |
| CN | 304472828 | 1/2018 |
| CN | 304806073 | 9/2018 |
| CN | 305610350 | 2/2020 |
| CN | 305625370 | 2/2020 |
| CN | 305780976 | 5/2020 |
| CN | 308082810 | 6/2023 |
| EP | 129714 A2 | 1/1985 |
| EP | 1115128 A2 | 7/2001 |
| EP | 2587503 A2 | 5/2013 |
| FR | 2343221 | 9/1977 |
| FR | 2802708 A1 | 6/2001 |
| GB | 517718 | 2/1940 |
| GB | 2169747 A | 7/1986 |
| GB | 2070861 A | 12/1997 |
| JP | S49-8747 A | 1/1974 |
| JP | S49-8748 A | 1/1974 |
| JP | H04-139807 A | 5/1992 |
| JP | H07-211596 A | 8/1995 |
| JP | D1273871 | 6/2006 |
| JP | D1288240 | 12/2006 |
| JP | 2007-059477 A | 3/2007 |
| JP | D1456333 | 11/2012 |
| JP | 2015-13025 A9 | 7/2015 |
| KR | 20160061825 A | 6/2016 |
| MX | 62279 | 8/2021 |
| MX | 65643 | 12/2022 |
| WO | WO 2010031594 A1 | 3/2010 |
| WO | WO 2010037186 A1 | 4/2010 |
| WO | WO 2014190072 A1 | 11/2014 |
| WO | WO 2020123834 A1 | 6/2020 |

OTHER PUBLICATIONS

[No Author Listed], "American Radionic Co., Inc. Introduces a New Circuit Component the Patented Ultramet™ Capacitor," poster by American Radionic Co., Inc., (poster undated, 1980 year date appears below one image), 1 page.

[No Author Listed], "American Radionic Co., Inc. Introduces a New Circuit Component, the Patented Ultramet™ Capacitor," poster by American Radionic Co., Inc., which is reprint from Electronic News dated Feb. 11, 1980, 1 page.

[No Author Listed], "American Radionic Co., Inc. Introduces . . . The World's First Multiple Metallized Film Dielectric Capacitor Produced from a Single Winding! The Patented Ultramet™ Capacitor," poster by American Radionic Co., Inc. available on or before Jul. 17, 2014, 1 page.

[No Author Listed], "American Radionic Introduces Capacitors Without Compromise", Color Brochure, 1989, 1 page.

[No Author Listed], "Industrial Power Factor Correction Capacitors," Cornell Dubilier, available on or before May 12, 2015, 1 page.

[No Author Listed], "Product of the Year Awards," Electronic Products Magazine, Jan. 1981, pp. 39-45.

[No Author Listed], "Super-Sized Show," ASHRae Journal Show Daily, 2005 International Air-Conditioning, Heating, Refrigerating Exposition, Tuesday, Feb. 8, 2005, 24 pages.

[No Author Listed], "The Patented Ultramet™ Capacitor," poster by American Radionic Co., Inc., available on or before Jul. 17, 2014, 3 pages.

[No Author Listed], "The Patented Ultramet™ Capacitor. A product of years of American Radionic research & development," poster by American Radionic Co., Inc., available on or before Jul. 17, 2014, 1 page.

[No Author Listed], Photograph 1 from Defendants' First Supplemental Disclosure of Non-Infringement and Invalidity Contentions, available on or before May 12, 2015, (1 page).

[No Author Listed], Photograph 10, from Defendants' First Supplemental Disclosure of Non-Infringement and Invalidity Contentions, available on or before May 12, 2015, (1 page).

[No Author Listed], Photograph 11, from Defendants' First Supplemental Disclosure of Non-Infringement and Invalidity Contentions, available on or before May 12, 2015, (1 page).

[No Author Listed], Photograph 12, from Defendants' First Supplemental Disclosure of Non-Infringement and Invalidity Contentions, available on or before May 12, 2015, (1 page).

(56) References Cited

OTHER PUBLICATIONS

[No Author Listed], Photograph 13, from Defendants' First Supplemental Disclosure of Non-Infringement and Invalidity Contentions, available on or before May 12, 2015, (1 page).
[No Author Listed], Photograph 14, from Defendants' First Supplemental Disclosure of Non-Infringement and Invalidity Contentions, available on or before May 12, 2015, (1 page).
[No Author Listed], Photograph 15, from Defendants' First Supplemental Disclosure of Non-Infringement and Invalidity Contentions, available on or before May 12, 2015, (1 page).
[No Author Listed], Photograph 16, from Defendants' First Supplemental Disclosure of Non-Infringement and Invalidity Contentions, available on or before May 12, 2015, (1 page).
[No Author Listed], Photograph 17, from Defendants' First Supplemental Disclosure of Non-Infringement and Invalidity Contentions, available on or before May 12, 2015, (1 page).
[No Author Listed], Photograph 18, from Defendants' First Supplemental Disclosure of Non-Infringement and Invalidity Contentions, available on or before May 12, 2015, (1 page).
[No Author Listed], Photograph 19, from Defendants' First Supplemental Disclosure of Non-Infringement and Invalidity Contentions, available on or before May 12, 2015, (1 page).
[No Author Listed], Photograph 2, from Defendants' First Supplemental Disclosure of Non-Infringement and Invalidity Contentions, available on or before May 12, 2015, (1 page).
[No Author Listed], Photograph 20, from Defendants' First Supplemental Disclosure of Non-Infringement and Invalidity Contentions, available on or before May 12, 2015, (1 page).
[No Author Listed], Photograph 3, from Defendants' First Supplemental Disclosure of Non-Infringement and Invalidity Contentions, available on or before May 12, 2015, (1 page).
[No Author Listed], Photograph 4, from Defendants' First Supplemental Disclosure of Non-Infringement and Invalidity Contentions, available on or before May 12, 2015, (1 page).
[No Author Listed], Photograph 5, from Defendants' First Supplemental Disclosure of Non-Infringement and Invalidity Contentions, available on or before May 12, 2015, (1 page).
[No Author Listed], Photograph 6, from Defendants' First Supplemental Disclosure of Non-Infringement and Invalidity Contentions, available on or before May 12, 2015, (1 page).
[No Author Listed], Photograph 7, from Defendants' First Supplemental Disclosure of Non-Infringement and Invalidity Contentions, available on or before May 12, 2015, (1 page).
[No Author Listed], Photograph 8, from Defendants' First Supplemental Disclosure of Non-Infringement and Invalidity Contentions, available on or before May 12, 2015, (1 page).
[No Author Listed], Photograph 9, from Defendants' First Supplemental Disclosure of Non-Infringement and Invalidity Contentions, available on or before May 12, 2015, (1 page).
Albmagnets.com [online], "25×10×1.5mm Block Magnets | F25×10×1.5mm-AD," available on or before 2023, retrieved on Jul. 24, 2023, retrieved from URL<https://www.albmagnets.com/block-magnets/2254-25-x-10-x-15mm-block-magnets-f401nasa.html>, 5 pages.
Amazon.com [online] "TEMCo Dual Run Capacitor RC0120-50/5 nnfd 370 V 440 V VAC volt 50+5 uf AC Electric Motor HVAC," Aug. 29, 2014, retrieved on Oct. 22, 2018, retrieved from URL<https://www.amazon.com/TEMCo-Capacitor-RC0120-50-Electric Motor/dp/B01H0S87X6/ref+pd_sim_328_5>, 6 pages.
Amazon.com [online], "2"×3" Dry Erase Labels w/ clear Protective Flap, 50/Roll Backed w/ Clean-Remove Adhesive (Blue)," Apr. 1, 2015, retrieved on Apr. 5, 2018, retrieved from <URL: https://www.amazon.com/Labels-Protective-Backed-Clean-Remove-Adhesive/dp/B00VIDW1C1/ref=sr_1_18?ie=UTF8&clid=1522957818&sr=8-18&keycY0E2')/080')/0A6.>, 7 pages.
Amazon.com [online], "40+5 uf/ Mfd round Dual Universal Capacitor Trane Replacement USA2235- used for 370 or 440 VAC," Jun. 20, 2014, retrieved on Dec. 10, 2018, retrieved from URL <: https://www.amazon.com/Round-Universal-Capacitor-Replacement-USA2235/dpBOOGSU4401/ref=cnn_cr_arp_d_product_top?ie=UTF8, 6 pages.
Amazon.com [online], "7.5 uf/Mfd Oval Universal Capacitor Trane Replacement USA 2031-used for 370 or 440 VAC," Nov. 26, 2014, retrieved on Apr. 11, 2018, retrieved from <URL: https://www.amazon.com/Universal-Capacitor-Trane-Replacement—USA2031/dp/BOOGSU40KW/ref=pd_sim_328_3?_encoding-UTF8&pd_rd_i=BOOGSU40KW&pd_rd_r=YX6P84XR7NY113X4DWJG&pd_rd_w=gejaD&pd_rd_wg=NLVIY&psc=1&refRID=YX6P84XR7NY113X4DWJG.> 6 pages.
Amazon.com [online], "Amrad Engineering USA2215 Round Motor Run Capacitor, 40 MFD, 370/440 VAC," Dec. 4, 2013, retrieved on Oct. 10, 2018, retrieved from <URL:https://www.amazon.com/dp/B00FL70C0U/ref=cm_sw_r_cp_ep_dp_qIIZBbFD278ZE>, 6 pages.
Amazon.com [online], "AmRad Turbo 200 Mini Oval Capacitor: with label and color trim," May 5, 2015, retrieved on Apr. 10, 2018, retrieved from <URL: https://www.amazon.com/AmRad-Turbo-200-Mini-Oval/dp/BOOKQSKDOY/ref=pd_sbs_60_4?_encoding=UTF8&pd_rd_i=BOOKQSKDOY&pd_rd_r=A6')/0E2')/080')/0A6.>, 5 pages.
Amazon.com [online], "Amrad Turbo 200X Universal Motor Run Capacitor," Jan. 27, 2013, retrieved on Apr. 10, 2018, retrieved from <URL: https://www.amazon.com/Amrad-Turbo-Universal-Motor-Capacitor/dp/B00B610TOM/ref=pd_rhf_dp_s_cp_0_7?_encoding=UTF8&pd_rd_i=BOOB610TOM&pd_rd_r=N5WYCAD5Y36C86DFWDEG&pd_rd_w=6tW71&pd_rd_wg=DWEJcApsc=1&refRID=N5WYCAD5Y36C86DFWDEG.>, 6 pages.
Amazon.com [online], "AmRad USA2227 35+5 uf MFB 370 Volt VAC-Amrad Round Dual Run Capacitor Upgrade," Jun. 29, 2014, retrieved on Apr. 11, 2018, retrieved from <URL: https://www.amazon.com/AmRad-USA2227-MFD-370-Volt/dp/BOOGSU3YV8/ref=pd_day0_328_6?_encoding=UTF8&pd_rd_i=BOOGSU3YV8&pd_rd_r%E2')/080')/0A6.>, 6 pages.
Amazon.com [online], "BlueStars—Hard Start Capacitor," Aug. 29, 2019, retrieved on May 17, 2023, retrieved from URL<https://www.amazon.co.uk/dp/B07X463KD1/>, 1 page.
Amazon.com [online], "BlueStars 35+3 MFD uf 370 or 440 Volt Dual Run Round Capacitor CBB65 Replacement Part," May 7, 2021, retrieved on Jul. 21, 2023, retrieved from URL<https://www.amazon.com/dp/B094C8P8NT/>, 9 pages.
Amazon.com [online], "MARS-Motors & Armatures 12788 45/5 MFD 440V Round Motor Dual Run Capacitor," Jan. 25, 2012, retrieved on Apr. 11, 2018, retrieved from <URL: https://www.amazon.com/MARS-Motors-Armatures-12788-Capacitor/dp/BOOCOYS2CM/ref=pd_sim_328_6?_encoding=UTF8&pd_rd_i=BOOCOYS2CM&pd_rd_r=KEFT1DXGOAWQ1KCZDJFJ&pd_rd_w=LNF6S&pd_rd_wg=5eFTh&psc=1&refRID=KEFTIDXGOAWQ1KCZDJFJ.>, 7 pages.
Amazon.com [online], "Packard TRCFB405 40+5MFD/440/370VAC/RND Capacitor," May 1, 2015, retrieved on Apr. 26, 2018, retrieved from <URL: https://www.amazon.com/Packard-TRCFD405-5MFD-370VACCapacitor/dp/B009558E9U/ref=pd_sim_328_4?_encoding=UTF8&pd_rd_i=B009558E9U&pd_rd_r=SX1DRWZQZ8SH12JWHYH2&pd_rd_w-yljQe&pd_rd_wg=mH0n1&psc=1&refRID=SX1DRWZQZ8SH12JWHYH2&dpID=31IxzeyCr/0252B7L&preST=_QL70_&dpSrc=detail.>, 5 pages.
Amazon.com [online], "PowerWell 35+5 uf MFD 370 or 440 Volt Dual Rub Round Capacitor Kit TP-CAP-35/5/440R Condenser Straight Cool/Heat Pump Air Conditioner and Zip Tie," Aug. 1, 2016, retired on Apr. 6, 2018, retrieved from <URL:https://www.amazon.com/dp/B01F7P8GJO/ref=sspa_dk_detail_4?psc=1.>, 6 pages.
Amazon.com [online], "Titan TRCFD405 Dual Rated Motor Run Capacitor Round MFD 40/5 volts 440/370," Aug. 21, 2016, retrieved on Apr. 11, 2016, retrieved from <URL: https://www.amazon.com/gp/product/B01HPK5ANO/ref=s9_dcacsd_dcoop_bw_c_x_6_w.>, 6 pages.
Amazon.com [online]. "CPT00656-45 +5uf MFD 440 Volt VAC-Trane Round Dual Run Capacitor Upgrade," May 11, 2016, retrieved on Apr. 11, 2018, retrieved from <URL: https://www.amazon.com/CPT00656-Trane-Round-Capacitor-Upgrade/dp/BOOEVTIOMC/ref=cm_cr_arp_d_product_top?ie=UTF8.>, 6 pages.
Americanradionic.com, [online] "American Radionic Company's Chronology of Patents, New Products and Technology Transfer Programs—From the Present, to the Past, a Thirty-Five Year Review," online website having URL: http:/www.americanradionic.com/content/blogcategory/13/29/8/16 , accessed May 19, 2014, 3 pages.

(56) References Cited

OTHER PUBLICATIONS

Americanradionics.com, [online] "Home of the Turbo200 MultiUse Capacitor," Mar. 9, 2005, retrieved on May 29, 2014, online archive of website captured at URL<http://web.archive.org/web/20050309191805fw_/http://www.americanradionic.com/home>, 16 pages.
Amradcapacitors.com [online], "Capacitors—Motor Run, Oil Filled Capacitors, AC Rated. AmRad." Printout of website having URL: http://amradcapacitors.com/index.htm>, Jan. 3, 2003, 20 pages.
Amradmanufacturing.com [online], "AmRad—Turbo Easy-Start 5," available on or before Sep. 22, 2020, retrieved on May 16, 2023, retrieved from URL<https://amradmanufacturing.com/products/turbo-easy-start-5/>, 14 pages.
AnnexGlobal.com [online], "Full Line HVACR Product Catalog, " 2018, retrieved on Sep. 4, 2020, retrieved from URL<https://www.annerexglobal.conn/innages/SUPCO.pdf.>, 188 pages.
Answer and affirmative defenses to Complaint by Cornell-Dubliner Electronics, Inc. (Allaman, Melissa), Jan. 9, 2015, 10 pages.
Answer and affirmative defenses to Complaint by Packard Inc. (Allaman, Melissa), Jan. 9, 2015, 10 pages.
Archrnews.com, [online] "AmRad Engineering: Universal Capacitor," The Air Conditioning|Heating|Refrigeration News, Jan. 29, 2005, retrieved Jun. 2, 2014, Printout of website having URL: "http://www.archrnews.com/articles/print/amrad-engineering-universal-capacitor", 1 page.
Case Management and Scheduling Order: Amended Pleadings and Joinder of Parties due by Apr. 9, 2015. Discovery due by Feb. 16, 2016. Dispositive motions due by Apr. 7, 2016. Pretrial statement due by Aug. 11, 2016. All other motions due by Jul. 28, 2016. Plaintiff disclosure of expert report due by Dec. 10, 2015. Defendant disclosure of expert report due by Jan. 14, 2016. Final Pretrial Conference set for Aug. 18, 2016 at 01:15 PM in Orlando Courtroom 4 A before Judge Roy B. Dalton, Jr., Jury Trial Set for the trial team commencing Sep. 6, 2016 at 09:00 AM in Orlando Courtroom 4 A before Judge Roy B. Dalton Jr., Conduct mediation hearing by Mar. 29, 2016. Lead counsel to coordinate dates. Signed by Judge Roy B. Dalton, Jr. on Feb. 10, 2015. (VMF). (Entered: Feb. 10, 2015), 23 pages.
Complaint for Patent Infringement against Cornell-Dubliner Electronics, Inc., Packard Inc. with Jury Demand (Filing fee $400 receipt No. ORL-38930) filed by American Radionic Company, Inc. (Attachments: #1 Civil Cover sheet, #2 Exhibit A)(LMM) Modified on Nov. 19, 2014 (LMM). (Entered: Nov. 19, 2014), 47 pages.
Declaration of Noah C. Graubart in Support of Plaintiff's Claim Construction Brief by American Radionic Company, Inc. (Attachments: #1 Exhibit 1, #2 Exhibit 2, #3 Exhibit 3, #4 Exhibit 4, #5 Exhibit 5, #6 Exhibit 6) (Graubart, Noah) (Entered: Jun. 18, 2015), 250 pages.
Defendants' First Supplemental Disclosure of Non-Infringement and Invalidity Contentions, *American Radionic, Inc.*, v. *Packard, Inc., and Cornell-Dubilier Electronics, Inc.*, No. 6:14-cv-01881-RBD-KRS, filed on Apr. 20, 2015, 26 pages.
Document from Defendants' First Supplemental Disclosure of Non-Infringement and Invalidity Contentions that purported to be Standard for Safety UL 810 Capacitors, Underwriters Laboratories Inc. having multiple dates ranging from 1976 to 1988, 22 pages.
Ebay.com [online], "25+3 uF MFDx370 / 440 VAC Motor Run Capacitator AmRad USA2224BA—Made in USA," ebay.com, 2020, retrieved on Oct. 28, 2020, retrieved from URL: https://www.ebay.com/itm/25-3-uF-MFD-x-370-440-VAC-Motor-Run-Capacitor-AmRad-USA2224BA-Made-in-USA-/164162793031>, 15 pages.
Edisontechcenter.org [online], "Batteries:types and History: Bright Star 1.5 V Columbia dry cell," 2014, retrieved on Jan. 4, 2019, retrieved from <http://edisontechcenter.org/batteries.html#drycell.>, 10 pages.
Eveready.com [online], "1950s Eveready Battery," 2018, retrieved on Nov. 30, 2018, retrieved from URL<http://www.eveready.com/about-us/battery-history>, 2 pages.

First Amended Answer and affirmative defenses to 1 Complaint by Cornell-Dubliner Electronics, Inc. (Allaman, Melissa) (Entered: Feb. 4, 2015), 17 pages.
First Amended Answer and affirmative defenses to 1 Complaint by Packard Inc. (Allaman, Melissa) (Entered: Jan. 9, 2015), 17 pages.
Grainger, "Round Motor Dual Run Capacitor, 40/5 Microfarad Rating, 370VAC Voltage," 2017, retrieved on Aug. 24, 2017, retrieved from URL<https://www.grainger.com/product/5CMW3&AL!2966!3!166587674359!!!g!82128730437!?cm_mmc=PPC:+Google+PLA?campaignid=719691765&s_kwcid=AL!2966!3!166587674359!!!!82128730437!&ef_id=WRSnxQAAAILWhRlb:20170824174108:s>, 5 pages.
Hudis, Martin et al., "Motor-Run Capacitors," Motors & Motor Control, undated (reprinted from Appliance Manufacturer, Oct. 1994), 3 pages.
Hudis, Martin, "Plastic Case Self-Protected Liquid Filled AC Capacitors for 70° Applications," Presented at CAPTECH '97, Mar. 1997, 7 pages.
Hudis, Martin, "Technology Evolution in Metallized Polymeric Film Capacitors over the Past 10 Years," Presented at CARTS Symposium in Nice, France, Oct. 1996, 9 pages.
International Search Report and Written Opinion in International Appln. No. PCT/US2014/39003, mailed on Oct. 2, 2014, 8 pages.
Joint Pre-Hearing Statement re: Claim Construction by American Radionic Company, Inc., Packard Inc., Cornell-Dubliner Electronics, Inc. (Attachments: #1 Exhibit 1, #2 Exhibit 2) (Graubart, Noah), Modified on Jul. 24, 2015, 6 pages.
Ktool.net [online], "Mars 12200 TURBO 200 2.5/5/5/10/20/25 MFD Universal Round Run Capacitor," available on or before Jul. 3, 2022, retrieved on Jul. 21, 2023, retrieved from URL<https://www.ktool.net/mars-12200-turbo-200-2-5-5-5-10-20-25-mfd-universal-round-run-capacitor/?gclid=EAlalQobChM187646ZyggAMVwX9MChOcfgwbEAQYBCABEglXV_D_BWE>, 5 pages.
Macomber et al., "New Solid Polymer Aluminum Capacitors Improve Reliability," Electro Power Electronics, Oct. 1, 2001, 5 pages.
Macomber, Laird L., et al., "Solid Polymer Aluminum Capacitor Chips in DC-DC Converter Modules Reduce Cost and Size and Improve High-Frequency Performance," PCIM Power Electronics 2001 Proceeding for the PowerSystems World Conference, Sep. 2001, 8 pages.
Mallory Distributor Products Co., 1967 Precision Electronic Components Catalog, 52 pages.
Minute Entry, Proceedings of Claim Construction Hearing held before Judge Roy B. Dalton, Jr. on Aug. 24, 2015. Court Report: Arnie First (VMF) (FMV). (Entered: Aug. 24, 2015), 1 page.
NMR.mgh.harvard.edu [online], "Strategies to Repair or Replace Old Electrolytic Capacitors," available on or before Nov. 30, 2001, via Internet Archive: Wayback Machine URL <https://web.archive.org/web/20011130084328/https://www.nmr.mgh.harvard.edu/~reese/electrolytics/> retrieved on Apr. 22, 2021, URL <https://www.nmr.mgh.harvard.edu/-reese/electrolytics/>, 6 pages.
Notice of Filing of Claim Construction Evidence by American Radionic Company, Inc. (Attachments: #1 Exhibit 1, #2 Exhibit 2, #3 Exhibit 3) (Graubart, Noah) Modified on Aug. 25, 2015 (EJS). (Entered: Aug. 25, 2015), 31 pages.
Orbit.com [online], "Capacitor and relays. (Design - © Questel)," [Online PDF compilation of references selected by examiner], date ranges Dec. 1, 2004-Oct. 23, 2020, retrieved on May 24, 2023, retrieved from URL<https://www.orbit.com/export/UCZAH96B/pdf4/flfd9e1 a-5fbf46a1-a7a3-a0df0b968f4a-160819.pdf>, 18 pages.
Order granting 69 Motion for Consent Judgment and Injunction, Signed by Judge Roy B. Dalton, Jr. on Nov. 5, 2015. (CAC) (Entered Nov. 5, 2015), 4 pages.
Parente, Audrey, "Can-sized device the right fit," The Daytona Beach News-Journal, Jan. 3, 2005, 2 pages.
PCT International Preliminary Report on Patentability in International Appln. No. PCT/US2007/89034, dated Jul. 9, 2009, 6 pages.
PCT International Preliminary Report on Patentability in International Appln. No. PCT/US2014/039003, dated Dec. 3, 2015, 7 pages.

(56) References Cited

OTHER PUBLICATIONS

PCT International Preliminary Report on Patentability in International Appln. No. PCT/US2019/068738, dated Jul. 8, 2021, 11 pages.
PCT International Search Report and Written Opinion in International Appln. No. PCT/US2007/89034, dated Apr. 18, 2008, 9 pages.
PCT International Search Report and Written Opinion in International Appln. No. PCT/US2019/068738, dated Mar. 10, 2020, 13 pages.
Plaintiff's Brief re 59 Declaration Plaintiff's Claim Construction Brief filed by American Radionic Company, Inc. (Graubart, Noah), Entered Jun. 18, 2015, 38 pages.
Response to Plaintiff's Claim Construction Brief re 60 Brief—Plaintiff filed by Cornell-Dubliner Electronics, Inc., Packard Inc. (Killen, Craig) Modified on Jul. 17, 2015 (EJS). (Entered Jul. 16, 2015), 29 pages.
Ruby Lane.com [online], "SuzansTreasures.shop, 1940s Mazon Cobalt Glass Jar Medicine Bottle," 2019, retrieved on Jul. 22, 2019, retrieved from URL<https://www.rubylane.com/item/34499-CCKx20-x20205/Mazon-Cobalt-Glass-Jar-Medicine-Bottle, 3 pages.
Status report Joint Claim Construction Statement by American Radionic Company, Inc., Packard Inc., and Cornell-Dubliner Electronics, Inc. (Attachments: #1 Exhibit 1, #2 Exhibit 2) (Graubart, Noah) Modified on May 29, 2015 (SWT). Entered: May 28, 2015, 53 pages.
Supplyhouse.com [online], "2.5-67.5 MFD, AmRad Turbo 200 Universal Capacitor (370/440V)," available on or before 2018, retrieved on Jul. 21, 2023, retrieved from URL<https://www.supplyhouse.com/MARS-12200-2-5-67-5-MFD-AmRad-Turbo-200-Universal-Capacitor-370-440V>, 4 pages.
Supplyhouse.com [online], "23-208 MFD Turbolytic JR Universal Replacement Capacitor (125-330V)," available on or before Apr. 5, 2016, retrieved on Jul. 27, 2023, retrieved from URL<https://www.supplyhouse.com/MARS-11100-23-208-MFD-Turbolytic-JR-Universal-Replacement-Capacitor-125-330V>, 4 pages.
Transcript of Markman Hearing held on Aug. 24, 15 before Judge Roy B. Dalton, Jr., Court Reporter Arnie R. First, DRD, CRR< ArnieFirst.CourtReporter@gmail.com. Transcript may be viewed at the court public terminal or purchased through the Court Reporter before the deadline for Release of Transcript Restriction. After that date it may be obtained through PACER or purchased through the court Reporter, Redaction Request due Oct. 22, 2015. Redacted Transcript Deadline set for Nov. 2, 2015. Release of Transcript Restriction set for Dec. 30, 2015. (ARF) (Entered: Oct. 1, 2015), 90 pages.
Webarchive.org [online], "Capacitors—Motor Run, Oil Filled Capacitors, AC Rated. AmRad." Dec. 14, 2004, retrieved on May 29, 2014, online archive of website captured at <http://webarchive.org/web/20041214091042/http://americanradionic.com>, 13 pages.
Webarchive.org [online], "Capacitors—Motor Run, Oil Filled Capacitors, AC Rated. AmRad." Nov. 26, 2001, retrieved on May 29, 2014, Online archive of website captured at <http:/webarchive.org/web/20011126195819/http://www.americanradionic.com>, 13 pages.
Wikimedia.org [online], "Eveready PP4 battery," Oct. 22, 2016, retrieved on Nov. 30, 2018, retrieved from URL<https://connnnons.wikimedia.org/wiki/File:PP4-PP3-batteries.jpg>, 2 pages.
YouTube video [online] "AmRad's Turbo Installation" published on Apr. 22, 2012 by AmRad Engineering URL<https://www.youtube.com/watch?v=axo86NCbuNs&lc=UgguTwZgduBg5HgCoAEC>, 9 pages with machine transcript.
YouTube.com [online] "HVAC Run capacitor Made in the USA," Sep. 4, 2011, retrieved on Apr. 6, 2018, retrieved from <URL: https://www.youtube.com/watch?v=Xiw_xHXJHUg.>, 8 pages with machine transcript.
YouTube.com [online], "AC Fan/Compressor Not Working- How to Test/Repair Broken HVAC Run Start Capacitor Air, GE Dual Run Capacitor," Oct. 1, 2015, retrieved on Apr. 11, 2018, retrieved from <URL: https://www.youtube.com/watch?v=19A9IvQ611A&t-3s.>, 32 pages with machine transcript.
YouTube.com [online], "How to Install the Turbo 200 Capacitor Pt. 2," Jul. 15, 2011, retrieved on Apr. 11, 2018, retrieved from <URL: https://www.youtube.com/watch?v=U7h7pg12t6M.>, 3 pages.
YouTube.com [online], "HVAC Service : Install New Turbo 200 Capacitor," Jul. 29, 2011, retrieved on Apr. 11, 2018, retrieved from <URL: https://www.youtube.com/watch?v=R5B189BWrz0.>, 3 pages.

* cited by examiner

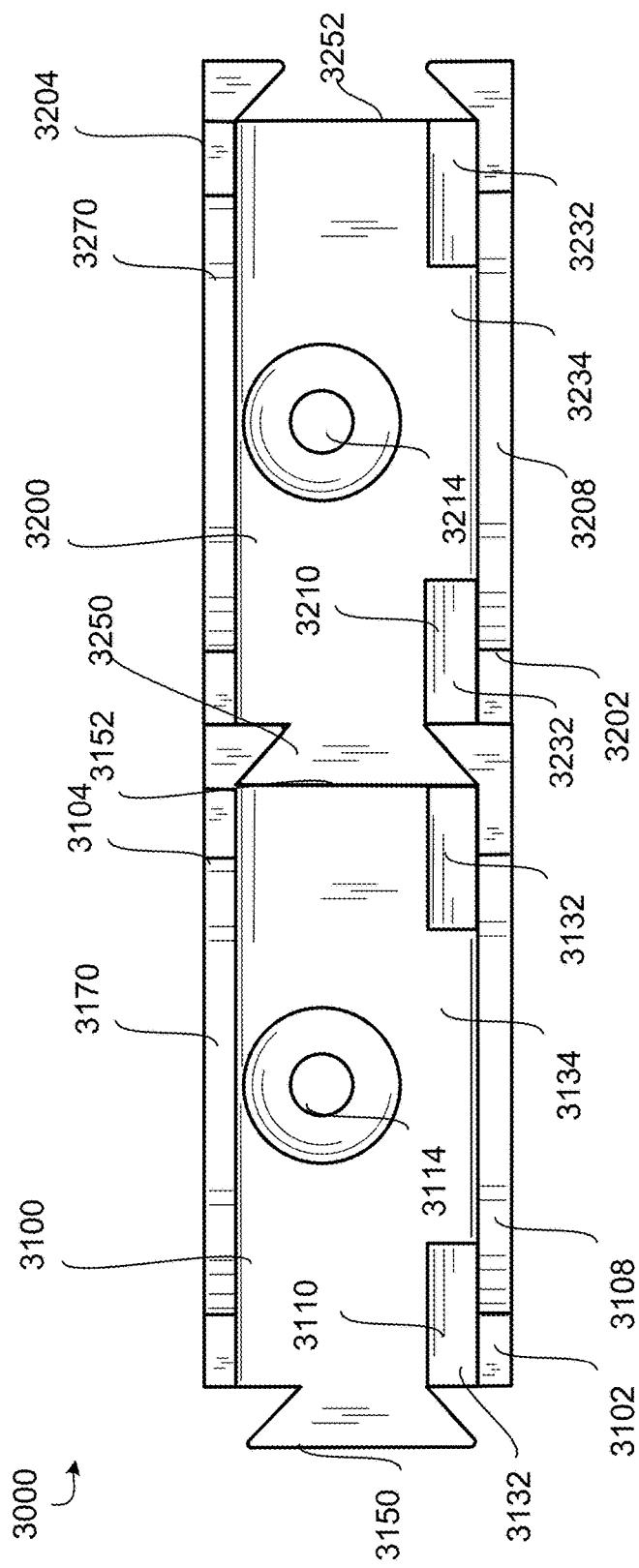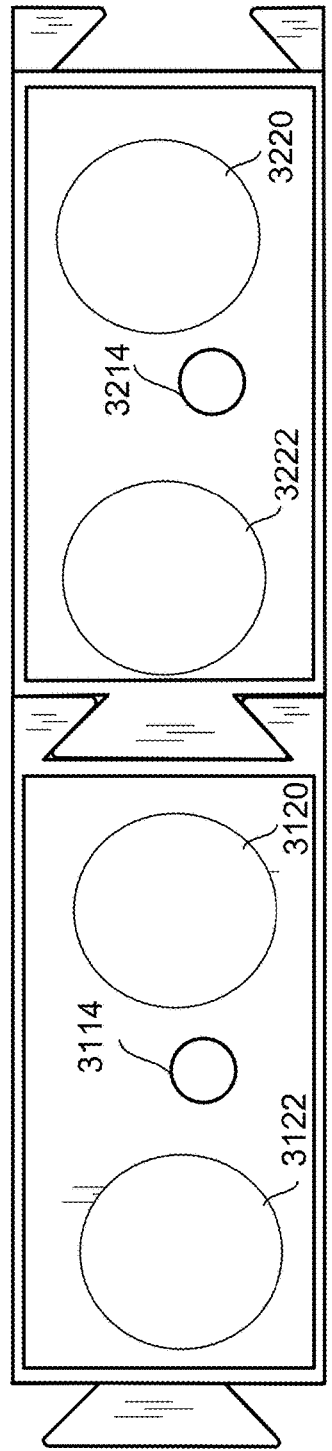
FIG. 32
FIG. 33

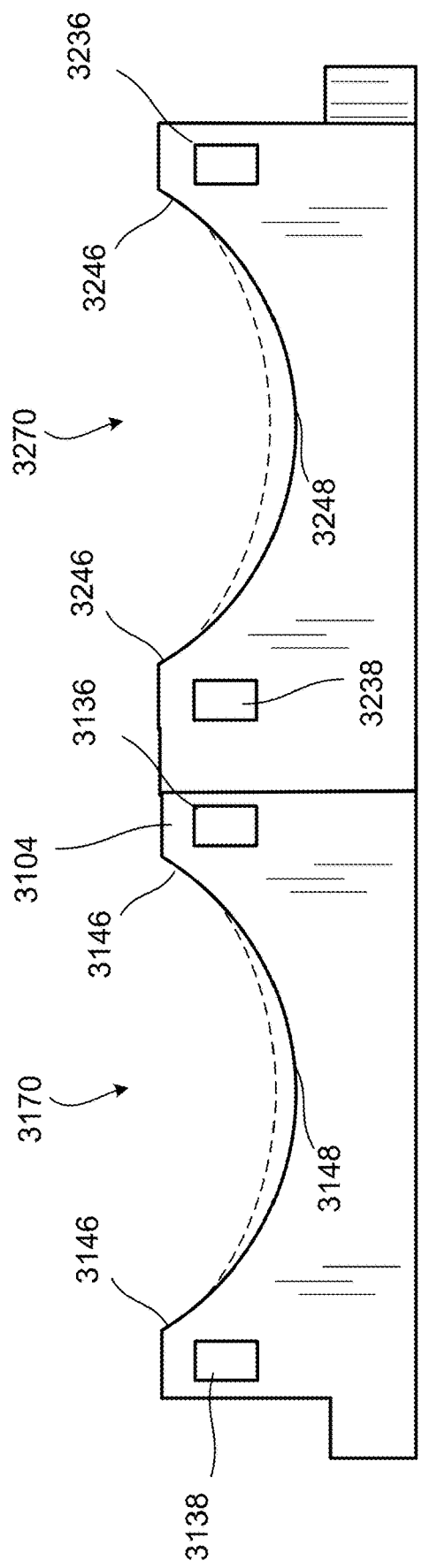

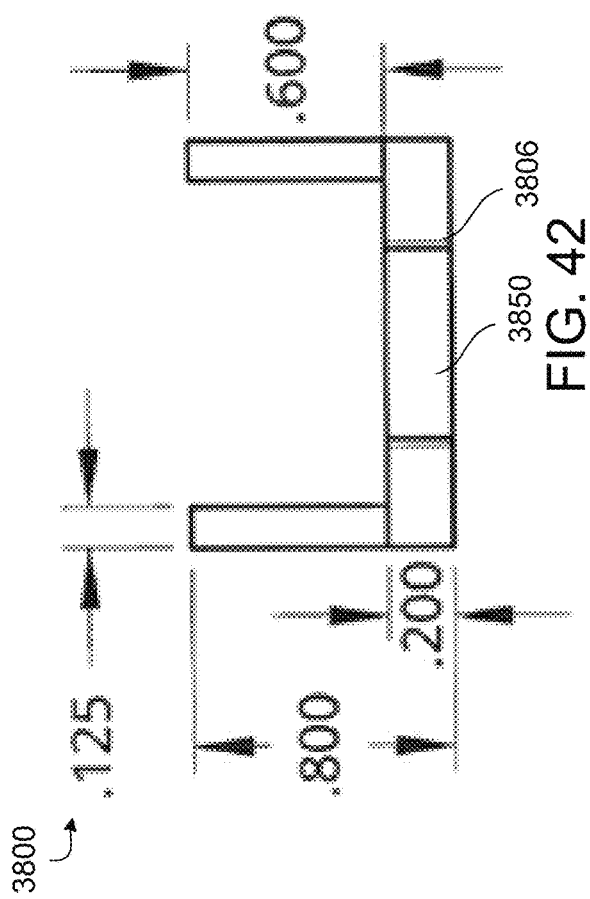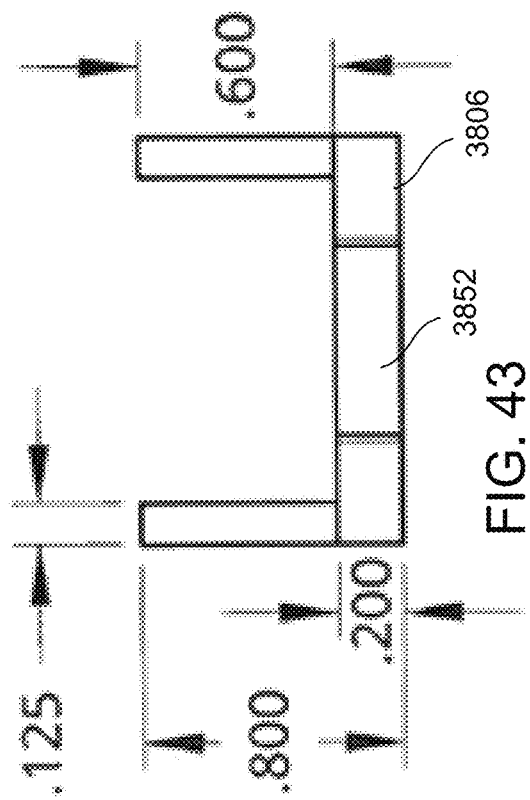

CAPACITOR MOUNT

CLAIM OF PRIORITY

This application claims priority under 35 USC § 119 (e) to U.S. Provisional Application Ser. No. 63/584,739, filed on Sep. 22, 2023, the entirety of which is incorporated by reference herein.

TECHNICAL FIELD

The disclosure herein relates to securing a capacitor, e.g., a capacitor with multiple capacitor values selectively connectable to match the capacitance or capacitances of one or more capacitors being replaced.

BACKGROUND

Single phase induction motors of the type commonly used with air conditioner and cooling equipment compressors generally require some type of auxiliary start capacitor for starting the motor. A start capacitor, also sometimes referred to as a "hard start capacitor," is connected for a short period of time to start the motor, and the start capacitor is disconnected from the motor near or at the time the motor achieves its run speed. This time is generally on the order of 50-100 milliseconds. The start capacitor can be wired in series with contacts for disconnecting it. The contacts can be a part of a relay (e.g., a potential relay, a control relay, an electronic relay, etc.).

If the start capacitor or the relay controlling it fails, replacing the start capacitor and control relay is needed, and this generally is accomplished at the site of the motor. For air conditioners and other cooling equipment, this site could be a home, an office, a warehouse or factory, store, or any other building. This complicates the task of replacing the start capacitor and its connecting relay, in that a wide variety of brands and sizes of air conditioning and cooling units are in use, and these units use start capacitors having a variety of capacitances. Therefore, unless a repairman has a replacement hard start kit available with the correctly sized start capacitor, the repairman cannot complete repair without returning to a shop or parts distributor that has an inventory of hard start capacitor replacement parts.

Having to return to a shop or parts distributor in order to obtain the necessary materials to complete a repair is inefficient and time consuming and also delays the time that the customer's cooling system can be returned to operation.

Therefore, it would be advantageous if a repairman could carry one hard start replacement unit that is adaptable to many air conditioning units, cooling units, or other equipment utilizing single phase motors requiring a start capacitor, so that the repairman could adapt the hard start replacement unit to the requirements at hand and complete the repair in a timely manner.

SUMMARY

When a capacitor unit (e.g., a start capacitor, run capacitor, etc.) is installed within an air-conditioning system, the capacitor can be mounted to secure the capacitor in a single location, provide access to the capacitor (by a user), etc. The presented techniques, systems, etc. allow the capacitor unit to be mounted within the air conditioning (AC) system or nearby. For example, mounting the capacitor unit can be helpful to stabilize the capacitor from, e.g., vibrations, movements, etc. of the air-conditioning system under operation. Mounting the capacitor unit can help with accessing the capacitor, replacing the capacitor, allowing quick inspection of the mounted capacitor unit, etc. In some implementations, the capacitor unit is mounted external to a housing of the air-conditioning system, e.g., due to available space within volume of the housing. Often, installing a capacitor unit also involves connecting and/or laying out a number of wires, which can get messy without wire management. For example, during an installation, wires can easily become tangled, making them difficult to work with. When wires are tangled, future installations and replacements can become difficult. Wire management (e.g., by the present methods and systems) can support and contain cables during installation, and make subsequent maintenance or changes to the cable system easier. The presently disclosed capacitor mount can both mount the capacitor, e.g., to stabilize the capacitor, and hold the wires connected to the capacitor to provide wire management.

In an aspect, a system includes an apparatus suitable for use in an air-conditioning system and configured to provide a plurality of selectable capacitance values. The apparatus includes at least three capacitive devices, each of the at least three capacitive devices providing a capacitor having a capacitance value, each of the at least three capacitive devices having a capacitor terminal. The apparatus includes a case configured to receive the at least three capacitive devices, the case having an open end. The apparatus includes a cover positioned at the open end of the case, the cover including at least three capacitor cover terminals, each of the at least three capacitor cover terminals corresponding to one of the at least three capacitors, and each of the at least three capacitor cover terminals having three contacts extending from the cover. The cover also includes at least three insulation structures, each of the at least three insulation structures configured to provide insulation for a respective one of the at least three capacitor cover terminals. The cover also includes a common cover terminal having four contacts extending from the cover, wherein the common cover terminal is electrically connected to the at least three capacitive devices. The apparatus also includes at least three conductors, each of the at least three conductors configured to electrically connect the capacitor terminal of one of the at least three capacitive devices to the corresponding capacitor cover terminal. The apparatus also includes a bottom cup having a post, the bottom cup positioned within the case between at least one of the at least three capacitive devices and a bottom wall of the case. The system includes a mount including a rectangular shaped back surface configured to interface to a surface of a separate object. The mount also includes a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter. The mount also includes a channel configured to receive a strap and that extends through the mount, the channel having a closed channel portion, a first open channel portion, and a second open channel portion. The strap extends through the channel and secures the apparatus to the mount.

In some embodiments, the system includes a plurality of openings, each opening of the plurality of openings configured to receive a cable tie and each opening of the plurality of openings extending through the mount.

In some embodiments, each opening of the plurality of openings is connected through a series of channels.

In some embodiments, each opening has dimensions of about 0.1 inches by about 0.25 inches.

In some embodiments, the first arch having the first radius is located at a center of the first arch-shaped cutout, and the second arch having the second radius is located at a first end and a second end of the first arch-shaped cutout.

In some embodiments, a plurality of holes configured to receive fasteners and that extend through the mount to the rectangular shaped back surface.

In some embodiments, the rectangular shaped back surface has a height in a range of one inch to five inches and a width in a range of one inch to ten inches.

In some embodiments, the channel configured to receive the strap has dimensions of about 0.25 inches by about 0.5 inches.

In some embodiments, the first radius is about 2.16 inches.

In some embodiments, the second radius is about 2.5 inches.

In some embodiments, the mount is formed of at least one of the following materials: polymer, ceramic, and metal.

In another aspect, a system includes a first apparatus suitable for use in an air-conditioning system and configured to provide a first plurality of selectable capacitance values. The first apparatus includes at least three capacitive devices, each of the at least three capacitive devices providing a first capacitor having a capacitance value, each of the at least three capacitive devices having a capacitor terminal. The first apparatus also includes a case configured to receive the at least three capacitive devices, the case having an open end. The first apparatus also includes a cover positioned at the open end of the case. The cover includes at least three capacitor cover terminals, each of the at least three capacitor cover terminals corresponding to one of the at least three capacitors, and each of the at least three capacitor cover terminals having three contacts extending from the cover. The cover also includes at least three insulation structures, each of the at least three insulation structures configured to provide insulation for a respective one of the at least three capacitor cover terminals. The cover also includes a common cover terminal having four contacts extending from the cover, wherein the common cover terminal is electrically connected to the at least three capacitive devices. The first apparatus further includes at least three conductors, each of the at least three conductors configured to electrically connect the capacitor terminal of one of the at least three capacitive devices to the corresponding capacitor cover terminal. The system also includes a second apparatus suitable for use in the air-conditioning system and configured to provide a second plurality of selectable capacitance values. The second apparatus includes a container capable of receiving a plurality of capacitive devices, each of the capacitive devices having a first capacitor terminal and a second capacitor terminal. The second apparatus also includes a cover mountable to the container. The cover includes a common cover terminal having at least one contact extending from the cover. The cover also includes a plurality of capacitor cover terminals, each of the plurality of capacitor cover terminals having at least one contact extending from the cover. The cover also includes a plurality of insulation structures, each insulation structure associated with one of the plurality of capacitor cover terminals. The second apparatus also includes a plurality of first conductors, each first conductor electrically connectable to one of the first capacitor terminals of the plurality of capacitive devices and one of the plurality of capacitor cover terminals. The second apparatus further includes a second conductor electrically connectable to each of the second capacitor terminals of the plurality of capacitive devices and the common cover terminal. The second apparatus also includes a relay having contacts and being capable of opening said contacts in response to a condition. The system also includes a first mount including a rectangular shaped back surface configured to interface to a surface of a separate object. The first mount includes a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter. The first mount also includes a connector extending from the rectangular shaped back surface, the connector being configured to interface to another connector of a second mount. The first mount further includes a channel configured to receive a strap and that extends through the first mount, the channel having a closed channel portion, a first open channel portion, and a second open channel portion. The system also includes a second mount including a rectangular shaped back surface configured to interface to a surface of a separate object. The second mount includes a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter. The second mount further includes a connector extending from the rectangular shaped back surface, the connector being configured to interface to the first connector of the first mount. The second mount also includes a channel configured to receive a strap and that extends through the second mount, the channel having a closed channel portion, a first open channel portion, and a second open channel portion. A first strap extends through the channel of the first mount and around the first apparatus and secures the first apparatus to the first mount, wherein a second strap extends through the channel of the second mount and around the second apparatus and secures the second apparatus to the second mount, and wherein the first mount is connected to the second mount via the interface between the connector of the first mount and the connector of the second mount.

In some embodiments, at least one of the first mount and the second mount further comprises a plurality of openings, each opening of the plurality of openings configured to receive a cable tie and each opening of the plurality of openings extending through the at least one of the first mount and the second mount.

In some embodiments, each opening of the plurality of openings is connected through a series of channels.

In some embodiments, each opening has dimensions of about 0.1 inches by about 0.25 inches.

In some embodiments, the first mount is substantially identical to the second mount.

In some embodiments, at least one of the first mount and the second mount comprises a plurality of holes configured to receive fasteners and that extend through the at least first mount and the second mount.

In some embodiments, the rectangular shaped back surface of at least one of the first mount and the second mount has a height in a range of one inch to five inches and a width in a range of one inch to ten inches.

In some embodiments, at least one of the first channel and the channel has dimensions of about 0.25 inches by about 0.5 inches.

In some embodiments, the first radius of the first mount and the first radius of the second mount are each about 2.16 inches.

In some embodiments, the second radius of the first mount and the second radius of the second mount are each about 2.5 inches.

In another aspect, a system includes a first mount including a rectangular shaped back surface configured to interface to a surface of a separate object. The first mount also includes a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter. The first mount also includes a connector extending from the rectangular shaped back surface, the connector configured to interface to another connector of a second mount. The first mount further includes a channel configured to receive a strap and that extends through the first mount, the channel having a closed channel portion, a first open channel portion, and a second open channel portion. The system also includes a second mount including a rectangular shaped back surface configured to interface to a surface of a separate object. The second mount also includes a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter. The second mount further includes a connector extending from the rectangular shaped back surface, the connector being configured to interface to the first connector of the first mount. The second mount also includes a channel configured to receive a strap and that extends through the second mount, the channel having a closed channel portion, a first open channel portion, and a second open channel portion. The first mount is connected to the second mount via the interface between the first connector of the first mount and the second connector of the second mount.

In some embodiments, at least one of the first mount and the second mount further comprises a plurality of openings, each opening of the plurality of openings configured to receive a cable tie and each opening of the plurality of openings extending through the at least one of the first mount and the second mount.

In some embodiments, each opening of the plurality of openings is connected through a series of channels.

In some embodiments, each opening has dimensions of about 0.1 inches by about 0.25 inches.

In some embodiments, the first mount is substantially identical to the second mount.

In some embodiments, at least one of the first mount and the second mount comprises a plurality of holes configured to receive fasteners and that extend through the at least first mount and the second mount.

In some embodiments, the rectangular shaped back surface of at least one of the first mount and the second mount has a height in a range of one inch to five inches and a width in a range of one inch to ten inches.

In some embodiments, at least one of the first channel and the channel has dimensions of about 0.25 inches by about 0.5 inches.

In some embodiments, the first radius of the first mount and the first radius of the second mount are each about 2.16 inches, and wherein the second radius of the first mount and the second radius of the second mount are each about 2.5 inches.

BRIEF DESCRIPTION OF DRAWINGS

FIG. 32 is a front side view of another mount for multiple types of capacitors.

FIG. 33 is a back side view of the mount of FIG. 32.

FIG. 34 is a top view of the mount of FIG. 32.

FIG. 35 is a bottom view of the mount of FIG. 32.

FIG. 42 is a right side view of the mount of FIG. 38.

FIG. 43 is a left side view of the mount of FIG. 38.

The same reference numerals refer to the same elements throughout the various Figures.

DETAILED DESCRIPTION

When a capacitor unit (e.g., a start capacitor, run capacitor, etc.) is installed within an air-conditioning system, it can often be helpful to mount the capacitor. For example, the capacitor can be mounted within the AC system or nearby. Mounting the capacitor unit can be helpful to stabilize the capacitor from, e.g., vibrations or movements of the air-conditioning system under operation. In some examples, mounting the capacitor with the present devices can help with accessing the capacitor, replacing the capacitor, allowing for quick inspection of the mounted capacitor, etc. In some implementations, the capacitor unit is mounted external to a housing of the air-conditioning system, e.g., due to available space within volume of the housing. Often, installing a capacitor unit also involves connecting a number of wires, which can get messy without wire management. For example, during an installation, wires can easily become tangled, making them difficult to work with. When wires are tangled, future installations and replacements can become difficult. Wire management can support and contain cables during installation, and make subsequent maintenance or changes to the cable system easier. The presently disclosed capacitor mount can both mount the capacitor, e.g., to stabilize the capacitor, and hold the wires connected to the capacitor to provide wire management.

Figure 1:
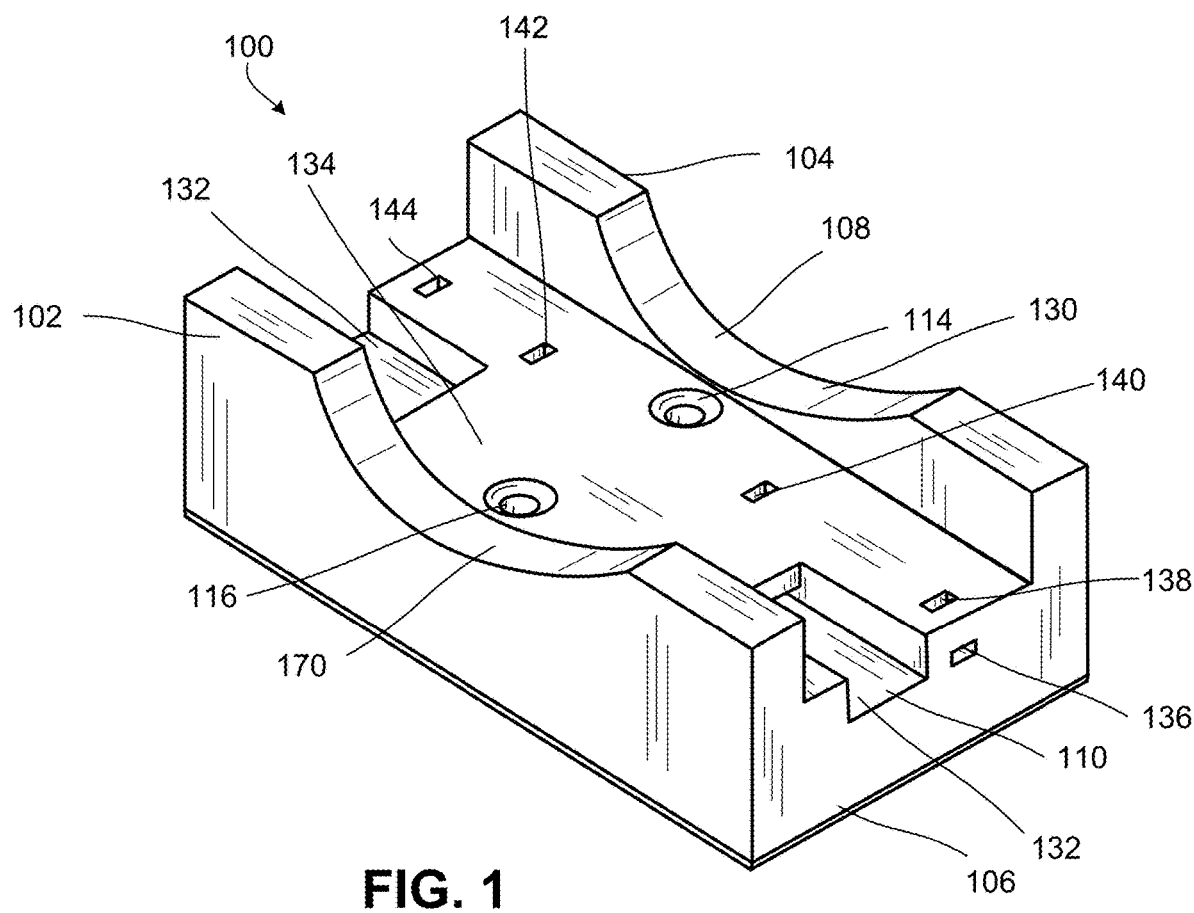
FIG. 1 is a perspective view of a mount for multiple types of capacitors.

FIG. 1 illustrates a mount 100 for a capacitor (e.g., a run capacitor, a start capacitor, etc.). For example, the mount 100 can be used during installation of the capacitor to stabilize the capacitor and to provide wire management, as described above. The mount 100 is generally a rectangular prism or cuboid, but in some implementations one or more other shapes, e.g., a pyramid, a cylinder, etc. can be employed. In general, the mount 100 has a front side for receiving a capacitor and at least one other surface for mounting (e.g., a surface opposite the capacitor holding surface such as a back surface). The mount 100 can have a variety of dimensions, e.g., to be sized for receiving a capacitor. For example, the mount 100 can have a height in a range of one inch to ten inches, a width in a range of one inch to ten inches, and a depth in a range of one inch to ten inches. The height, width, and depth can be different from one another; for example, each dimensional length can be different. In some implementations, the height, width, and depth are the same to give the mount 100 a cuboid shape.

The mount 100 can be formed of a variety of materials. For example, the mount 100 can be formed of a rigid material, e.g., a polymer, ceramic, metal, etc. In some implementations, the mount 100 can be formed of a composite of materials, e.g., including polymers, ceramics, metals, etc. In some implementations, the mount 100 can be formed of a combination of materials, e.g., including polymers, ceramics, metals, etc.

The mount 100 can be created through a variety of manufacturing methods. In some implementations, the mount 100 can be created via 3-D printing (e.g., stereolithography). In some implementations, the mount 100 can be created via pre-fabrication. The mount 100 includes two sides 102, 104 which extend from a back side 106.

Each of the two sides 102, 104 has a multi-radius cut 108, 170, respectively. For example, the multi-radius cuts 108, 170 can each be a cutout having a shape (e.g., an arch) that reflects a portion of a circle (e.g., a 90 degree portion of a circle, a 120 degree portion of a circle, a 180 degree portion of a circle, etc.) in the center of the respective side 102, 104. In some implementations, the multi-radius cuts 108, 170 can be off-set from the centers of each respective side 102, 104. Each of the multi-radius cuts 108, 170 has multiple radii to allow the mount 100 to hold a variety of capacitors securely. For example, the multi-radius cuts can each have two radii that reflect the diameter of start and run capacitors, so that start and run capacitors are received by the mount and fit securely and snug within the portion of the multi-radius cuts. The multi-radius cuts can each include radii that matches, nearly matches, etc. diameters of start and run capacitors. For example, in some implementations, the multi-radius cut 108 has two diameters of about 2.5 inches and about 2.16 inches. This can accommodate the cylindrical shaped housing of capacitors (e.g., start capacitors, run capacitors, etc.) such as the AmRad Manufacturing Turbo 200, Turbo200

XL, EasyStart, TES5EXT, etc. that have a diameters in a range of about 1.75 inches to about 2.6 inches. The mount 100 can accommodate a number of the capacitors produced by AmRad Manufacturing. While each multi-radius cut 108, 170 is described as having two radii, in some implementations the multi-radius cuts 108, 170 can each include more or fewer radii (e.g., one radius, three radii, four radii, etc.). Also, while the multi-radius cut 170 in the first side 102 matches the multi-radius cut 108 in the second side 104 in the illustrated example, in other implementations the multi-radius cut 170 in the first side 102 does not match the multi-radius cut 108 in the second side 104. For example, the multi-radius cut 170 in the first side 102 can have slightly different dimensions than the multi-radius cut 108 in the second side. In some implementations, the multi-radius cut 170 in the first side or the multi-radius cut 108 in the second side can include features to tip the capacitor (e.g., tip the capacitor outward at the top to allow better access to the top of the capacitor). In some implementations, the mount includes bevels to tip the capacitor. In some implementations, the multi-radius cut 108 and/or the multi-radius cut 170 can be coated with a rubber material (e.g., butadiene, butyl, silicone, latex, etc.) to increase the friction at the intersection of the surface 130 of the cutouts of the mount and the surface of the exterior side of the cylindrically shaped capacitor. For example, the rubber coating can prevent a capacitor from sliding out of the multi-radius cut 108 and/or the multi-radius cut 170.

The mount 100 can use straps as a securing mechanism to secure the capacitor to the mount 100. For example, the mount 100 also includes a slot 110 for a strap (not shown) to wrap around the capacitor. The slot can include a channel that has dimensions of about a quarter of an inch in depth and about a half an inch in height. The slot 110 can extend through the interior of the mount 100. In the illustrated example, the slot has open channel portions 132 and a closed channel portion 134. Some designs could have multiple slots to hold multiple straps. For example, some designs can include two, three, or more slots. This can be advantageous because more securing mechanisms make the capacitor more secure within the mount 100. While one strap can be inserted into the one of the open channels, extend through the closed channel, and emerge out of the other open channel, multiple straps could also be used. For example, the strap can include, e.g., a hook-and-loop strap, a strap with buckles, a cinch strap, etc. When implemented, the strap (or multiple straps) can secure the capacitor within the multi-radius cut 108.

The mount 100 can also have a number of openings for different types of securing mechanisms. For example, the mount 100 also includes openings 136, 138, 140, 142, 144 for additional straps or cables (not shown), if desired. The openings 136, 138, 140, 142, 144 can be connected by closed channels that extend through the interior of the mount 100. The openings 136, 138, 140, 142, 144 can have different sizes, shapes, etc. In the illustrated embodiment, the dimensions of the openings 136, 138, 140, 142, 144 are smaller than corresponding dimensions of the slot. For example, the openings can have dimensions of about a tenth of an inch in width and about a quarter of an inch in height. The dimensions can be smaller than the dimensions of the slot to allow for the use of multiple smaller straps (e.g., tie wraps cable ties, strings, etc.). The smaller straps can be used to secure the capacitor within the multi-radius cuts 108, 170. In some implementations, the capacitor includes a number of wires, e.g., to conduct electricity between the AC unit and the capacitor. The smaller straps can also be used to secure wires to the mount, e.g., for wire management. Straps can be used in the openings 136, 138, 140, 142, 144 in addition or alternatively to a strap used in the slot 110.

The mount 100 can be mounted to a surface in a variety of ways. For example, the mount 100 includes holes 114, 116 for attaching the mount to a surface, e.g., an exterior of an air-conditioning system. The holes 114, 116 can allow for a variety of fasteners (not shown) to attach the mount to a surface. In some implementations, the fasteners can include, e.g., wood screws, machine screws, nails, etc. In some implementations, one or more of the holes 114, 116 can intersect with the slot 110 (e.g., with the closed portion 134 of the slot 110) so that the fasteners attach the mount through a strap held in the slot 110. For example, in the illustrated embodiment, the hole 116 intersects with the slot 110. This can be helpful to maintain the position of the strap within the slot 110. In some implementations, the holes 114, 116 are positioned so that they do not intersect with the slot 110. In other implementations, the mount 100 can include more or fewer holes (no holes, one holes, three holes, etc.). In some implementations, the mount 100 can be attached to a surface using a strap, cable tie, cable, etc. inserted through the slot 110, the openings 136, 138, 140, 142, 144, etc. For example, a strap can be inserted through the slot 110 and wrapped around a post, pole, etc. to attach the mount 100 to the post, pole, etc.

Figure 2:
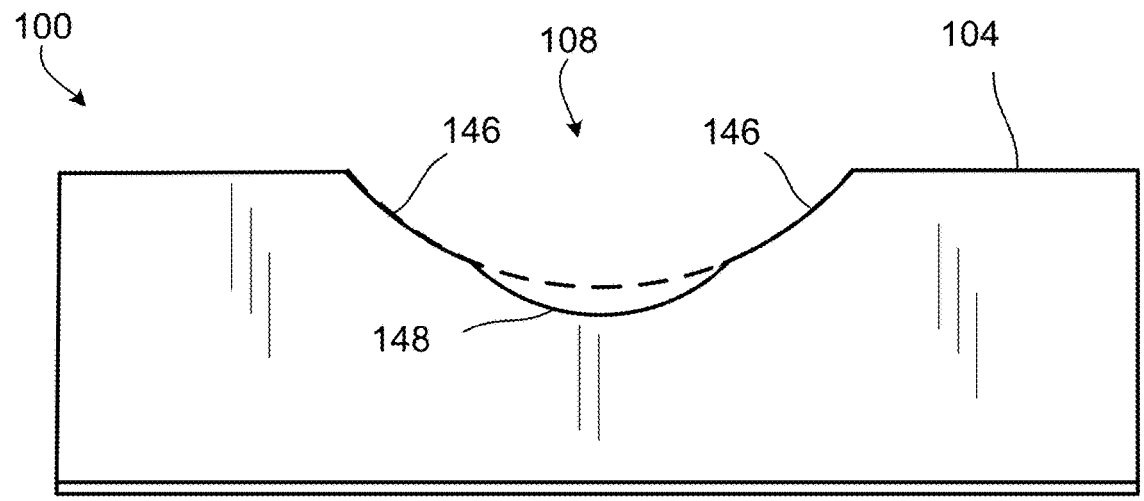
FIG. 2 is a top view of the mount of FIG. 1.
Figure 3:
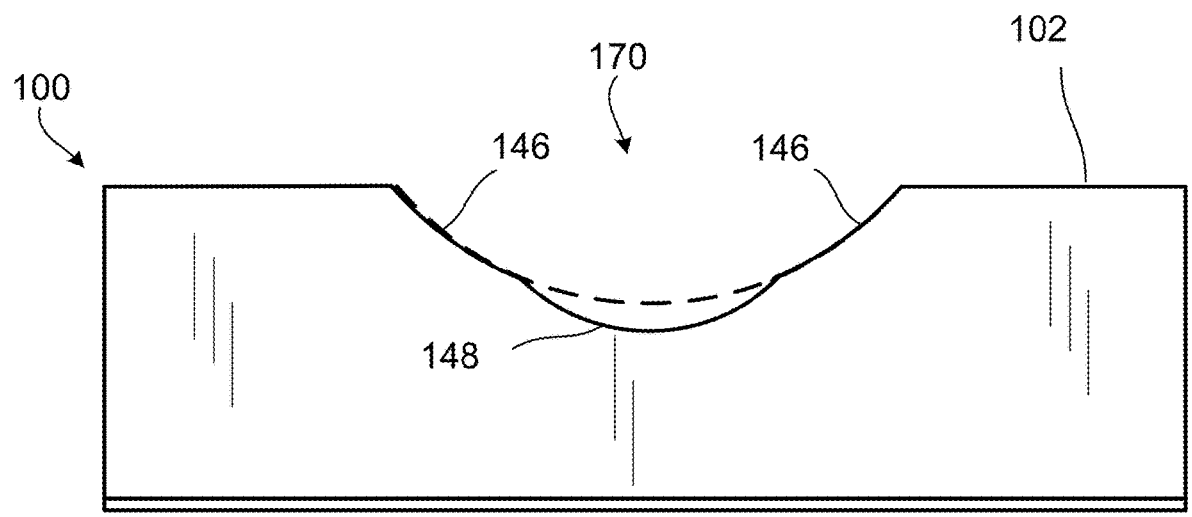
FIG. 3 is a bottom view of the mount of FIG. 1.

FIGS. 2 and 3 illustrate a top view of the mount 100 of FIG. 1 and a bottom view of the mount 100 of FIG. 1, respectively. FIGS. 2 and 3 illustrate the multi-radius cuts 108, 170 in greater detail. As illustrated, the multi-radius cutout 108 in the top side 104 is the same as the multi-radius cutout 170 in the bottom side 102 of the mount 100. However, in some implementations, the multi-radius cut 108 in the top side 104 can be different than the multi-radius cut 170 in the bottom side 104, as discussed above. The multi-radius cut 108 has a first radius 146 and a second radius 148, and the multi-radius cut 170 has a first radius 146 and a second radius 148. In some implementations, the multi-radius cuts can have more or fewer radii (e.g., one radius, three radii, four radii, etc.). The multi-radius cuts can include larger or smaller radii within the cuts. In the illustrated implementation, the second radius 148 is smaller than the first radius 146; alternatively, the second radius 148 can be larger than the first radius 146. The second radius 148 is also centered in the multi-radius cut 108 and the cut has a first radius 146 on either end of the second radius 148. However, in some implementations, the second radius 148 may not be centered in the multi-radius cut 108. For example, a left half of the cut 108 can have the first radius 146 and a second half of the cut 108 can have the second radius 148. In some implementations, the radius can be changing throughout the cut. For example, the radius can be variable throughout the cut. For example, the multi-radius cut can include any shape and any number of radii to provide a desired shape that accommodates housings of capacitors.

The first and second radius 146, 148 can have diameters of about 2.5 inches and about 2.16 inches, respectfully. This can accommodate round capacitors with diameters of about 2 inches to about 2.6 inches. For example, the first radius 146 can receive capacitors having diameters of about 2.5 inches, and the second radius 148 can receive capacitors having diameters of about 2.16 inches. This can allow capacitors with diameters of about 2 inches to about 2.6 inches to be fit snugly into the multi-radius cut. Having the same multi-radius cut 108 in the top side 104 and the bottom side 102 allows the capacitor to be seated equally in each cut 108. In some implementations, the multi-radius cut in the top side 104 can be different than the multi-radius cut in the bottom side 102, as discussed above.

Figure 4:
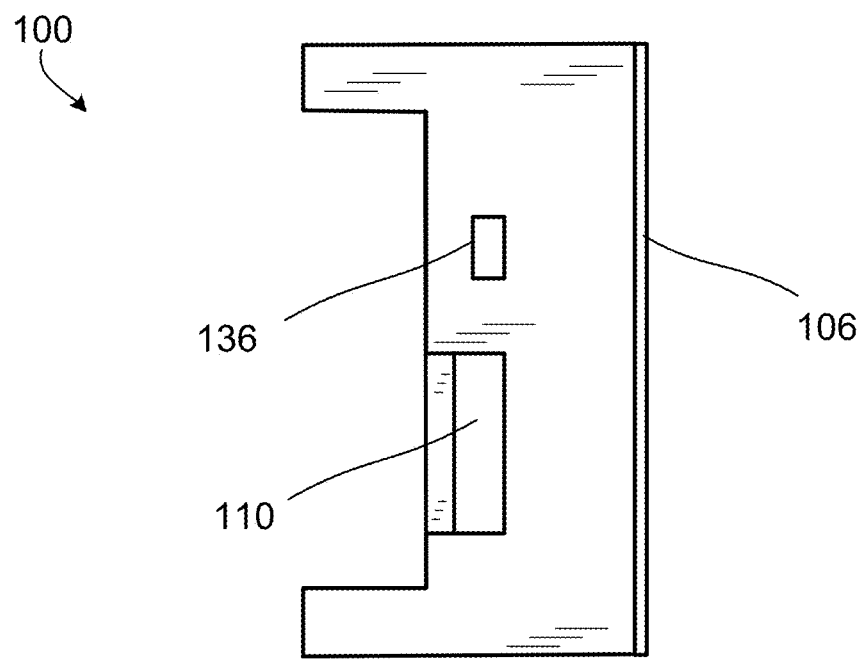
FIG. 4 is a right side view of the mount of FIG. 1.
Figure 5:
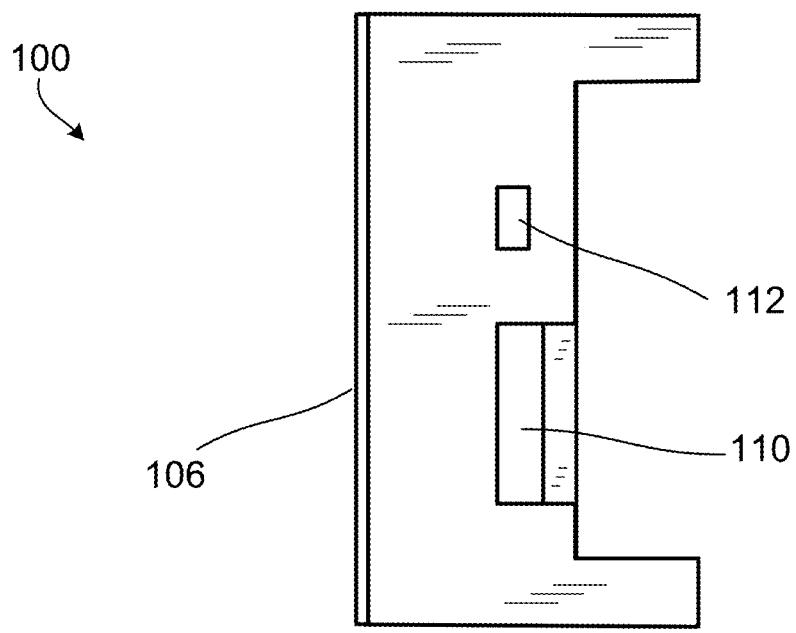
FIG. 5 is a left side view of the mount of FIG. 1.

FIGS. 4 and 5 illustrate a right view and a left view, respectively, of the mount 100 of FIG. 1. The back side 106 can have a rubber coating (e.g., butadiene, butyl, silicone, latex, etc.) to increase the friction between the mount 100 and a surface to which the mount 100 is mounted. In some implementations, the rubber coating on the back side 106 can be the same as the rubber coating on the multi-radius cut. In some implementations, the rubber coating on the back side 106 can be different than the rubber coating on the multi-radius cuts. In some implementations, the back side 106 may not have rubber coating.

Also illustrated in FIGS. 4 and 5 are the slot 110 and openings 112, 136, e.g., for straps and cables. As illustrated, the slot 110 extends completely through the mount 100. For example, the slot 110 extends from an open portion, to a closed portion, to an open portion on the other side. The openings 112, 136 also extend through the mount 100. For example, the openings 112, 136 are closed channels that extend through the interior of the mount 100. The openings 112, 136 are connected, such that a strap, cable tie, cable, etc. can be fed through into and out of the openings as desired. This can be helpful, e.g., to accommodate for different wirings and capacitors. In some implementations, a user may desire more or fewer cables in certain positions on the mount 100. Providing multiple connected openings allows the user to select which openings are used for cables. In the illustrated implementation, the slot 110 is separate from the smaller openings, however, in some implementations, the slot 110 can also be connected to the openings.

Figure 6:
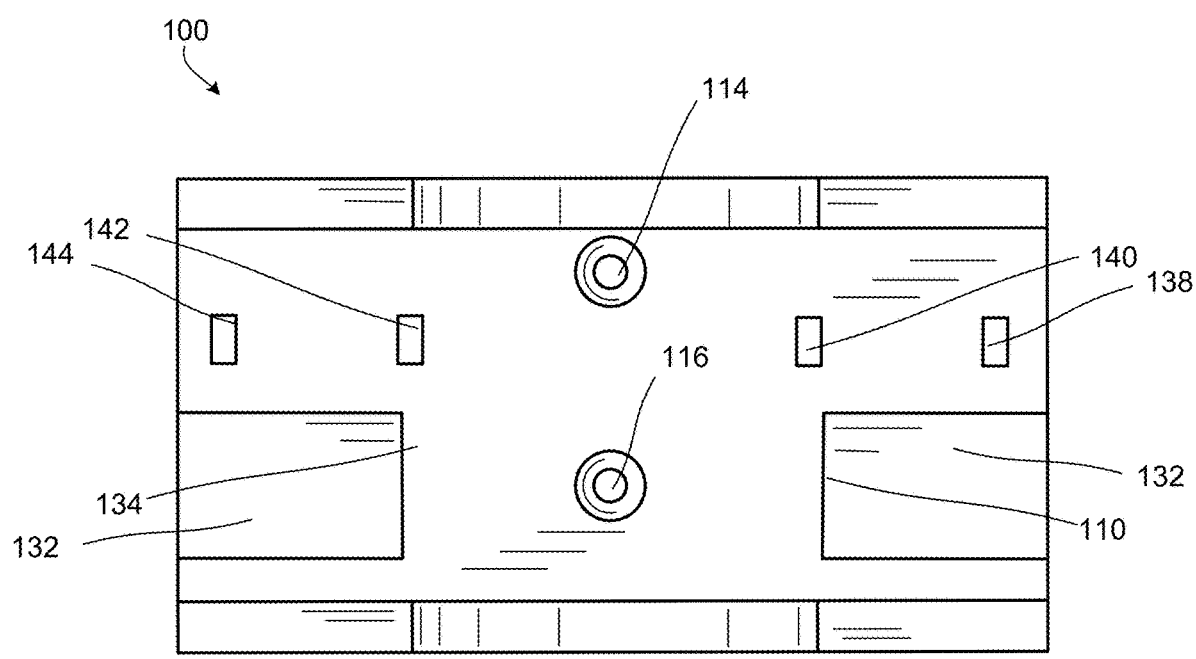
FIG. 6 is a front side view of the mount of FIG. 1.

FIG. 6 illustrates a front view of the mount 100. The slot 110, openings 138, 140, 142, 144, and holes 114, 16 are positioned on the front face of the mount 100. As illustrated, the hole 116 intersects the slot 110, such that a fastener positioned in the hole 116 extends through the hole 116 and through a strap held in the slot 110 to attach the mount 100 to a surface. This can be helpful to maintain the position of the strap within the slot 110. In some implementations, the holes 114, 116 are positioned so that they do not intersect with the slot 110. For example, the slot 110 can be positioned differently or the holes 114, 116 can be positioned differently. In some implementations, the holes 114, 116 can be beveled to accommodate certain types of fasteners. For example, fasteners (e.g., screws, nails, etc.) can often include a head at an end of the fastener. Beveling the holes can create additional space for the head of the fastener so that the fastener is flush with the front surface of the mount 100. In some implementations, the holes 114, 116 can be different sizes, e.g., to accommodate different types of fasteners (e.g., sheet metal screws, wood screws, nails, etc.). In some implementations, the holes 114, 116 can have different depths. For example, in some implementations, the hole 114 extends through the back of the mount to attach the mount to a surface (e.g., a wall of an air conditioner) and the hole 116 does not extend through the back of the mount. In some implementations, the hole 116 does not extend through the back of the mount and only extends into the slot 110, e.g., to hold a strap held in the slot 110. In some implementations, the mount 100 may not include the slot 110. For example, the mount 100 can be configured to hold a capacitor with only straps through the openings 138, 140, 142, 144. In some implementations, the mount 100 may not include the holes 114, 116. In some implementations, the mount 100 may not include the openings 138, 140, 142, 144. For example, the mount 100 may be configured to hold a capacitor with only a strap through the slot 110. The openings 138, 140, 142, 144 can be connected such that a strap can enter through any opening 138, 140, 142, 144 and exit through any opening 138, 140, 142, 144. In some implementations, the openings 138, 140, 142, 144 can also be connected to the slot 110. In other implementations, the openings are not connected to the slot 110.

Figure 7:
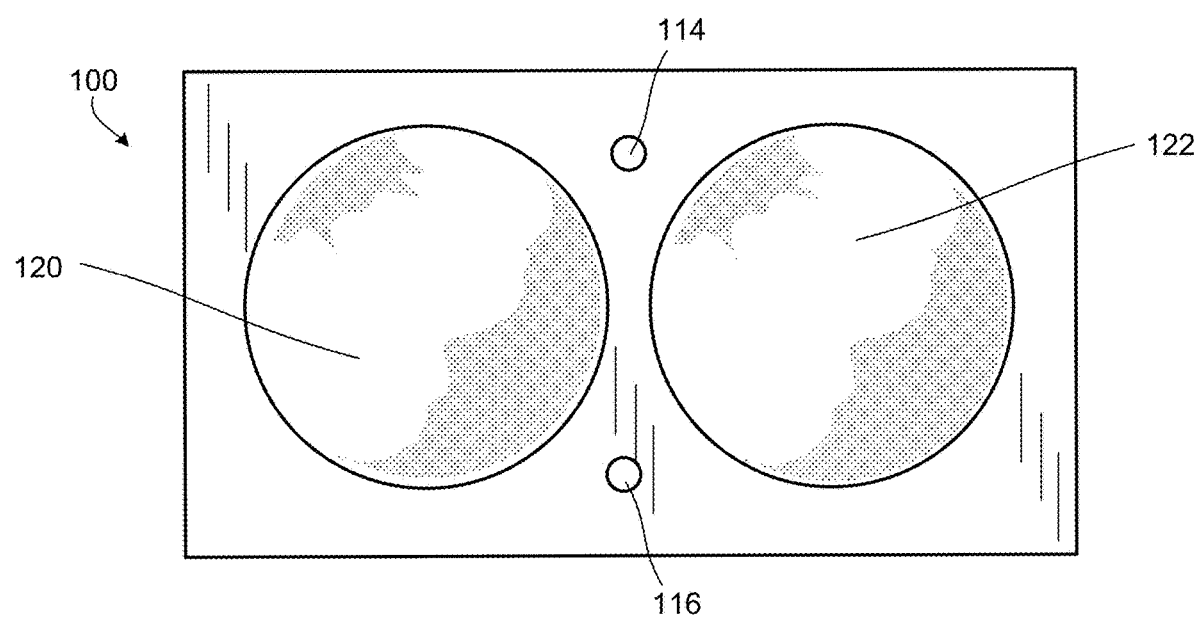
FIG. 7 is a back view of the mount of FIG. 1.

FIG. 7 illustrates a back view of the mount 100. The mount 100 includes two cylindrically shaped magnetic elements 120, 122 that can be embedded into the mount 100. For example, the magnetic elements 120, 122 can be flush with the back surface of the mount 100 so that the back surface 100 is flat. The magnetic elements 120 can assist in mounting of the mount 100 (e.g., to an air conditioning system) such that the surface of the mount 100 magnetically engages the surface of the air conditioning system. The magnetic elements 120, 122 are configured to create magnetic attraction between the magnetic elements 120, 122 and a magnetic surface in proximity to the mount 100. For example, the magnetic elements 120, 122 may cause the back surface of the mount 100 to be attracted to a metallic surface of an air conditioning system, thereby improving the integrity of a mounting between the mount 100 and the air conditioning system after installation. The magnetic elements 120, 122 may be designed such that the strength of magnetic attraction between the magnetic elements 120, 122 and the air conditioning system is such that the magnetic elements 120, 122 may remain firmly in place in response to possible vibration and/or other movement of the air conditioning system during operational use. In some implementations, the strength of magnetic attraction between the magnetic elements 120, 122 and the air condition system is such that a user (e.g., a technician installing or uninstalling the mount 100) can remove the mount from the surface of the air conditioning system without requiring excessive effort.

In some implementations, the back of the mount 100 can include other attachment mechanisms alternatively to the magnetic elements, in addition to the magnetic elements, etc. For example, in some implementations, the back surface of the mount 100 can be coated with a rubber material (e.g., butadiene, butyl, silicone, latex, etc.) to increase the friction between the mount 100 and the mounting surface. For example, the rubber coating can prevent the mount 100 from sliding relative to the surface, e.g., when the mount is magnetically attached. In some implementations, the back surface of the mount 100 can be coated with an adhesive (e.g., double sided tape, glue, glue dots, etc.) to attach the mount 100 to a surface. In some implementations, fasteners can be inserted through one or more of the holes 114, 116 to attach the mount 100 to a surface and to prevent the mount 100 from sliding relative to the surface.

While the magnetic elements 120, 122 are illustrated as being positioned flush with the back surface of the mount 100, in some implementations, the magnetic elements 120, 122 may be positioned outside of the mount 100 on an exterior of the back surface of the mount 100. For example, the magnetic elements 120, 122 may have a disk shape that are positioned outside of the back surface of the mount 100.

In some examples, the magnetic elements 120, 122 each may have a rectangular shape. For example, the magnetic elements 120, 122 each may be a rectangular strip that runs along the back surface of the mount 100. In particular, the rectangular strip may have a particular thickness, a first dimension that runs from the left side of the mount 100 to the right side of the mount 100, and a second dimension that is perpendicular to the first dimension and smaller than the first dimension. In some implementations, the magnetic elements 120, 122 each may have a square shape (e.g., such that the first dimension is equal to or substantially equal to the second dimension). In some implementations, the magnetic elements 120, 122 each may have a rod shape. In some implementations, the magnetic elements 120, 122 each may have a circular shape (e.g., a disk shape) or a hollow circular shape (e.g., a ring shape). For example, in some implementations, the magnetic elements 120, 122 each may have dimensions equal to or substantially equal to the dimensions of a disk-shaped battery (e.g., a watch battery such as a CR2032 battery). In some implementations, the magnetic elements 120, 122 each are disk-shapes with a thickness of approximately 4 mm and a diameter of approximately 160 mm. In some implementations, the magnetic elements 120, 122 each have a disk-shape with a thickness of approximately 4 mm and a diameter of approximately 40 mm. In some implementations, the magnetic elements 120, 122 each have a disk-shape with a thickness of approximately 4.5-5 mm and a diameter of about 60 mm. In some implementations, the magnetic elements 120, 122 each have a disk-shape with a thickness of approximately 5 mm and a diameter of about 60 mm.

The particular shape and/or dimensions of the magnetic elements 120, 122 may be chosen to achieve the desired strength of magnetic attraction. For example, the magnetic elements 120, 122 may be designed with a particular shape and/or larger dimensions and/or larger thicknesses to achieve a relatively higher strength of magnetic attraction with a magnetic surface. In some implementations, increased surface area of the magnetic elements 120, 122 may increase the strength of magnetic attraction. In some implementations, the particular shape and/or dimensions of the magnetic elements 120, 122 may be chosen to achieve the desired size of the mount 100, or vice versa. For example, the size of the mount 100 can be reduced by reducing the size of the magnetic elements 120, 122. In some implementations, the size of the mount 100 is driven by the size of the magnetic elements 120, 122. For example, the magnetic attraction generated by the magnetic elements 120, 122 should be sufficient to attach the mount and a mounted capacitor to a surface (e.g., a surface of the AC system). The size of the magnetic elements 120, 122 can determine the corresponding size of the mount 100.

In some implementations, the magnetic elements 120, 122 each have a strength of approximately 30-40 milliTeslas (mT) or a strength of approximately 65-75 mT. In some implementations, the strength of magnetic attraction can be increased by stacking multiple magnetic elements 120, 122 (e.g., on top of each other). In some implementations, two stacked magnetic elements 120, 122 can have a strength of approximately 70-80 mT, 60-80 mT, or 130-150 mT, although other ranges are also possible. In some implementations, the magnetic elements 120, 122 may be a D40×4 ferrite ceramic magnet manufactured by Hangzhou Honesun Magnet Co., Ltd. In some implementations, the strength of the magnetic elements 120, 122 can be chosen such that the magnetic elements 120, 122 do not interfere with functions of the capacitor held within the mount 100.

In some implementations, the magnetic elements 120, 122 may be magnetized using one or more of a plurality of techniques. For example, in some implementations, the magnetic elements 120, 122 may be magnetized such that a north and a south pole of each of the magnetic elements 120, 122 is located at a particular position of the magnetic element 120, 122. For example, the techniques for magnetizing the magnetic elements 120, 122 may cause the north and/or south pole to be located at various thicknesses of the magnetic elements 120, 122, various axial positions of the magnetic elements 120, 122, various diametric positions of the magnetic elements 120, 122, and/or various radial positions of the magnetic elements 120, 122. In some implementations, the magnetic elements 120, 122 may be multipole magnets.

In some implementations, each of the magnetic elements 120, 122 is a permanent magnet that is made from a material that is magnetized and creates its own persistent magnetic field. For example, each of the magnetic elements 120, 122 may be made from a ferromagnetic material that can be magnetized, such as iron, nickel, cobalt, and/or an alloy of rare-earth metals, among others. In some implementations, each of the magnetic elements 120, 122 is a ferrite and/or ceramic magnet. In some implementations, each of the magnetic elements 120, 122 may include one or more of ferric oxide, iron oxide, barium, barium carbonate, strontium, and/or strontium carbonate. Each of the magnetic elements 120, 122 may include one or more magnetically "hard" materials (e.g., materials that tend to stay magnetized). Alternatively or additionally, each of the magnetic elements 120, 122 may include one or more magnetically "soft" materials.

In some implementations, each of the magnetic elements 120, 122 may be a rare-earth magnet. A rare-earth magnet is typically a relatively strong permanent magnet that is made from one or more alloys of rare-earth elements. Example of rare-earth elements that can be used in a rare-earth magnet include elements in the lanthanide series, scandium, and yttrium, although other elements may also or alternatively be used. In some implementations, the rare-earth magnet may produce a magnetic field of greater than 1.0T (teslas). In some implementations, the rare-earth magnet may include one or both of samarium-cobalt and neodymium.

In some implementations, each of the magnetic elements 120, 122 may be made from one or more ceramic compounds (e.g., ferrite) that can be produced by combining iron oxide and one or more metallic elements. In some implementations, such ceramic compounds may be electrically nonconductive. The use of such ceramic compounds for each of the magnetic elements 120, 122 may eliminate the inclusion of electrically conductive elements that may otherwise affect the operation of a capacitor held within the mount 100.

In some implementations, each of the magnetic elements 120, 122 may have a grade that corresponds to a particular standard (e.g., a National and/or International standard). In some implementations, the grade of each of the magnetic elements 120 corresponds to the Chinese ferrite magnet nomenclature system. For example, in some implementations, each of the magnetic elements 120, 122 is grade Y10T, Y25, Y30, Y33, Y35, Y30BH, or Y33BH, although other grades are also possible. In some implementations, the grade corresponds to a working temperature of 250° C. In some implementations, the grade of each of the magnetic elements 120 corresponds to a Feroba, an American (e.g., "C"), or a European (e.g., "HF") grading standard.

In some implementations, each of the magnetic elements 120, 122 may be an electromagnet that produces a magnetic field by introducing an electric current. In some implementations, the electromagnet may include a magnetic core and a wire (e.g., an insulated wire) wound into a coil around the magnetic core. The magnetic core may be made from a ferromagnetic or a ferrimagnetic material such as iron or steel. The magnetic core may be made from a "soft" magnetic material (e.g., a magnetic material that can allow magnetic domains in the material to align upon introduction of the current through the coil).

By using an electromagnet as the magnetic elements 120, 122, the strength of magnetic attraction can be turned on and off and/or customized according to the current passed through the coil. For example, current can be applied through the coil to cause the electromagnet to generate a magnetic field, and the current can be removed from the coil to cause the electromagnetic to cease generating the magnetic field. In some implementations, the strength of the magnetic field (and, e.g., the strength of magnetic attraction created by the electromagnet) can be adjusted based on the magnitude of electrical current passed through the coil. For example, relatively higher magnitudes of electrical current correspond to higher magnetic field strengths and therefore higher strengths of magnetic attraction (e.g., with a magnetic surface), and relatively lower magnitudes of electrical current correspond to lower magnetic field strengths and therefore lower strength of magnetic attraction.

In some implementations, the particular material used for the core of the electromagnet and/or the dimensions of the core may be chosen to achieve the desired strength of magnetic attraction. The core may be made from a material such as one or both of iron and steel. In some implementations, the dimensions of the coil and/or the number of turns of the coil may also be chosen to achieve the desired strength of magnetic attraction.

In some implementations, the current that is provided through the coil may be provided by a connection with the capacitor held within the mount 100. For example, a conductor (e.g., a wire) may be used to connect one or more of the terminals to a first end of the coil and a conductor may be used to connect another one of the terminals to a second end of the coil. In this way, the current that otherwise runs through the electrical components of the capacitor can also be used to power the electromagnetic elements, thereby causing the electromagnet to generate a magnetic field.

In some implementations, the capacitor may include one or more different and/or additional electrical components that can be used by the electromagnet to generate the magnetic field. For example, the capacitor may include a separate capacitor that is configured to store a charge to be used to subsequently apply current through the coil of the electromagnetic. In this way, the electromagnet may have a separate power source that can be used when generation of a magnetic field is desired.

In some implementations, the capacitor may include a switch that can be toggled by a user (e.g., a technician or an operator of the capacitor) to cause the electromagnetic to generate or cease generating the magnetic field. The switch may cause an electrical connection in the coil to be temporarily broken and restored. In some implementations (e.g., implementations in which the coil is connected to one or more of the terminals), the switch may cause the conductor that connects the coil to one or more of the terminals to be temporarily broken and restored, such that the magnetic field generated by the electromagnet can be toggled on and off. In this way, the user can toggle the magnetic field on when mounting of the capacitor is desired (e.g., at the time of installation) and toggle the magnetic field off when mounting of the capacitor is not desired (e.g., when the capacitor is not in use and/or being stored) or when magnetic attraction is not desired (e.g., when mounting the capacitor at a location that does not include a magnetic surface).

In some implementations, one or more of the capacitive elements of the capacitor and/or the capacitor sections of the capacitor may be used to store the charge that is provided to the coil to cause the magnetic field to be generated. In this way, electrical charge that is otherwise stored by the capacitor during typical use can also be used to power the electromagnet.

While the mount 100 shown in the illustrated example includes two magnetic elements 120, 122, additional magnetic elements may also be provided. For example, a plurality of magnetic elements may be positioned on the back surface of the mount 100. The plurality of magnetic elements may have dimensions that are relatively smaller than dimensions that may be chosen for implementations in which only one or two magnetic elements are used. The plurality of magnetic elements may have dimensions substantially similar to dimensions of a watch battery, such as a CR2032 battery. The plurality of magnetic elements may be positioned at various locations on the back surface of the mount 100. For example, the plurality of magnetic elements may be arranged in a ring around a perimeter of the back surface such that the plurality of magnetic elements are spaced approximately equidistant from one another. In some implementations, the plurality of magnetic elements may be arranged in groups of two, three, etc. magnetic elements. Any number of magnetic elements may be provided to achieve the desired strength of magnetic attraction.

In some implementations, the magnetic elements 120, 122 may have the same or different diameters. In some implementations, the magnetic elements 120, 122 may be positioned at a location that is misaligned with a center of the back surface of the mount 100. For example, the center of the magnetic elements 120, 122 may be misaligned with the center of the back surface of the mount 100 such that the magnetic elements 120, 122 are positioned proximate to a side of the mount 100. In some implementations, the center of the magnetic elements 120, 122 may be aligned with the center of the back surface of the mount 100. In some implementations, the centers of the magnetic elements 120, 122 may be misaligned relative to each other. In other words, a center of one of the magnetic elements may be misaligned with a center of the other magnet.

Figure 8:
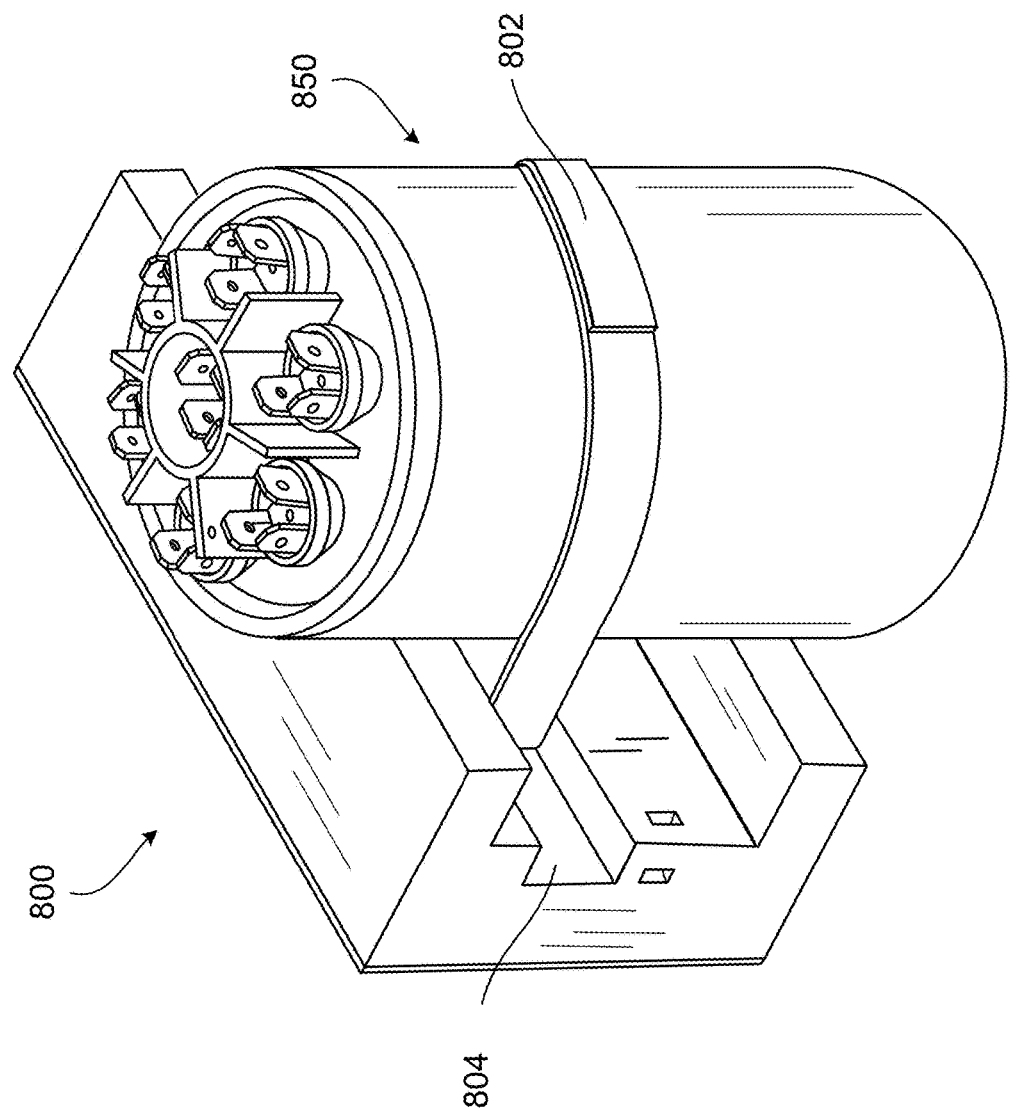
FIG. 8 is a perspective view of the mount of FIG. 1 holding a capacitor.
Figure 9:
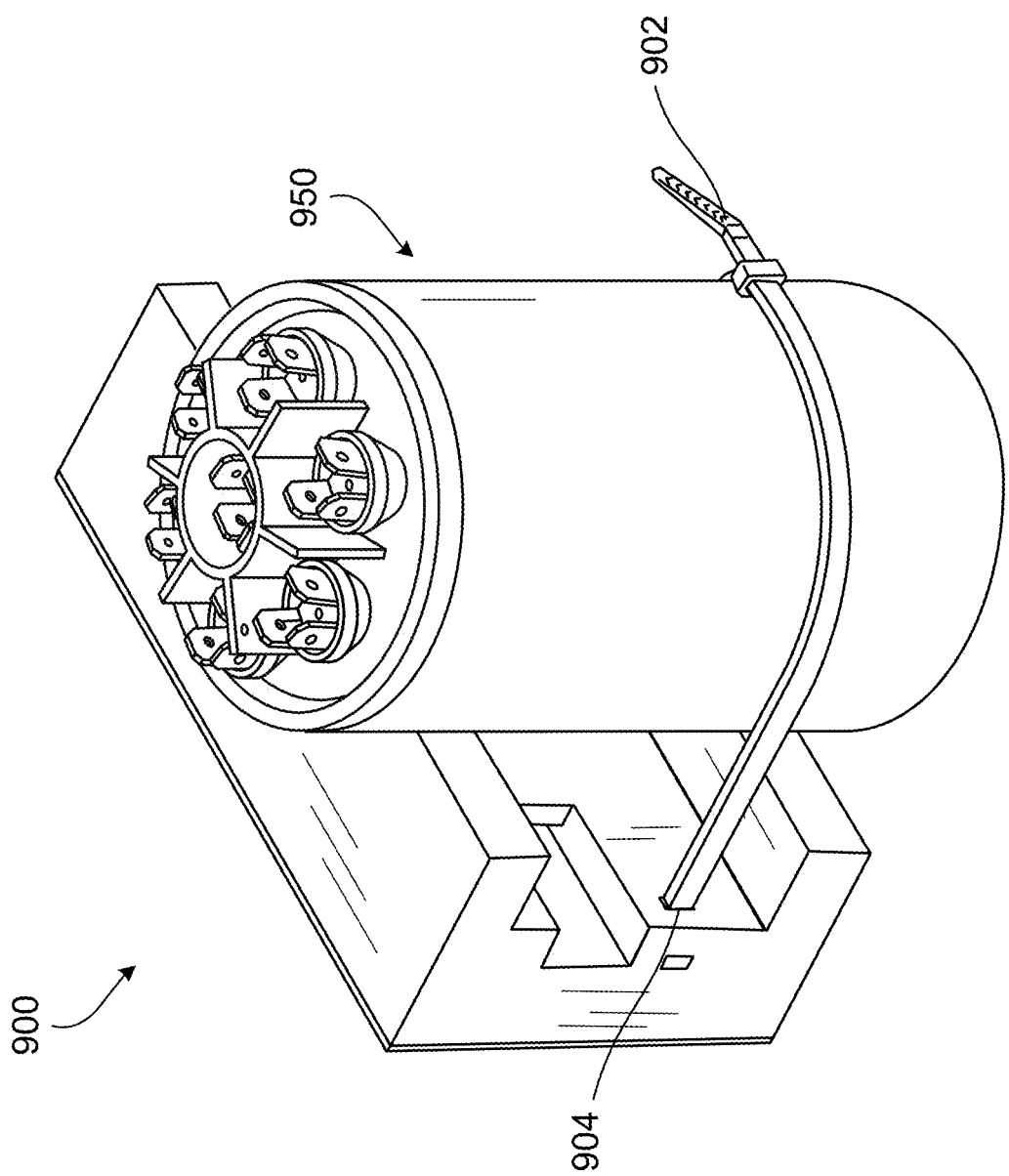
FIG. 9 is a perspective view of the mount of FIG. 1 holding a capacitor.
Figure 10:
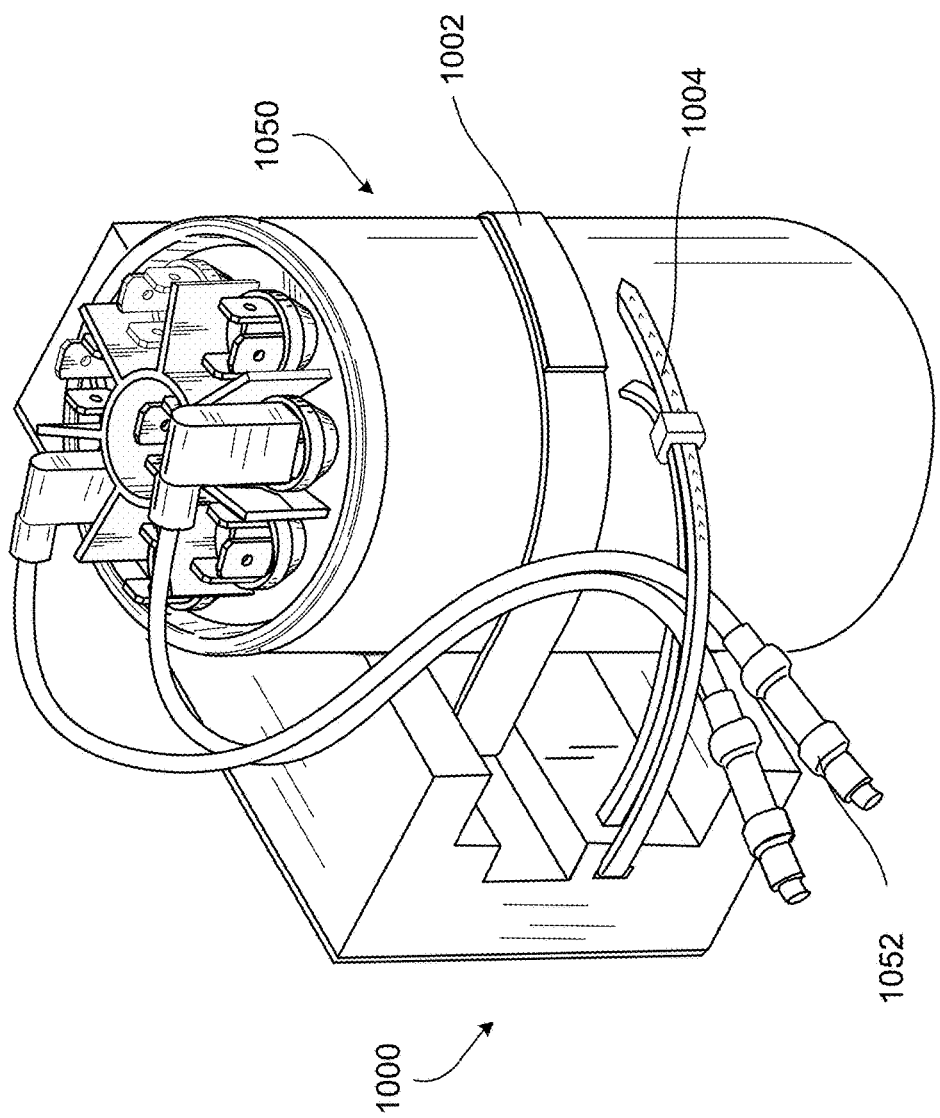
FIG. 10 is a perspective view of the mount of FIG. 1 holding a capacitor and wires.

In some implementations, the magnetic elements 120, 122 may have a stacked configuration such that a first disk shaped magnetic element is stacked on top of a second disk shaped magnetic element. In some implementations, the magnetic elements 120, 122 may have a strength of approximately 70-80 mT, 60-80 mT, or 130-150 mT, although other ranges are also possible. Some examples of suitable magnetic elements are described in prior U.S. Pat. No. 10,497, 518, which is incorporated herein by reference in its entirety FIGS. 8-10 illustrate different techniques for securing a capacitor received by a mount. For example, a single strap, multiple straps, etc. can be located in different positions to secure a capacitor received by a mount. For example, in the implementation illustrated in FIG. 8, a mount 800 includes a strap 802 that can be inserted through a slot 804 and can hold a capacitor 850 to the mount. The slot 804 can include a channel that extends through the mount 800. The slot 804 can be similar, e.g., to the slot 110 of FIG. 1. The strap 802 can include, e.g., hook-and-loop strap, strap with buckles, cinch strap, etc. The strap can secure the capacitor within the multi-radius cutout of the mount 800. The strap (e.g., or cable, etc.) can have one or more characteristics/parameters/properties (e.g., length, width, material properties to provide strength) determined to secure a capacitor (e.g., run capacitor, start capacitor, etc.) to the mount. The mount can be attached to a surface, e.g., via magnetic elements or via fasteners, as described above with reference to FIG. 7.

In the implementation illustrated in FIG. 9, a mount 900 includes a cable tie (e.g., a tie wrap, hose tie, etc.) 902 that can be inserted through openings 904 and can hold the capacitor 950 to the mount 900. A cable tie can be formed, e.g., of nylon and have a flexible tape section with teeth that engage with a pawl in the head to form a ratchet, such that as the free end of the tape section is pulled the cable tie tightens and does not come undone. Some cable ties include a tab that can be depressed to release the ratchet so that the cable tie can be loosened or removed, and possibly reused. Other materials can also be used for the cable ties, e.g., metals (e.g., stainless steel) plastic, etc. In some implementations, other securing mechanisms can be inserted through the openings 902 (e.g., strings, cables, etc.). The cable (e.g., or strings, etc.) can have one or more characteristics/parameters/properties (e.g., length, width, material properties to provide strength) determined to secure a capacitor (e.g., run capacitor, start capacitor, etc.) to the mount.

The openings 904 can be similar, e.g., to the openings 138, 140, 142, of FIG. 1. In some implementations, multiple securing mechanisms (e.g., cable ties, straps, strings, etc.) can be inserted through the openings 904 to hold the capacitor 950 to the mount. In some implementations, a strap (e.g., similar to strap 802 of FIG. 8) and a cable tie 902 can hold the capacitor 950 to the mount 900.

In some implementations, a strap can hold the capacitor to the mount, and the cable can be used for wire management. For example, in the implementation illustrated in FIG. 10, a mount 1000 includes a cable tie 1002 and a strap 1004. The cable tie 1002 is holding wires 1052 that are attached to the capacitor 1050. In some implementations, multiple cable ties 1004 can be used to hold wires. In some implementations, a first cable tie 1004 can hold the capacitor 1050 and another cable tie 1004 can be used for wire management. A myriad of cables and straps can be used to hold the capacitor to the mount and for wire management. The strap (e.g., or cable, etc.) can have one or more characteristics/parameters/properties (e.g., length, width, material properties to provide strength) determined to secure a capacitor (e.g., run capacitor, start capacitor, etc.) to the mount.

Figure 11:
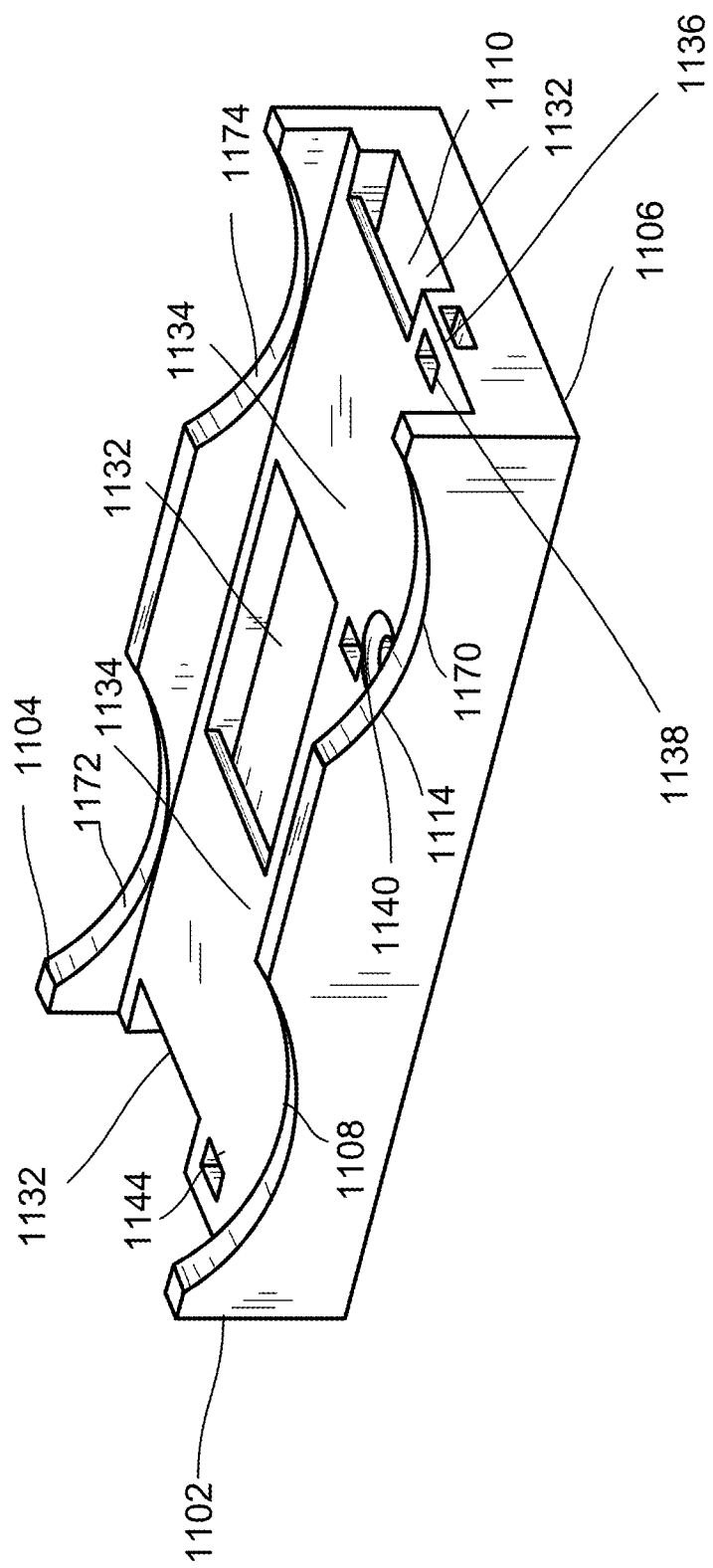
FIG. 11 is a perspective view of a mount for holding two capacitors.

FIG. 11 illustrates a mount 1100 for holding multiple capacitors (e.g., two run capacitors, two start capacitors, a run capacitor and a start capacitor, etc.). For example, the mount 1100 can be used during installation of the capacitor to stabilize the capacitor and to provide wire management, as described above. The mount 1100 is generally a rectangular prism or cuboid, but in some implementations one or more other shapes, e.g., a pyramid, a cylinder, etc. can be employed. In general, the mount 1100 has a front side for receiving multiple capacitors and at least one other surface for mounting (e.g., a surface opposite the capacitor holding surface such as a back surface). The mount 1100 can have a variety of dimensions, e.g., to be sized for receiving a capacitor. For example, the mount 1100 can have a height in a range of one inch to ten inches, a width in a range of one inches to seven inches, and a depth in a range of one inch to ten inches. The height, width, and depth can be different from one another; for example, each dimensional length can be different. In some implementations, the height, width, and depth are the same to give the mount 1100 a cuboid shape.

The mount 1100 can be formed of a variety of materials. For example, the mount 1100 can be formed of a rigid material, e.g., a polymer, ceramic, metal, etc. In some implementations, the mount 1100 can be formed of a composite of materials, e.g., including polymers, ceramics, metals, etc. In some implementations, the mount 1100 can be formed of a combination of materials, e.g., including polymers, ceramics, metals, etc.

The mount 1100 can be created through a variety of manufacturing methods. In some implementations, the mount 1100 can be created via 3-D printing (e.g., stereolithography). In some implementations, the mount 1100 can be created via pre-fabrication. The mount 1100 includes two sides 1102, 1104 which extend from a back side 1106.

Each of the two sides 1102, 1104 has multiple multi-radius cuts 1108, 1170, 1172, 1174, respectfully. The first side 1102 has two multi-radius cuts 1108, 1170, and the second side 1104 has two multi-radius cuts 1172, 1174. For example, each of the multi-radius cuts 1108, 1170, 1172, 1174 can be cutouts having a shape (e.g., an arch) that reflects a portion of a circle (e.g., a 90 degree portion of a circle, a 120 degree portion of a circle, a 180 degree portion of a circle, etc.) in the of the respective side 1102, 1104. In some implementations, the multi-radius cuts can be off-set from the centers of each respective side 1102, 1104. Each of the multi-radius cuts 1108, 1170, 1172, 1174 have multiple radii to allow the mount 1100 to hold a variety of capacitors securely, as described above. For example, each multi-radius cut can have two radii that reflect the diameter of start and run capacitors, so that start and run capacitors are received by the mount and fit securely and snug within the portion of the multi-radius cut. The multi-radius cuts can include radii that matches, nearly matches, etc. diameters of start and run capacitors. For example, in some implementations, each multi-radius cut 1108, 1170, 1172, 1174 has two diameters of about 2.5 inches and about 2.16 inches. This can accommodate the cylindrical shaped housing of capacitors (e.g., start capacitors, run capacitors, etc.) such as the AmRad Manufacturing Turbo 200, Turbo200 XL, EasyStart, TES5EXT, etc. that have a diameters in a range of about 1.75 inches to about 2.6 inches. The mount 1100 can accommodate a number of the capacitors produced by AmRad Manufacturing. While each multi-radius cut 1108, 1170, 1172, 1174 is described as having two radii, in some implementations the multi-radius cuts 1108, 1170, 1172, 1174 can include more or fewer radii (e.g., one radius, three radii, four radii, etc.). Also, while the multi-radius cuts in the first side 1102 match the multi-radius cuts in the second side 1104 in the illustrated example, in other implementations the multi-radius cuts in the first side 1102 do not match the multi-radius cuts in the second side 1104. For example, the multi-radius cuts 1108, 1170 in the first side 1102 can have slightly different dimensions than the multi-radius cuts 1172, 1174 in the second side 1104. In some implementations, the multi-radius cuts in the first side or in the second side can include features to tip the capacitor (e.g., tip the capacitor outward at the top to allow better access to the top of the capacitor). In some implementations, the mount includes bevels to tip the capacitor. In some implementations, the multi-radius cuts 1108, 1170, 1172, 1174 can be coated with a rubber material (e.g., butadiene, butyl, silicone, latex, etc.) to increase the friction at the intersection of the surface of the cutouts of the mount and the surface of the exterior side of the cylindrically shaped capacitor. For example, the rubber coating can prevent a capacitor from sliding out of the multi-radius cuts 1108, 1170, 1172, 1174.

The mount 1100 can use straps as a securing mechanism to secure the capacitor to the mount 1100. For example, the mount 1100 also includes a slot 1110 for a strap (not shown) to wrap around the capacitor. The slot can include a channel that has dimensions of about a quarter of an inch in depth and about a half an inch in height. The slot 1110 can extend through the interior of the mount 1100. In the illustrated example, the slot has open channel portions 1132 and a closed channel portion 1134. In some implementations, the open channel portions 1132 and the closed channel portions 1134 can be arranged differently. Some designs could have multiple slots to hold multiple straps. For example, some designs can include two, three, or more slots. This can be advantageous because more securing mechanisms make the capacitor more secure within the mount 1100. In some implementations, one strap can be wrapped around each closed portion 1134. For example, a strap can be inserted into one of the open portions, extend through one of the closed channels, and emerge out of one of the other open channels. Similarly, another strap can be inserted into the third open channel, extend through one of the closed channels, and emerge out of one of the other open channels. In some implementations, a single strap can be inserted into one of the open portions, extend through one of the closed channels, extend through a second open portion, extend through the other closed channel, and emerge out of the third open portion. For example, the strap can include, e.g., a hook-and-loop strap, a strap with buckles, a cinch strap, etc. When implemented, the strap (or multiple straps) can secure the capacitors within the multi-radius cuts 1108.

The mount 1100 can also have a number of openings for different types of securing mechanisms. For example, the mount 1100 also includes openings 1136, 1138, 1140, 1142, 1144 for additional straps or cables (not shown), if desired. The openings 1136, 1138, 1140, 1142, 1144 can be connected by closed channels that extend through the interior of the mount 1100. The openings 1136, 1138, 1140, 1142, 1144 can have different sizes, shapes, etc. In the illustrated embodiment, the dimensions of the openings 1136, 1138, 1140, 1142, 1144 are smaller than corresponding dimensions of the slot. For example, the openings can have dimensions of about a tenth of an inch in width and about a quarter of an inch in height. The dimensions can be smaller than the dimensions of the slot to allow for the use of multiple smaller straps (e.g., tie wraps cable ties, strings, etc.). The smaller straps can be used to secure the capacitor within the multi-radius cuts 1108. The smaller straps can also be used to secure wires to the mount, e.g., for wire management. Straps can be used in the openings 1136, 1138, 1140, 1142, 1144 in addition or alternatively to a strap used in the slot 1110.

In some implementations, the mount 1100 also includes additional openings that extend through the first side 1102 and the second side 1104 respectively. The additional openings can be used for wire management, as described above.

The mount 1100 can be mounted to a surface in a variety of ways. For example, the mount 100 includes holes 1114, 1116 for attaching the mount to a surface, e.g., an exterior of an air-conditioning system. The holes 1114, 1116 can allow for a variety of fasteners (not shown) to attach the mount to a surface. In some implementations, the fasteners can include, e.g., wood screws, machine screws, nails, etc. In some implementations, one or more of the holes 1114, 1116 can intersect with the slot 1110 (e.g., with the closed portion 1134 of the slot 1110) so that the fasteners attach the mount through a strap held in the slot 1110. This can be helpful to maintain the position of the strap within the slot 1110. In some implementations, the holes 1114, 1116 are positioned so that they do not intersect with the slot 1110. For example, in the illustrated embodiment, the hole 1114 does not intersect with the slot 1110. In other implementations, the mount 1100 can include more or fewer holes (no holes, one holes, three holes, etc.). In some implementations, the mount 1100 can be attached to a surface using a strap, cable tie, cable, etc. inserted through the slot 1110, the openings 1136, 1138, 1140, 1142, 1144, etc. For example, a strap can be inserted through the slot 1110 and wrapped around a post, pole, etc. to attach the mount 1100 to the post, pole, etc.

Figure 12:
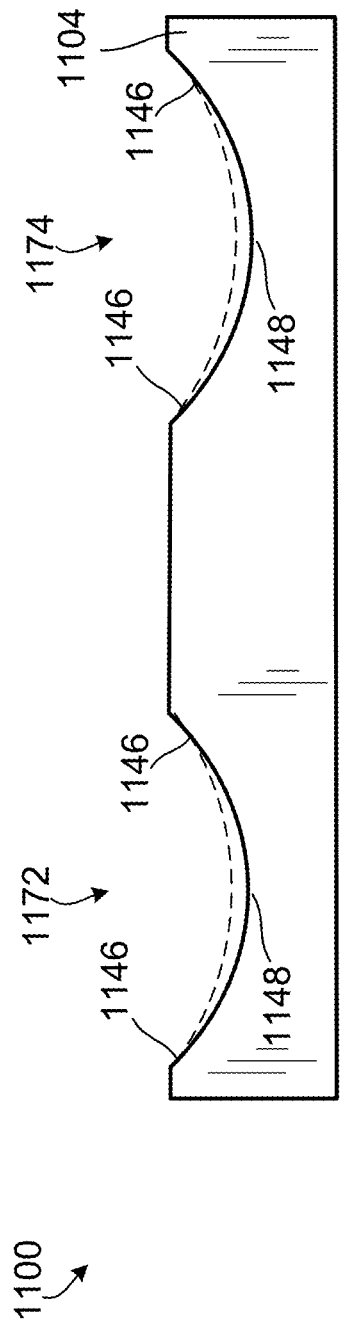
FIG. 12 is a top view of the mount of FIG. 11.
Figure 13:
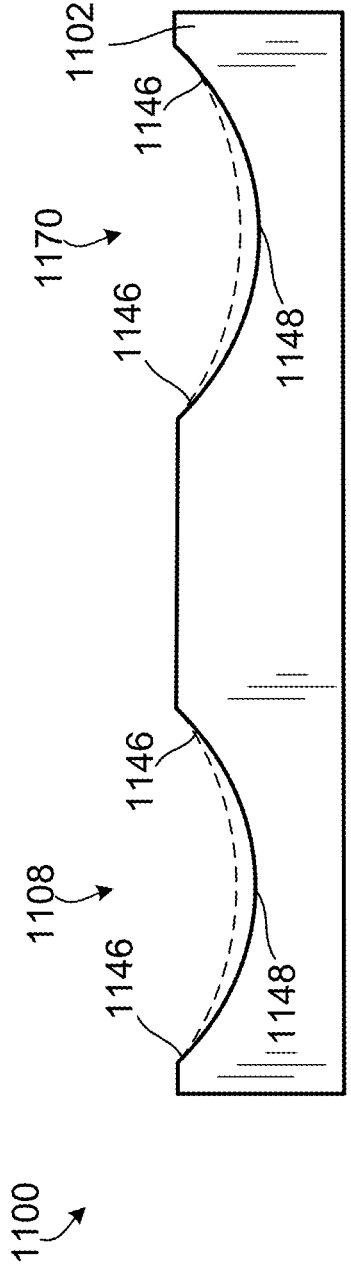
FIG. 13 is a bottom view of the mount of FIG. 11.

FIGS. 12 and 13 illustrate a top view of the mount 1100 of FIG. 1 and a bottom view of the mount 1100 of FIG. 1, respectively. FIGS. 12 and 13 illustrate the multi-radius cuts 1108, 1170, 1172, 1174 in greater detail. As illustrated, the multi-radius cutouts 1108, 1170 in the bottom side 102 are the same as the multi-radius cuts 1172, 1174 in the top side 1104 of the mount 1100. However, in some implementations, the multi-radius cuts in the top side 1104 can be different than the multi-radius cut in the bottom side 1102, as discussed above. In some implementations, one multi-radius cut 1172 in the top side 1104 can be different than another multi-radius cut 1174 in the top side 1104. Similarly, one multi-radius cut 1108 in the bottom side 1102 can be different than another multi-radius cut 1170 in the bottom side 1102. In some implementations, the top side and the bottom side can have more multi-radius cuts, e.g., to hold more capacitors. Each multi-radius cut 1108, 1170, 1172, 1174 has a first radius 1146 and a second radius 1148. In some implementations, each multi-radius cut can have more or fewer radii (e.g., one radius, three radii, four radii, etc.). Each multi-radius cut can include larger or smaller radii within the cut. In the illustrated implementation, the second radius 1148 is smaller than the first radius 1146; alternatively, the second radius 1148 can be larger than the first radius 1146. The second radius 1148 is also centered in each multi-radius cut 1108, 1170, 1172, 1174 and the cut has a first radius 1146 on either end of the second radius 1148. However, in some implementations, the second radius 1148 may not be centered in each multi-radius cut 1108, 1170, 1172, 1174. For example, a left half of a cut can have the first radius 1146 and a second half of the cut can have the second radius 1148. In some implementations, the radius can be changing throughout each cut. For example, the radius can be variable throughout the cut. For example, each multi-radius cut can include any shape and any number of radii to provide a desired shape that accommodates housings of capacitors. As described above, the multi-radius cuts can also be different from each other.

The first and second radius 1146, 1148 can have diameters of about 2.5 inches and about 2.16 inches, respectfully. This can accommodate round capacitors with diameters of about 2 inches to about 2.6 inches. For example, the first radius 1146 can receive capacitors having diameters of about 2.5 inches, and the second radius 1148 can receive capacitors having diameters of about 2.16 inches. This can allow capacitors with diameters of about 2 inches to about 2.6 inches to be fit snugly into the multi-radius cut. Having the same multi-radius cuts 1108 in the top side 1104 and the bottom side 1102 allows the capacitors to be seated equally in each cut 1108. In some implementations, the multi-radius cuts in the top side 1104 can be different than the multi-radius cuts in the bottom side 1102, as discussed above.

Figure 14:
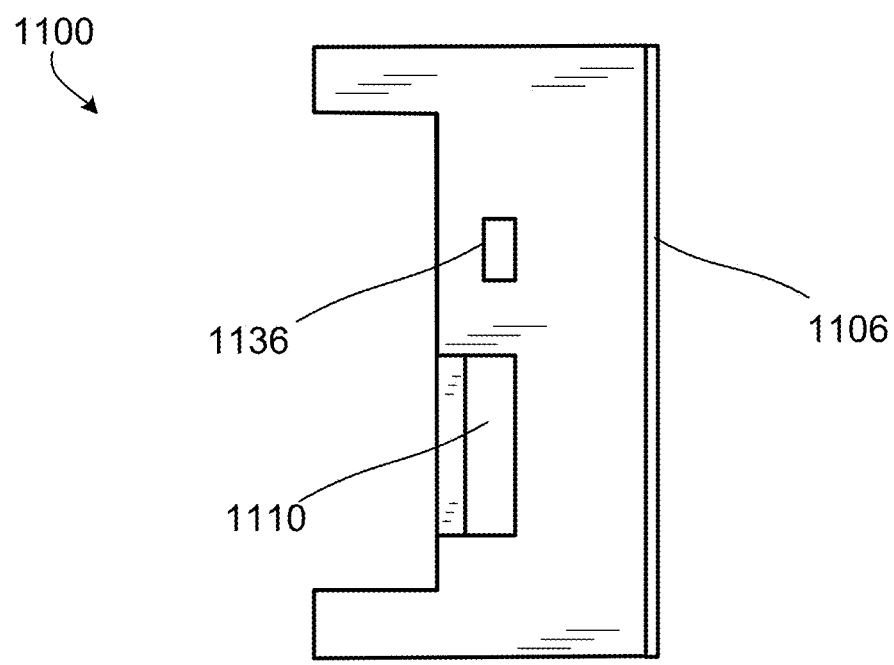
FIG. 14 is a right side view of the mount of FIG. 11.
Figure 15:
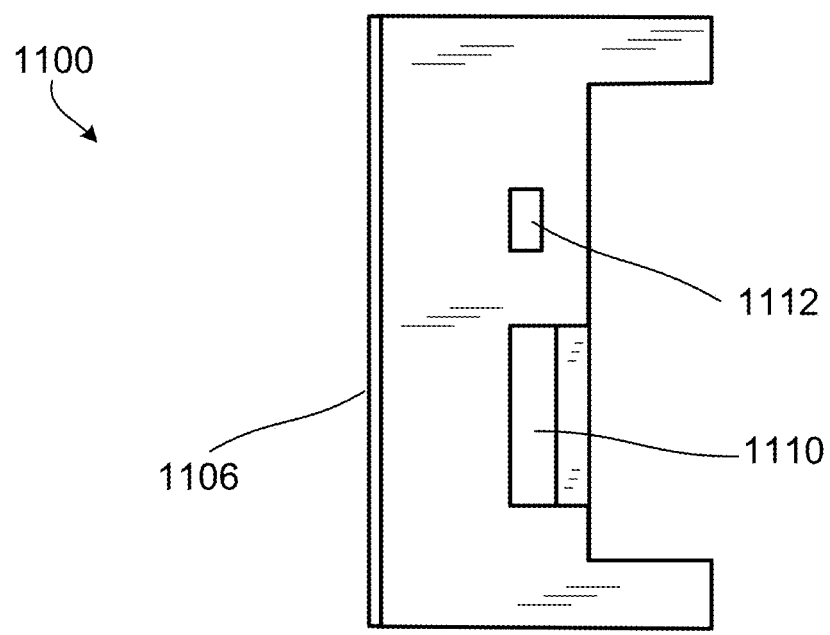
FIG. 15 is a left side view of the mount of FIG. 11.

FIGS. 14 and 15 illustrate a right view and a left view, respectively, of the mount 1100 of FIG. 11. The back side 1106 can have a rubber coating (e.g., butadiene, butyl, silicone, latex, etc.) to increase the friction between the mount 1100 and a surface to which the mount 1100 is mounted. In some implementations, the rubber coating on the back side 1106 can be the same as the rubber coating on the multi-radius cuts. In some implementations, the rubber coating on the back side 1106 can be different than the rubber coating on the multi-radius cuts. In some implementations, the back side 1106 may not have rubber coating.

Also illustrated in FIGS. 14 and 15 are the slot 1110 and openings 1112, 1136, e.g., for straps and cables. As illustrated, the slot 1110 extends completely through the mount 1100. For example, the slot 1110 extends from an open portion, to a closed portion, to an open portion on the front, to a second closed portion, to an open portion on the other side. The openings 1112, 1136 also extend through the mount 1100. For example, the openings 1112, 1136 are closed channels that extend through the interior of the mount 1100. The openings 1112, 1136 are connected, such that a strap, cable tie, cable, etc. can be fed through into and out of the openings as desired. This can be helpful, e.g., to accommodate for different wirings and capacitors. In some implementations, a user may desire more or fewer cables in certain positions on the mount 1100. Providing multiple connected openings allows the user to select which openings are used for cables. In the illustrated implementation, the slot 1110 is separate from the smaller openings, however, in some implementations, the slot 1110 can also be connected to the openings.

Figure 16:
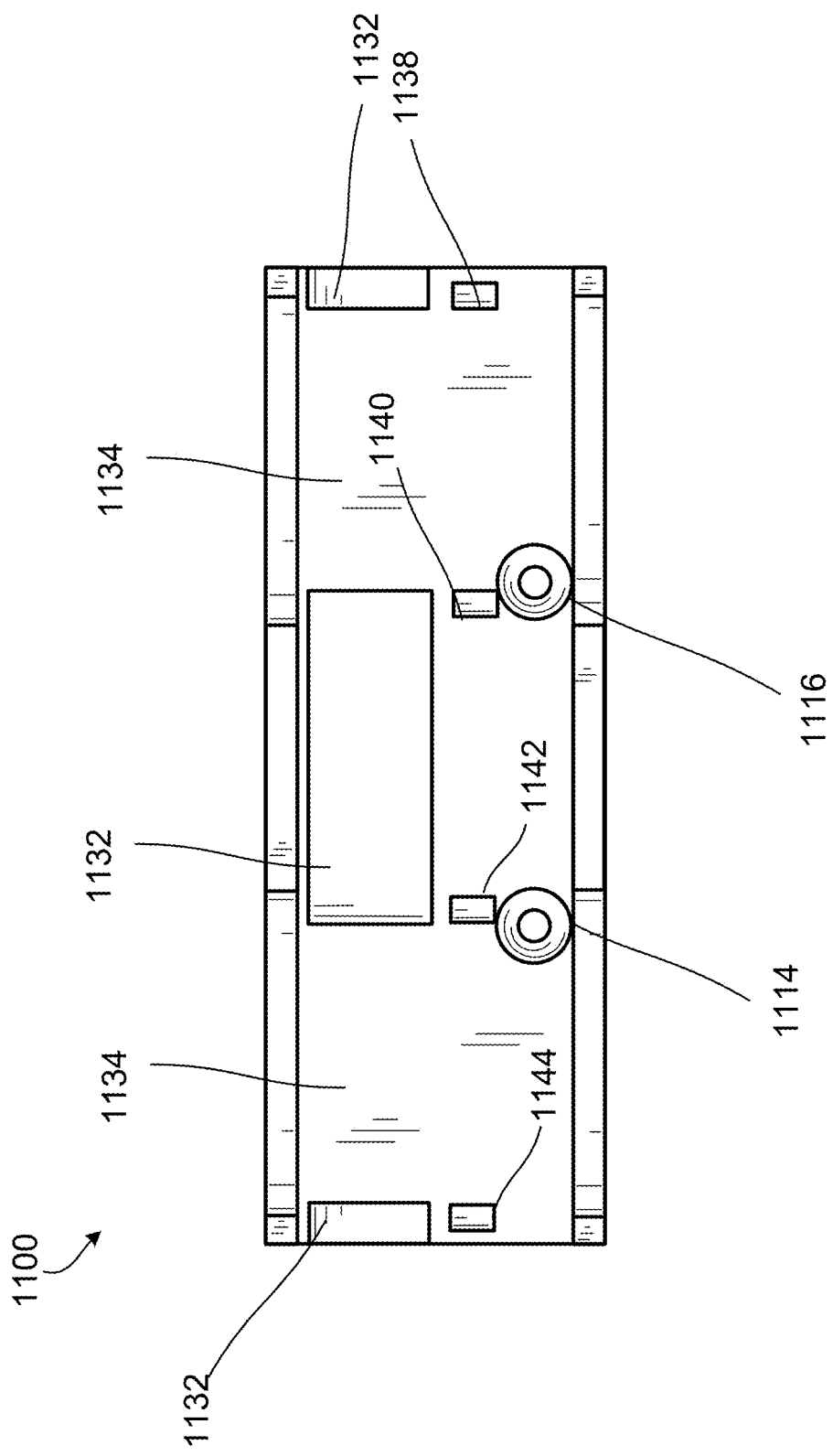
FIG. 16 is a front side view of the mount of FIG. 11.

FIG. 16 illustrates a front view of the mount 1100. The slot 1110, openings 1138, 1140, 1142, 1144, and holes 1114, 1116 are positioned on the front face of the mount 1100. The holes 1114, 1116 are positioned so that they do not intersect with the slot 110. In some implementations, at least one of the holes intersects the slot 1110, such that a fastener positioned in the hole extends through the hole and through a strap held in the slot 1110 to attach the mount 1100 to a surface. This can be helpful to maintain the position of the strap within the slot 1110. For example, the slot 1110 can be positioned differently or the holes 1114, 1116 can be positioned differently. In some implementations, the holes 1114, 1116 can be beveled to accommodate certain types of fasteners. For example, fasteners (e.g., screws, nails, etc.) can often include a head at an end of the fastener. Beveling the holes can create additional space for the head of the fastener so that the fastener is flush with the front surface of the mount 100. In some implementations, the holes 1114, 1116 can be different sizes, e.g., to accommodate different types of fasteners (e.g., sheet metal screws, wood screws, nails, etc.). In some implementations, the holes 1114, 1116 can have different depths. For example, in some implementations, the hole 1114 extends through the back of the mount to attach the mount to a surface (e.g., a wall of an air conditioner) and the hole 1116 does not extend through the back of the mount. In some implementations, the mount 1100 may not include the slot 1110. For example, the mount 1100 can be configured to hold a capacitor with only straps through the openings 1138, 1140, 1142, 1144. In some implementations, the mount 1100 may not include the holes 1114, 1116. In some implementations, the mount 1100 may not include the openings 1138, 1140, 1142, 1144. For example, the mount 1100 may be configured to hold a capacitor with only a strap through the slot 1110. The openings 1138, 1140, 1142, 1144 can be connected such that a strap can enter through any opening 1138, 1140, 1142, 1144 and exit through any opening 1138, 1140, 1142, 1144. In some implementations, the openings 1138, 1140, 1142, 1144 can also be connected to the slot 1110. In other implementations, the openings are not connected to the slot 1110.

Figure 17:
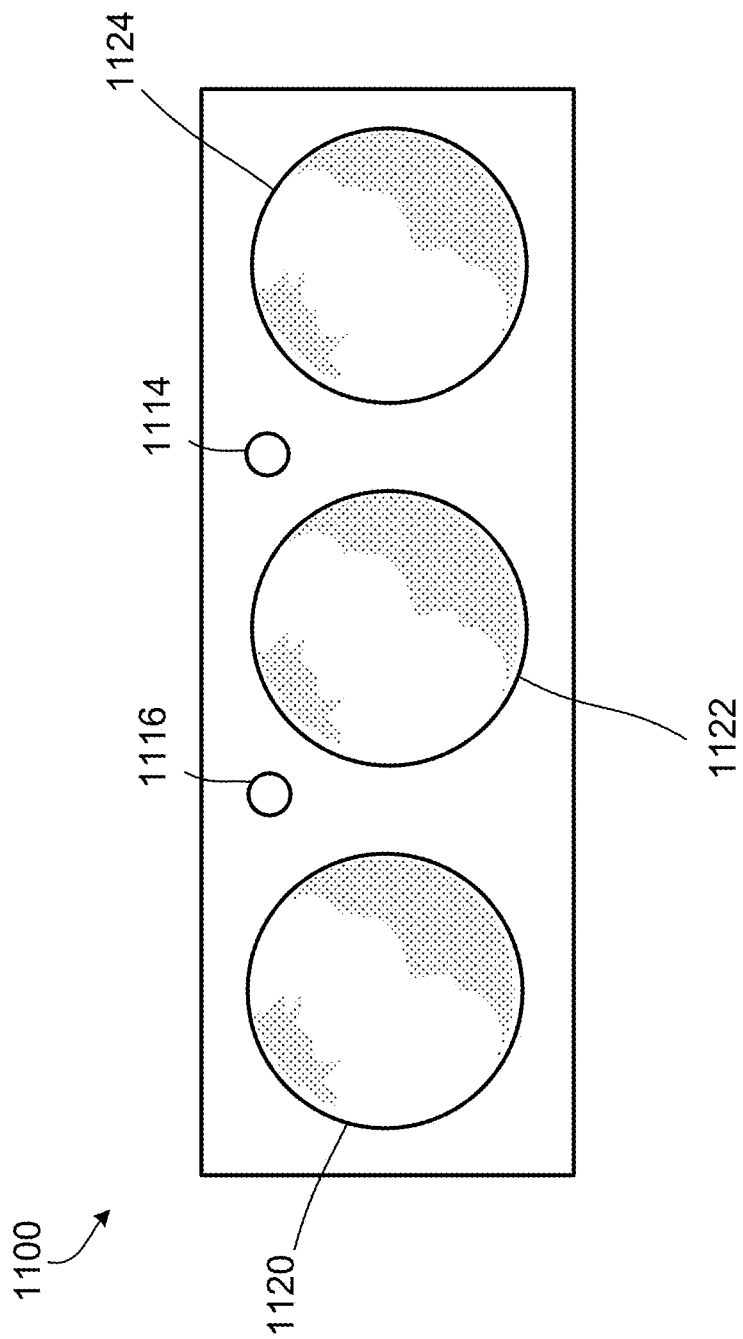
FIG. 17 is a back view of the mount of FIG. 11.

FIG. 17 illustrates a back view of the mount 1100. The mount 1100 includes three cylindrically shaped magnetic elements 1120, 1122, 1124 that can be embedded into the mount 1100. For example, the magnetic elements 1120, 1122, 1124 can be flush with the back surface of the mount 1100 so that the back surface 1100 is flat. The magnetic elements 1120, 1122, 1124 can assist in mounting of the mount 1100 (e.g., to an air conditioning system) such that the surface of the mount 1100 magnetically engages the surface of the air conditioning system. The magnetic elements 1120, 1122, 1124 are configured to create magnetic attraction between the magnetic elements 1120, 1122, 1124 and a magnetic surface in proximity to the mount 1100. For example, the magnetic elements 1120, 1122, 1124 may cause the back surface of the mount 1100 to be attracted to a metallic surface of an air conditioning system, thereby improving the integrity of a mounting between the mount 1100 and the air conditioning system after installation. The magnetic elements 1120, 1122, 1124 may be designed such that the strength of magnetic attraction between the magnetic elements 1120, 1122, 1124 and the air conditioning system is such that the magnetic elements 1120, 1122, 1124 may remain firmly in place in response to possible vibration and/or other movement of the air conditioning system during operational use. In some implementations, the strength of magnetic attraction between the magnetic elements 1120, 1122, 1124 and the air condition system is such that a user (e.g., a technician installing or uninstalling the mount 1100) can remove the mount from the surface of the air conditioning system without requiring excessive effort. The magnetic elements 1120, 1122, 1124 can be similar to the magnetic elements 120, 122 of FIG. 7 described above.

In some implementations, the back of the mount 1100 can include other attachment mechanisms alternatively to the magnetic elements, in addition to the magnetic elements, etc. For example, in some implementations, the back surface of the mount 1100 can be coated with a rubber material (e.g., butadiene, butyl, silicone, latex, etc.) to increase the friction between the mount 1100 and the mounting surface. For example, the rubber coating can prevent the mount 1100 from sliding relative to the surface, e.g., when the mount is magnetically attached. In some implementations, the back surface of the mount 1100 can be coated with an adhesive (e.g., double sided tape, glue, glue dots, etc.) to attach the mount 1100 to a surface. In some implementations, fasteners can be inserted through one or more of the holes 1114, 1116 to attach the mount 1100 to a surface and to prevent the mount 1100 from sliding relative to the surface.

Figure 18:
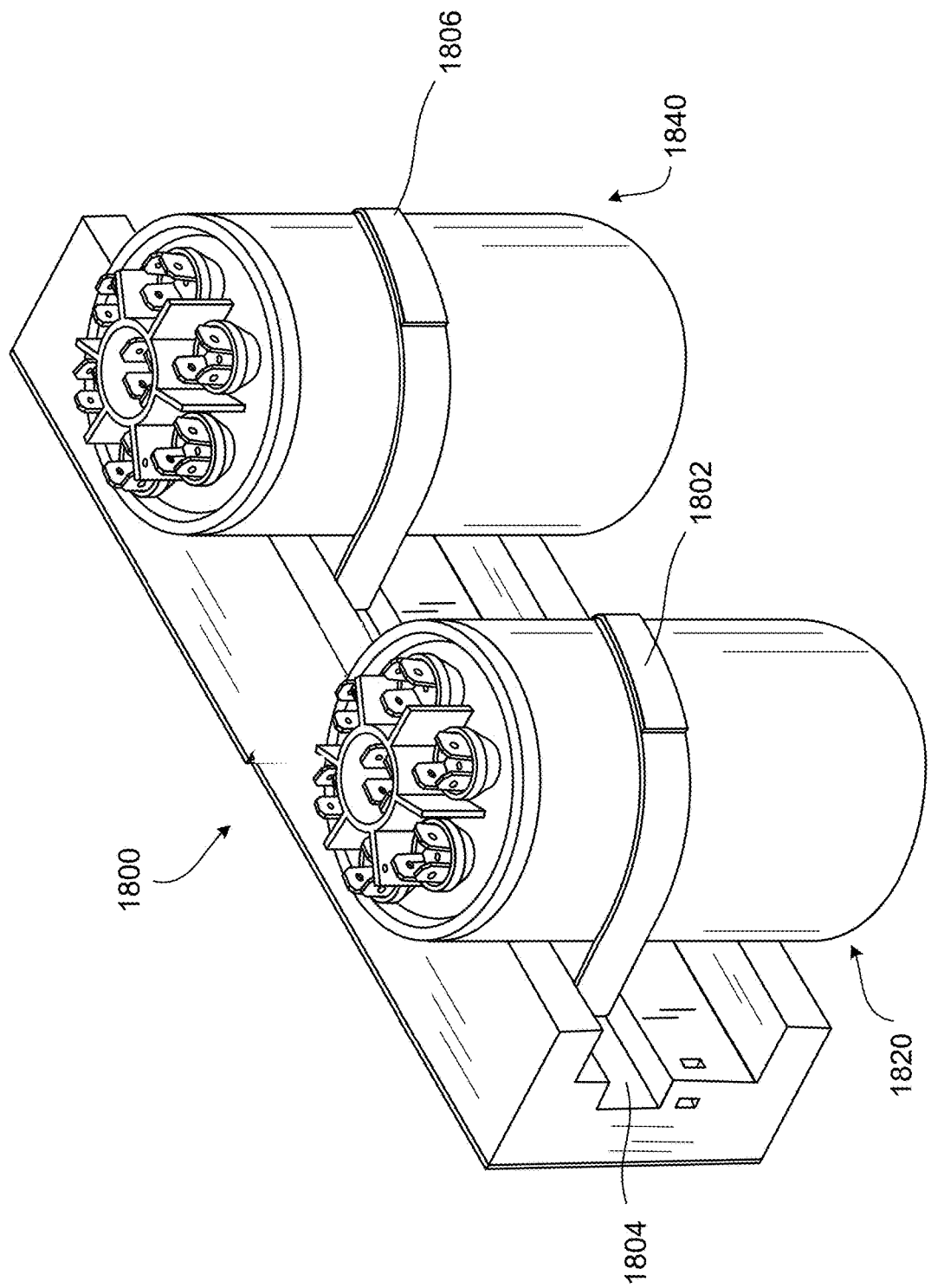
FIG. 18 is a perspective view of the mount of FIG. 11 holding two capacitors.

FIG. 18 illustrates an exemplary mount 1800 that is able to hold multiple capacitors 1820, 1840. The mount 1800 can be similar to the mount 1100 described with reference to FIGS. 11-17. Holding multiple capacitors can be beneficial when an air conditioning unit utilizes multiple capacitors. For example, many air conditioning units utilize a run capacitor and a start capacitor. The mount 1800 of FIG. 18 can secure a run capacitor and a start capacitor. For example, a single strap, multiple straps, etc. can be located in different positions to secure multiple capacitors received by the mount 1800. For example, in the implementation illustrated in FIG. 18, a mount 1800 includes a strap 1802 that can be inserted through a slot 1804 and can hold a capacitor 1820 to the mount. The slot 1804 can include a channel that extends through the mount 1800. The mount 1800 also includes a second strap 1806 that can be inserted through the slot 1804 and can hold a second capacitor 1840 to the mount 1800. For example, the slot 1804 can include multiple open portions to allow multiple straps 1802, 1806 to be inserted through the slot 1804. The straps 1802, 1806 can include, e.g., hook-and-loop strap, strap with buckles, cinch strap, etc. The straps can secure the capacitor within multi-radius cutouts of the mount 1800. For example, the mount 1800 can include multiple multi-radius cutouts, and each multi-radius cutout can be similar to the multi-radius cutouts of FIG. 11. The straps (e.g., or cables, etc.) can have one or more characteristics/parameters/properties (e.g., length, width, material properties to provide strength) determined to secure capacitors (e.g., run capacitors, start capacitors, etc.) to the mounts. In some implementations, the straps 1802, 1806 can be different (e.g., different characteristics/parameters/properties). The mount 1800 can be attached to a surface, e.g., via magnetic elements or via fasteners, as described above with reference to FIG. 17.

Figure 19:
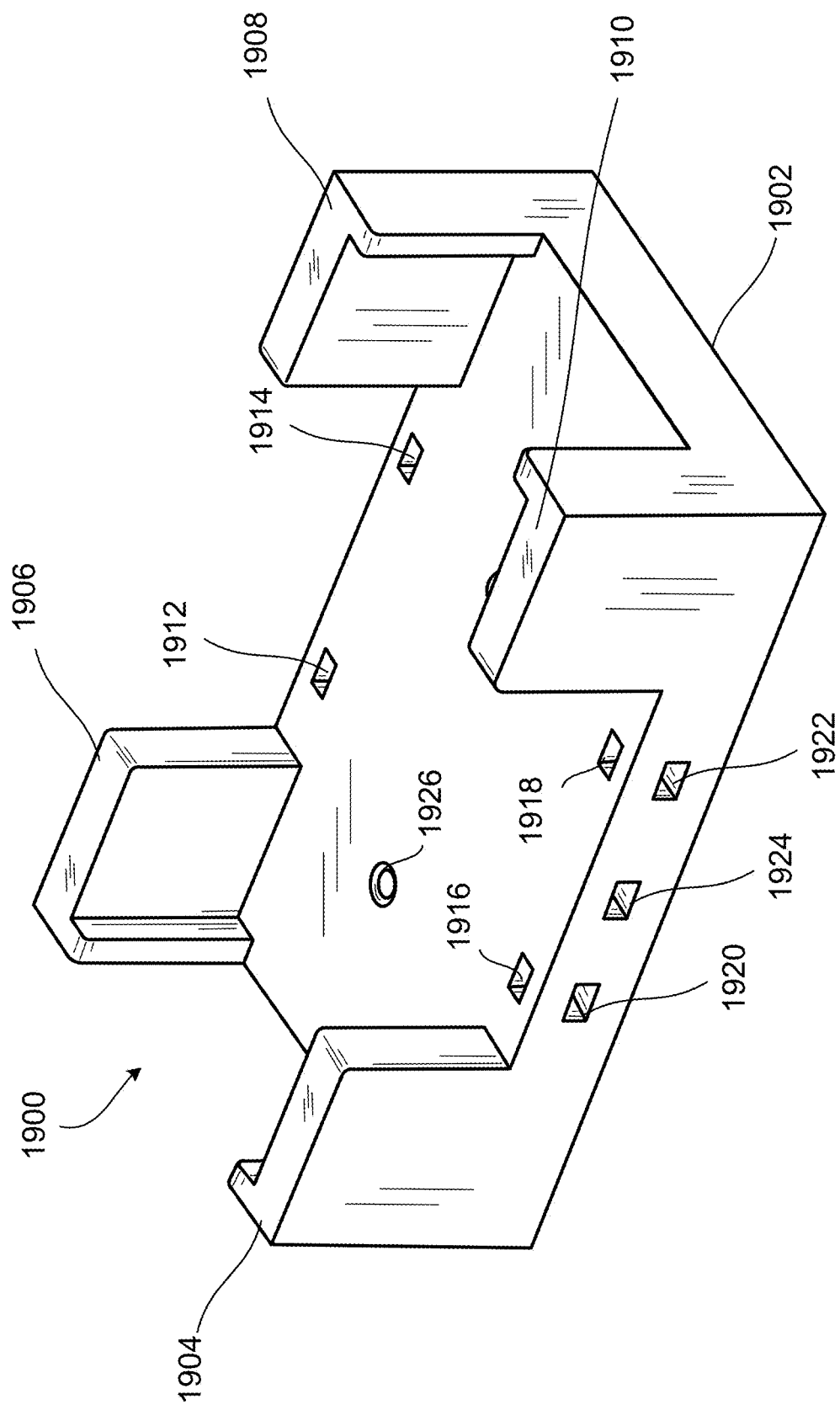
FIG. 19 is a perspective view of another mount for multiple types of capacitors.

FIG. 19 illustrates another mount 1900 for a capacitor (e.g., a run capacitor, a start capacitor, etc.). For example, the mount 1900 can be used during installation of the capacitor to stabilize the capacitor and to provide wire management, as described above. The mount 1900 is generally a rectangular prism, but in some implementations one or more other shapes, e.g., a pyramid, a cylinder, etc. can be employed. The mount 1900 can have a variety of dimensions, e.g., to be sized for receiving a capacitor. For example, the mount 1900 can have a height in a range of five inches to ten inches, a width in a range of one inch to ten inches, and a depth in a range of one inch to ten inches. The height, width, and depth can be different from one another; for example, each dimensional length can be different. In some implementations, the height, width, and depth are approximately the same to give the mount 1900 a cuboid shape.

The mount 1900 can be formed of a variety of materials. For example, the mount 1900 can be formed of a rigid material, e.g., a polymer, ceramic, metal, etc. In some implementations, the mount 1900 can be formed of a composite of materials, e.g., including polymers, ceramics, metals, etc. In some implementations, the mount 1900 can be formed of a combination of materials, e.g., including polymers, ceramics, metals, etc.

The mount 1900 can be created through a variety of manufacturing methods. In some implementations, the mount 1900 can be created via 3-D printing (e.g., stereolithography). In some implementations, the mount 1900 can be created via pre-fabrication. The mount 1900 includes a back side 1902 and protrusions 1904, 1906, 1908, 1910 that extend from the back side 1902.

Each of the protrusions 1904, 1906, 1908, 1910 generally extend from a corner of the back side 1902. For example, each of the protrusions 1904, 1906, 1908, 1910 form a right angle and abut two adjacent ends of the back side 1902. In some implementations, the protrusions 1904, 1906, 1908, 1910 can form different shapes and be positioned differently. The protrusions are generally positioned to surround a capacitor and to hold a variety of capacitors securely. For example, the positions of the protrusions can reflect the diameter of start and run capacitors, so that start and run capacitors are received by the mount and fit securely and snug within the protrusions. The distances between pairs of protrusions can match, nearly match, etc. diameters of start and run capacitors. For example, in some implementations, protrusions 1904 and 1906 are separated by a distance of about 2.16 inches, and protrusions 1908 and 1910 are separated by a distance of about 2.16 inches. In some implementations, protrusions 1904 and 1910 are separated by a distance of about 2.6 inches, and protrusions 1906 and 1908 are separated by a distance of about 2.6 inches. This can accommodate the cylindrical shaped housing of capacitors (e.g., start capacitors, run capacitors, etc.) such as the AmRad Manufacturing Turbo 200, Turbo200 XL, EasyStart, TES5EXT, etc., etc. that have a diameters in a range of about 1.75 inches to about 2.6 inches, such that the capacitor fits snugly in between the protrusions. The mount 1900 can accommodate a number of the capacitors produced by AmRad Manufacturing, such that the capacitors fit snugly between the four protrusions. While the mount 1900 is described as having four protrusions, in some implementations the mount 1900 can include more or fewer protrusions. Also, while the protrusions are positioned symmetrically in the illustrated example, in other implementations the protrusions can be positioned asymmetrically. For example, the protrusions on one side of the mount 1900 can have slightly different dimensions than the protrusions on another side. In some implementations, the protrusions can include features to tip the capacitor (e.g., tip the capacitor outward at the top to allow better access to the top of the capacitor). In some implementations, the mount includes bevels to tip the capacitor. In some implementations, the protrusions can be coated with a rubber material (e.g., butadiene, butyl, silicone, latex, etc.) to increase the friction at the intersection of the surface of the mount and the surface of the exterior side of the cylindrically shaped capacitor.

The mount 1900 can use straps, cables, cable ties, etc. as a securing mechanism to secure the capacitor to the mount 1900. The mount 1900 can have a number of openings for different types of securing mechanisms. For example, the mount 1900 includes openings 1912, 1914, 1916, 1918, 1920, 1922 for straps or cables (not shown), if desired. The openings 1912, 1914, 1916, 1918, 1920, 1922 can be connected by closed channels that extend through the interior of the mount 1900. The openings 1912, 1914, 1916, 1918, 1920, 1922 can have different sizes, shapes, etc. For example, the openings can have dimensions of about a tenth of an inch in width and about a quarter of an inch in height. The dimensions can allow for the use of multiple straps (e.g., tie wraps cable ties, strings, etc.). The straps can be used to secure the capacitor within the protrusions 1912, 1914, 1916, 1918, 1920, 1922. In some implementations, the capacitor includes a number of wires, e.g., to conduct electricity between the AC unit and the capacitor. The straps can also be used to secure wires to the mount, e.g., for wire management. Another opening 1924 can extend through the mount 1900 without connecting to the openings 1912, 1914, 1916, 1918, 1920, 1922. For example, the opening 1924 has a separate channel that extends through the mount 1900 (e.g., and has a companion opening on the opposite side of the mount, which is hidden in the figure).

In some implementations, the openings 1912, 1914, 1916, 1918, 1920, 1922 are not all connected. In some implementations, the opening 1920 is connected to the opening 1916, but not any of the other openings. Similarly, in some implementations, the opening 1922 is connected to the opening 1918, but not any of the other openings. Other openings (not shown) can be separately connected to openings 1912 and 1914.

The mount 1900 can be mounted to a surface in a variety of ways. For example, the mount 1900 includes holes for attaching the mount to a surface, e.g., an exterior of an air-conditioning system. A hole 1926 is illustrated in FIG. 19, and another hole 1928 is illustrated in the following figures. The holes 1926, 1928 can allow for a variety of fasteners (not shown) to attach the mount to a surface. In some implementations, the fasteners can include, e.g., wood screws, machine screws, nails, etc. In other implementations, the mount 1900 can include more or fewer holes (no holes, one hole, three holes, etc.). In some implementations, the mount 1900 can be attached to a surface using a strap, cable tie, cable, etc. inserted through the openings 1912, 1914, 1916, 1918, 1920, 1922, 1924, etc. For example, a strap can be inserted through the openings and wrapped around a post, pole, etc. to attach the mount 1900 to the post, pole, etc.

Figure 20:
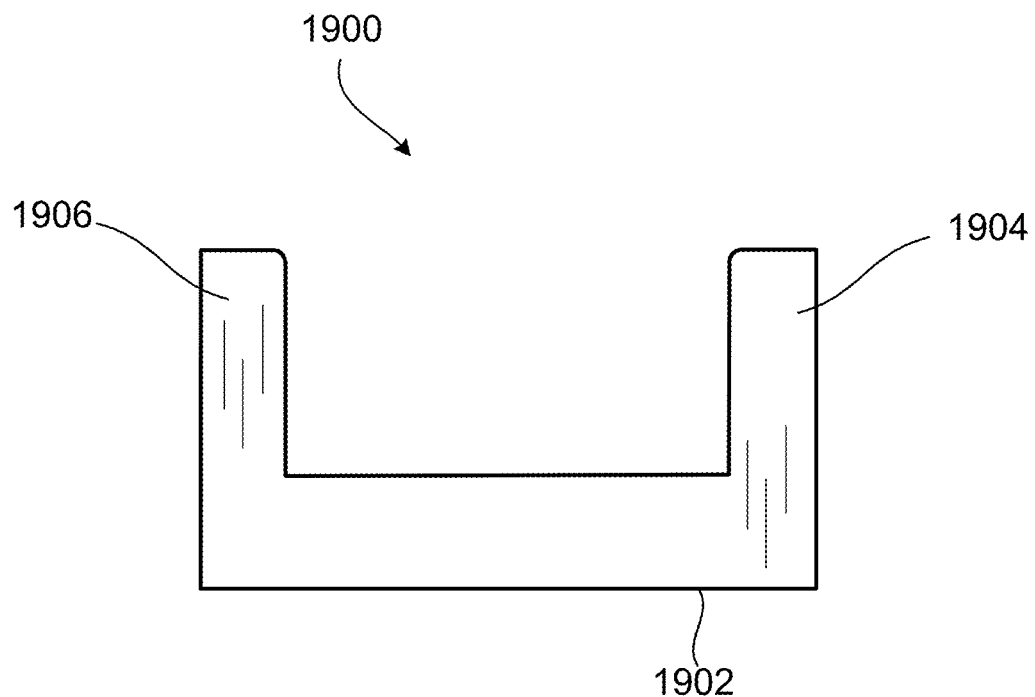
FIG. 20 is a top view of the mount of FIG. 19.
Figure 21:
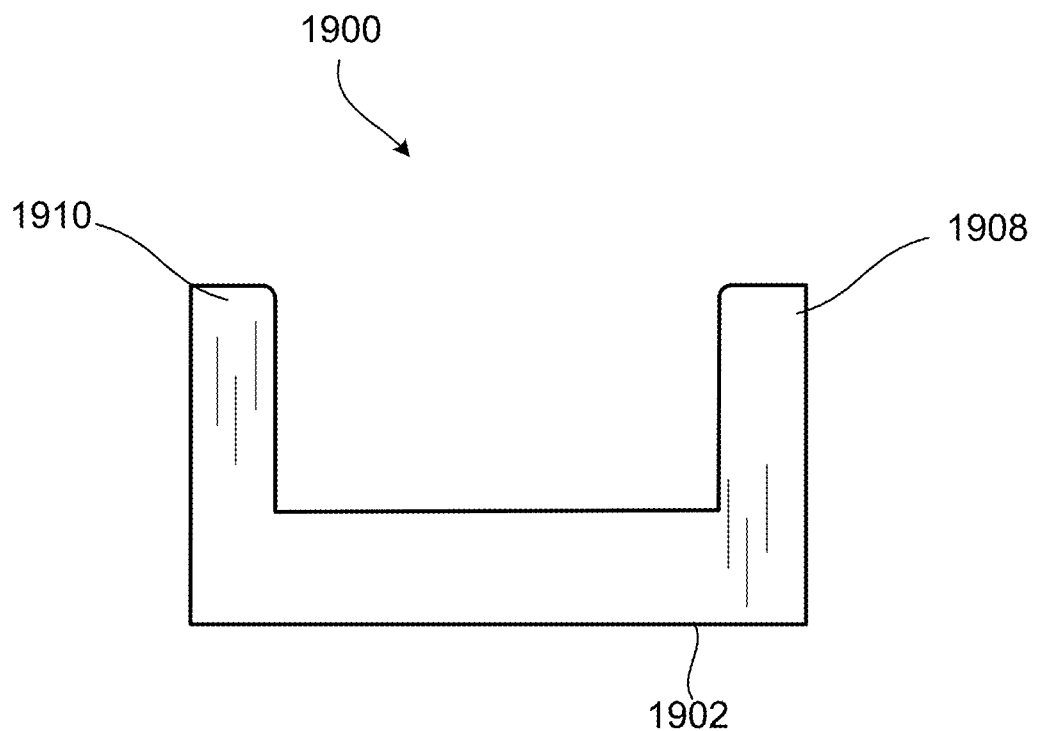
FIG. 21 is a bottom view of the mount of FIG. 19.

FIGS. 20 and 21 illustrate a top view and a bottom view, respectively, of the mount 1900 of FIG. 19. The back side 1902 can have a rubber coating (e.g., butadiene, butyl, silicone, latex, etc.) to increase the friction between the mount 1900 and a surface to which the mount 1900 is mounted. In some implementations, the rubber coating on the back side 1902 can be the same as the rubber coating on the multi-radius cut. In some implementations, the rubber coating on the back side 1902 can be different than the rubber coating on the multi-radius cut. In some implementations, the back side 1902 may not have rubber coating.

Figure 22:
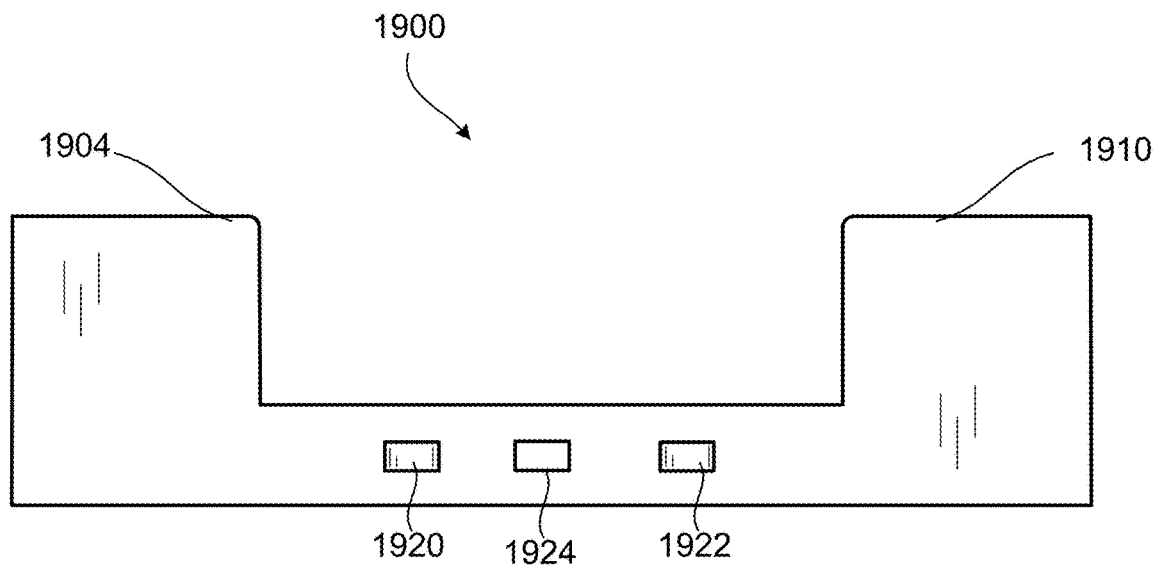
FIG. 22 is a right side view of the mount of FIG. 19.
Figure 23:
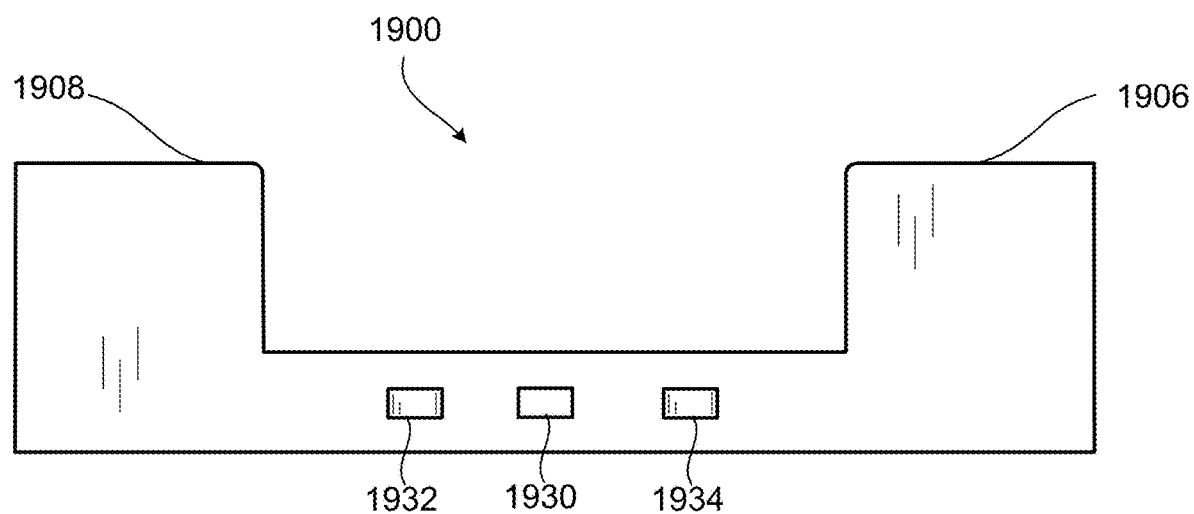
FIG. 23 is a left side view of the mount of FIG. 19.

FIGS. 22 and 23 illustrate a left side view of the mount 1900 of FIG. 19 and a right side view of the mount 1900 of FIG. 19, respectively. FIG. 23 illustrates openings in the mount 1900 that were hidden from view in FIG. 19. For example, the mount 1200 also includes openings 1924, 1930 for a strap to wrap around the capacitor. The openings can have dimensions of about a quarter of an inch in width and about a half an inch in height. The openings 1924, 1930 can extend through the interior of the mount 1900. Some designs could have multiple openings to hold multiple straps. For example, some designs can include two, three, or more openings. This can be advantageous because more securing mechanisms make the capacitor more secure within the mount 1900. While one strap can be inserted into one opening (e.g., opening 1924), extend through the mount 1900, and emerge out of another opening (e.g., opening 1930), multiple straps could also be used. Additional openings 1932, 1934 are illustrated on the right side of the mount 1900. The openings 1932, 1934 can be connected, e.g., to the openings 1912, 1914 illustrated in FIG. 19. In some implementations, all of the openings are connected to each other. In other implementations, only adjacent openings are connected to each other. Straps used in the openings can include, e.g., a hook-and-loop strap, a strap with buckles, a cinch strap, etc. When implemented, the strap (or multiple straps) can secure the capacitor within the protrusions 1904, 1906, 1908, 1910. In some implementations, a strap (or multiple straps) can secure the mount to a post, pole, etc.

Figure 24:
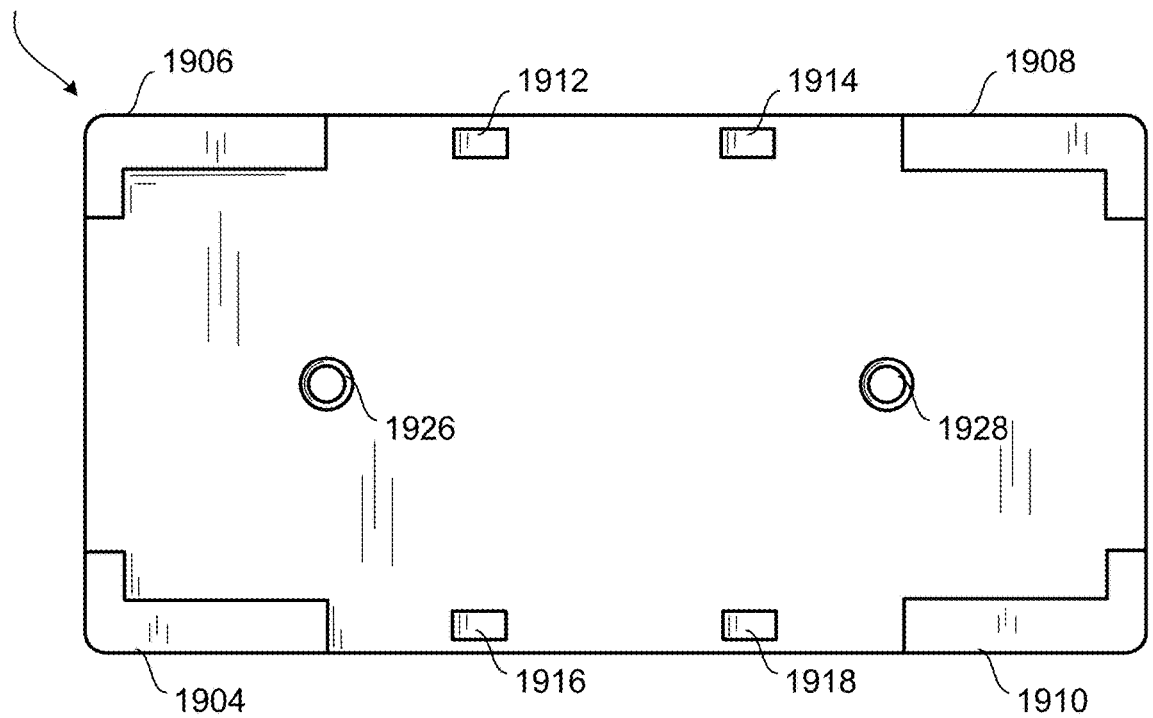
FIG. 24 is a front side view of the mount of FIG. 19.

FIG. 24 illustrates a front view of the mount 1900. The protrusions 1904, 1906, 1908, 1910, the openings 1912, 1914, 1916, 1918, and the holes 1926, 1928 are positioned on the front face of the mount 1900. In some implementations, the holes 1926, 1928 are positioned differently. In some implementations, the holes 1926, 1928 can be beveled to accommodate certain types of fasteners. For example, fasteners (e.g., screws, nails, etc.) can often include a head at an end of the fastener. Beveling the holes can create additional space for the head of the fastener so that the fastener is flush with the front surface of the mount 1900. In some implementations, the holes 1926, 1928 can be different sizes, e.g., to accommodate different types of fasteners (e.g., sheet metal screws, wood screws, nails, etc.). In some implementations, the holes 1926, 1928 can have different depths. In some implementations, the mount 1900 may not include the holes 1926, 1928. In some implementations, the mount 1900 may not include the openings 1912, 1914, 1916, 1918. For example, the mount 1900 may be configured to hold a capacitor with only a strap through the openings in the sides (e.g., 1924, 1930, etc.).

Figure 25:
FIG. 25 is a back view of the mount of FIG. 19.

FIG. 25 illustrates a back view of the mount 1900. The back view illustrates the holes that extend through the mount 1900 to accommodate fasteners. In some implementations, the holes can be positioned differently, as described above, or may not extend completely through the mount 1900, as described above. In some implementations, the back of the mount 1900 can include other attachment mechanisms alternatively to the holes, in addition to the holes, etc. For example, in some implementations, the back surface of the mount 1900 can be coated with a rubber material (e.g., butadiene, butyl, silicone, latex, etc.) to increase the friction between the mount 1900 and the mounting surface. For example, the rubber coating can prevent the mount 1900 from sliding relative to the surface, e.g., when the mount is attached to a surface. In some implementations, the back surface of the mount 1900 can be coated with an adhesive (e.g., double sided tape, glue, glue dots, etc.) to attach the mount 1900 to a surface. In some implementations, the back surface of the mount 1900 can include magnetic elements, e.g., similar to the magnetic elements 120, 122 of the mount 100, to magnetically attach the mount 1900 to a surface.

Figure 26:
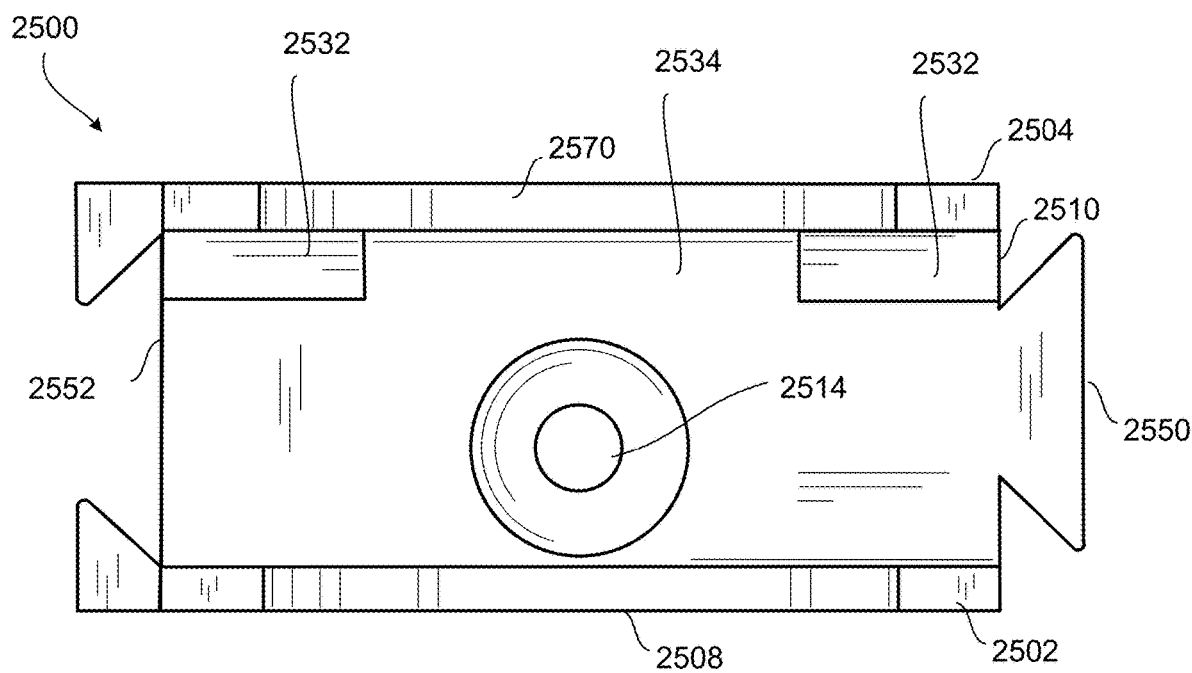
FIG. 26 is front side view of another mount for multiple types of capacitors.

FIG. 26 illustrates another mount 2500 for a capacitor (e.g., a run capacitor, a start capacitor, etc.). For example, the mount 2500 can be used during installation of the capacitor to stabilize the capacitor and to provide wire management, as described above. The mount 2500 is modular and can be connected to other mounts (e.g., that are identical to mount 2500) to mount additional capacitors. For example, FIG. 32 illustrates multiple modular mounts (e.g., similar to mount 2500) that are connected together. Referring back to FIG. 26, the mount 2500 is generally a rectangular prism or cuboid, but in some implementations one or more other shapes, e.g., a pyramid, a cylinder, etc. can be employed. In general, the mount 2500 has a front side for receiving a capacitor and at least one other surface for mounting (e.g., a surface opposite the capacitor holding surface such as a back surface). The mount 2500 can have a variety of dimensions, e.g., to be sized for receiving a capacitor. For example, the mount 2500 can have a height in a range of one inch to ten inches, a width in a range of one inch to ten inches, and a depth in a range of one inch to ten inches. The height, width, and depth can be different from one another; for example, each dimensional length can be different. In some implementations, the height, width, and depth are the same to give the mount 2500 a cuboid shape.

The mount 2500 can be formed of a variety of materials. For example, the mount 2500 can be formed of a rigid material, e.g., a polymer, ceramic, metal, etc. In some implementations, the mount 2500 can be formed of a composite of materials, e.g., including polymers, ceramics, metals, etc. In some implementations, the mount 2500 can be formed of a combination of materials, e.g., including polymers, ceramics, metals, etc.

The mount 2500 can be created through a variety of manufacturing methods. In some implementations, the mount 2500 can be created via 3-D printing (e.g., stereolithography). In some implementations, the mount 2500 can be created via pre-fabrication. The mount 2500 includes two sides 2502, 2504 which extend from a back side 2506.

Each of the two sides 2502, 2504 has a multi-radius cut 2508, 2570. Each multi-radius cut 2508, 2570 can be similar to the multi-radius cuts 108, 170 of FIG. 1. For example, each multi-radius cut 2508, 2570 can be a cutout having a shape (e.g., an arch) that reflects a portion of a circle (e.g., a 90 degree portion of a circle, a 120 degree portion of a circle, a 180 degree portion of a circle, etc.) in the center of the respective side 2502, 2504. In some implementations, the multi-radius cuts can be off-set from the centers of each respective side 2502, 2504. Each multi-radius cut 2508, 2570 has multiple radii to allow the mount 2500 to hold a variety of capacitors securely. For example, each multi-radius cut can have two radii that reflect the diameter of start and run capacitors, so that start and run capacitors are received by the mount and fit securely and snug within the portion of the multi-radius cut. The multi-radius cut can include radii that matches, nearly matches, etc. diameters of start and run capacitors. For example, in some implementations, each multi-radius cut 2508, 2570 has two diameters of about 2.5 inches and about 2.16 inches. This can accommodate the cylindrical shaped housing of capacitors (e.g., start capacitors, run capacitors, etc.) such as the AmRad Manufacturing Turbo 200, Turbo200 XL, EasyStart, TES5EXT, etc. that have a diameters in a range of about 1.75 inches to about 2.6 inches. While each multi-radius cut 2508, 2570 is described as having two radii, in some implementations each multi-radius cut can include more or fewer radii (e.g., one radius, three radii, four radii, etc.). Also, while the multi-radius cut 2508 in the first side 2502 matches the multi-radius cut 2570 in the second side 2504 in the illustrated example, in other implementations the multi-radius cut 2508 in the first side 2502 does not match the multi-radius cut 2570 in the second side 2504. For example, the multi-radius cut in the first side 2502 can have slightly different dimensions than the multi-radius cut in the second side. In some implementations, the multi-radius cut in the first side or in the second side can include features to tip the capacitor (e.g., tip the capacitor outward at the top to allow better access to the top of the capacitor). In some implementations, the mount includes bevels to tip the capacitor. In some implementations, each multi-radius cut 2508, 2570 can be coated with a rubber material (e.g., butadiene, butyl, silicone, latex, etc.) to increase the friction at the intersection of the surface 2530 of the cutouts of the mount and the surface of the exterior side of the cylindrically shaped capacitor. For example, the rubber coating can prevent a capacitor from sliding out of the multi-radius cuts 2508, 2570.

The mount 2500 can use straps as a securing mechanism to secure the capacitor to the mount 2500. For example, the mount 2500 also includes a slot 2510 for a strap (not shown) to wrap around the capacitor. The slot can include a channel that has dimensions of about a quarter of an inch in depth and about a half an inch in height. The slot 2510 can extend through the interior of the mount 2500. In the illustrated example, the slot has open channel portions 2532 and a closed channel portion 2534. Some designs could have multiple slots to hold multiple straps. For example, some designs can include two, three, or more slots. This can be advantageous because more securing mechanisms make the capacitor more secure within the mount 2500. While one strap can be inserted into the one of the open channels, extend through the closed channel, and emerge out of the other open channel, multiple straps could also be used. For example, the strap can include, e.g., a hook-and-loop strap, a strap with buckles, a cinch strap, etc. When implemented, the strap (or multiple straps) can secure the capacitor within the multi-radius cut 2508.

The mount 2500 can be mounted to a surface in a variety of ways. For example, the mount 2500 includes a hole 2514 for attaching the mount to a surface, e.g., an exterior of an air-conditioning system. The hole 2514 can allow for a variety of fasteners (not shown) to attach the mount to a surface. In some implementations, the fasteners can include, e.g., wood screws, machine screws, nails, etc. In some implementations, the hole 2514 can intersect with the slot 2510 (e.g., with the closed portion 2534 of the slot 2510) so that the fasteners attach the mount through a strap held in the slot 2510. In some implementations, the mount 2500 can include more or fewer holes (no holes, two holes, three holes, etc.). In some implementations, the mount 2500 can be attached to a surface using a strap, cable tie, cable, etc. inserted through the slot 2510. For example, a strap can be inserted through the slot 2510 and wrapped around a post, pole, etc. to attach the mount 2500 to the post, pole, etc. The hole 2514 is illustrated as beveled, but in some implementations may not be beveled.

The mount 2500 also includes modular connectors 2550, 2552 on either side of the mount 2500. The modular connectors 2550, 2552 can allow for the mount 2500 to connect to similar mounts (e.g., mounts having similar connectors). The modular connector 2550 is a protrusion, and the modular connector 2552 is a recess configured to accept the modular connector 2550. Multiple mounts 2500 can be connected to each other by inserting the modular connector 2550 into the modular connector 2552. The modular connectors 2550, 2552 can have a variety of shapes that allow multiple mounts 2500 to be connected together (e.g., via an interference fit, snap fit, etc.). A single mount 2500 can also be used on its own to mount a capacitor, as discussed above.

Figure 27:
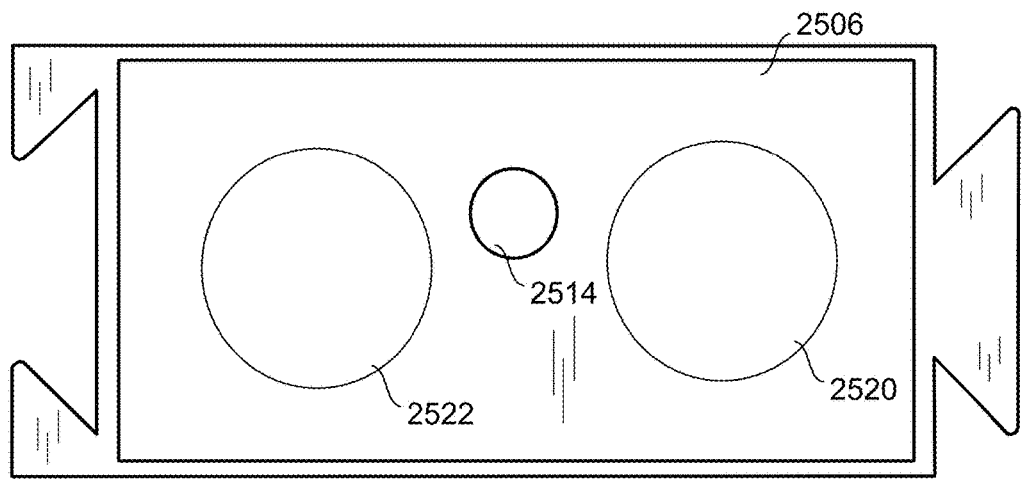
FIG. 27 is a back side view of the mount of FIG. 26.

FIG. 27 illustrates a back view of the mount 2500. The mount 2500 includes two cylindrically shaped magnetic elements 2520, 2522 that can be embedded into the mount 2500. For example, the magnetic elements 2520, 2522 can be flush with the back surface of the mount 2500 so that the back surface 2500 is flat. The magnetic elements 2520, 2522 can assist in mounting of the mount 2500 (e.g., to an air conditioning system) such that the surface of the mount 2500 magnetically engages the surface of the air conditioning system. For example, the magnetic elements 2520, 2522 can be similar to the magnetic elements 120, 122 of the mount 100 described above.

In some implementations, the back of the mount 2500 can include other attachment mechanisms alternatively to the magnetic elements, in addition to the magnetic elements, etc. For example, in some implementations, the back surface of the mount 2500 can be coated with a rubber material (e.g., butadiene, butyl, silicone, latex, etc.) to increase the friction between the mount 2500 and the mounting surface. For example, the rubber coating can prevent the mount 100 from sliding relative to the surface, e.g., when the mount is magnetically attached. In some implementations, the back surface of the mount 2500 can be coated with an adhesive (e.g., double sided tape, glue, glue dots, etc.) to attach the mount 2500 to a surface. In some implementations, fasteners can be inserted through the hole 2514 to attach the mount 2500 to a surface and to prevent the mount 2500 from sliding relative to the surface.

Figure 28:
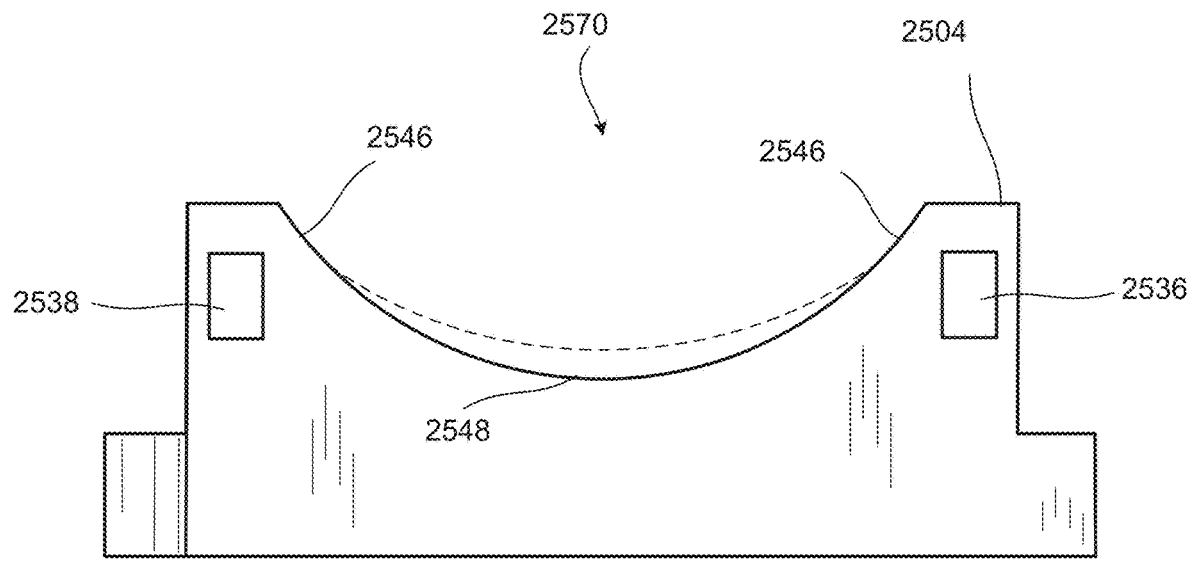
FIG. 28 is a top view of the mount of FIG. 26.
Figure 29:
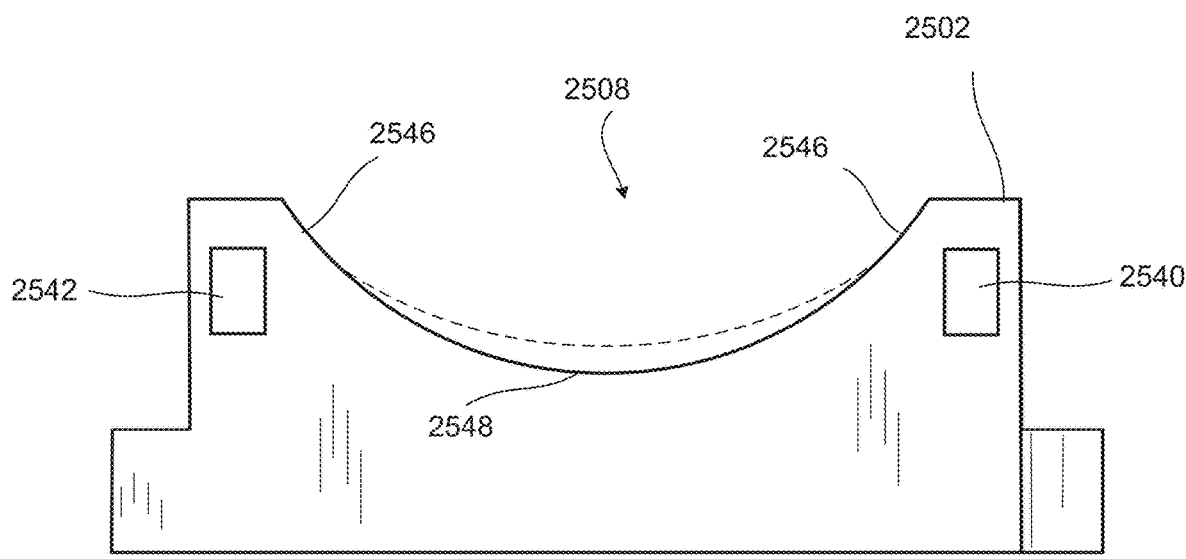
FIG. 29 is a bottom view of the mount of FIG. 26.

FIGS. 28 and 29 illustrate a top view of the mount 2500 of FIG. 26 and a bottom view of the mount 2500 of FIG. 26, respectively. FIGS. 28 and 29 illustrate the multi-radius cut 2508 in greater detail. As illustrated, the multi-radius cutout 2508 is the same in both the top side 2504 and the bottom side 2502 of the mount 2500. However, in some implementations, the multi-radius cut 2570 in the top side 2504 can be different than the multi-radius cut 2508 in the bottom side 2504, as discussed above. Each multi-radius cut 2508, 2570 has a first radius 2546 and a second radius 2548. In some implementations, each multi-radius cut can have more or fewer radii (e.g., one radius, three radii, four radii, etc.). Each multi-radius cut can include larger or smaller radii within the cut. In the illustrated implementation, the second radius 2548 is smaller than the first radius 2546; alternatively, the second radius 2548 can be larger than the first radius 2546. The second radius 2548 is also centered in the multi-radius cuts 2508, 2570 and each cut has a first radius 2546 on either end of the second radius 2548. However, in some implementations, the second radius 2548 may not be centered in the multi-radius cut 2508. For example, a left half of the cut 2508 can have the first radius 2546 and a second half of the cut 2508 can have the second radius 2548. In some implementations, the radius can be changing throughout the cut. For example, the radius can be variable throughout the cut. For example, the multi-radius cut can include any shape and any number of radii to provide a desired shape that accommodates housings of capacitors.

The first and second radius 2546, 2548 can have diameters of about 2.5 inches and about 2.16 inches, respectfully. This can accommodate round capacitors with diameters of about 2 inches to about 2.6 inches. For example, the first radius 2546 can receive capacitors having diameters of about 2.5 inches, and the second radius 2548 can receive capacitors having diameters of about 2.16 inches. This can allow capacitors with diameters of about 2 inches to about 2.6 inches to be fit snugly into the multi-radius cut. Having a multi-radius cut 2508, 2570 in the top side 2504 and the bottom side 2502 allows the capacitor to be seated equally in each cut 2508. In some implementations, the multi-radius cut in the top side 2504 can be different than the multi-radius cut in the bottom side 2502, as discussed above.

The mount 2500 can also have a number of openings for different types of securing mechanisms. For example, the mount 2500 also includes openings 2536, 2538, 2540, 2542 for additional straps or cables (not shown), if desired. The openings 2536, 2538, 2540, 2542 can be connected by closed channels that extend through the sides 2502, 2504 of the mount 2500. In some implementations, the openings 2536, 2538, 2540, 2542 can be connected by closed channels that extend through the back side 2506 of the mount 2500. The openings 2536, 2538, 2540, 2542 can have different sizes, shapes, etc. In the illustrated embodiment, the dimensions of the openings 2536, 2538, 2540, 2542 are smaller than corresponding dimensions of the slot 2510. For example, the openings can have dimensions of about a tenth of an inch in width and about a quarter of an inch in height. The dimensions can be smaller than the dimensions of the slot to allow for the use of multiple smaller straps (e.g., tie wraps cable ties, strings, etc.). The smaller straps can be used to secure the capacitor within the multi-radius cut 2508. In some implementations, the capacitor includes a number of wires, e.g., to conduct electricity between the AC unit and the capacitor. The smaller straps can also be used to secure wires to the mount, e.g., for wire management. Straps can be used in the openings 2536, 2538, 2540, 2542 in addition or alternatively to a strap used in the slot 2510.

Figure 30:
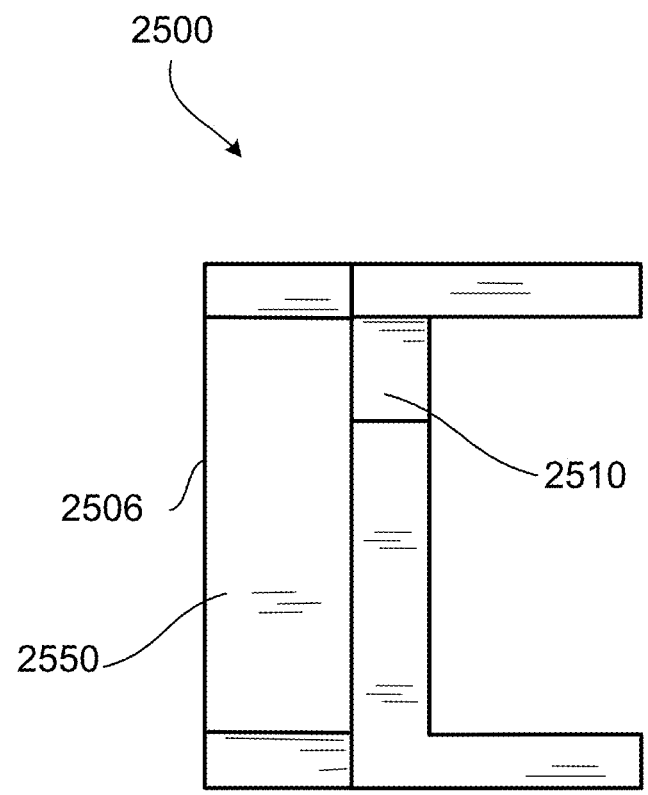
FIG. 30 is a right side view of the mount of FIG. 26.
Figure 31:
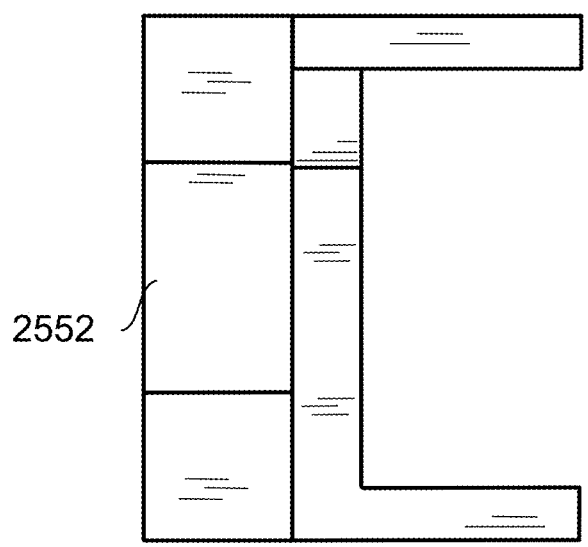
FIG. 31 is a left side view of the mount of FIG. 26.

FIGS. 30 and 31 illustrate a right view and a left view, respectively, of the mount 2500 of FIG. 26. The back side 2506 can have a rubber coating (e.g., butadiene, butyl, silicone, latex, etc.) to increase the friction between the mount 2500 and a surface to which the mount 2500 is mounted. In some implementations, the rubber coating on the back side 2506 can be the same as the rubber coating on the multi-radius cut. In some implementations, the rubber coating on the back side 2506 can be different than the rubber coating on the multi-radius cuts. In some implementations, the back side 2506 may not have rubber coating.

Also illustrated in FIGS. 30 and 31 is the slot 2510 e.g., for straps and cables. As illustrated, the slot 2510 extends completely through the mount 2500. For example, the slot 2510 extends from an open portion, to a closed portion, to an open portion on the other side. The modular connectors 2550, 2552 are on either side of the mount 2500. The modular connectors 2550, 2552 can allow for the mount 2500 to connect to similar mounts (e.g., mounts having similar connectors). The modular connector 2550 is a protrusion, and the modular connector 2552 is a recess configured to accept the modular connector 2550. Multiple mounts 2500 can be connected to each other by inserting the modular connector 2550 into the modular connector 2552.

FIG. 32 illustrates another mount 3000 for a capacitor (e.g., a run capacitor, a start capacitor, etc.). For example, the mount 3000 can be used during installation of the capacitor to stabilize the capacitor and to provide wire management, as described above. The mount 3000 is modular and is formed of multiple mounts (e.g., that are similar to the mount 2500 of FIG. 26) to mount additional capacitors. For example, FIG. 32 illustrates two modular mounts 3100, 3200 that are connected to each other. The mounts 3100, 3200 are each generally a rectangular prism or cuboid, but in some implementations one or more other shapes, e.g., a pyramid, a cylinder, etc. can be employed. In general, the mounts 3100, 3200 have a front side for receiving a capacitor and at least one other surface for mounting (e.g., a surface opposite the capacitor holding surface such as a back surface). The mounts 3100, 3200 can have a variety of dimensions, e.g., to be sized for receiving a capacitor. For example, the mounts 3100, 3200 can each have a height in a range of one inch to ten inches, a width in a range of one inch to ten inches, and a depth in a range of one inch to ten inches. The height, width, and depth can be different from one another; for example, each dimensional length can be different. In some implementations, the height, width, and depth are the same to give the mounts 3100, 3200 a cuboid shape. In some implementations, the mount 3100 can have different dimensions than the mount 3200. In other implementations, the mounts 3100, 3200 have the same dimensions.

The mounts 3100, 3200 can be formed of a variety of materials. For example, the mounts 3100, 3200 can be formed of a rigid material, e.g., a polymer, ceramic, metal, etc. In some implementations, the mounts 3100, 3200 can be formed of a composite of materials, e.g., including polymers, ceramics, metals, etc. In some implementations, the mounts 3100, 3200 can be formed of a combination of materials, e.g., including polymers, ceramics, metals, etc. In some implementations, the mount 3100 can be formed of different materials than the mount 3200. In other implementations, the mounts 3100, 3200 can be formed of the same materials.

The mounts 3100, 3200 can be created through a variety of manufacturing methods. In some implementations, the mounts 3100, 3200 can be created via 3-D printing (e.g., stereolithography). In some implementations, the mounts 3100, 3200 can be created via pre-fabrication. In some implementations, the mount 3100 can be created through different manufacturing methods than the mount 3200. In other implementations, the mounts 3100, 3200 can be created via the same manufacturing methods.

The mount 3100 includes two sides 3102, 3104 which extend from a back side 3106. The mount 3200 includes two sides 3202, 3204 which extend from a back side 3206. Each of the sides 3102, 3104 has a multi-radius cut 3108, 3170 and each of the sides 3202, 3204 has a multi-radius cut 3208, 3270. The multi-radius cuts 3108, 3170, 3208, 3270 can be similar to the multi-radius cuts 108, 170 of FIG. 1. For example, the multi-radius cuts 3108, 3170, 3208, 3270 can be a cutout having a shape (e.g., an arch) that reflects a portion of a circle (e.g., a 90 degree portion of a circle, a 120 degree portion of a circle, a 180 degree portion of a circle, etc.) in the center of the respective sides 3102, 3104, 3202, 3204. In some implementations, the multi-radius cuts can be off-set from the centers of each respective side 3102, 3104, 3202, 3204. The multi-radius cuts 3108, 3170, 3208, 3270 have multiple radii to allow the mounts 3100, 3200 to hold a variety of capacitors securely. For example, the multi-radius cuts can have two radii that reflect the diameter of start and run capacitors, so that start and run capacitors are received by the mount and fit securely and snug within the portion of the multi-radius cut. The multi-radius cuts can include radii that matches, nearly matches, etc. diameters of start and run capacitors. For example, in some implementations, the multi-radius cuts 3108,3170, 3208, 3270 each have two diameters of about 2.5 inches and about 2.16 inches. This can accommodate the cylindrical shaped housing of capacitors (e.g., start capacitors, run capacitors, etc.) such as the AmRad Manufacturing Turbo 200, Turbo200 XL, EasyStart, TES5EXT, etc. that have a diameters in a range of about 1.75 inches to about 2.6 inches. The mounts 3100, 3200 can accommodate a number of the capacitors produced by AmRad Manufacturing. In some implementations, the mount 3100 can accommodate differently sized capacitors than the mount 3200. For example, one mount can be configured to accommodate a variety of run capacitors, while the other mount is configured to accommodate a variety of start capacitors. In other implementations, the mounts 3100, 3200 can be identical. While the multi-radius cuts 3108, 3170, 3208, 3270 are described as having two radii, in some implementations the multi-radius cuts 3108, 3170, 3208, 3270 can include more or fewer radii (e.g., one radius, three radii, four radii, etc.). Also, while the multi-radius cut 3108 in the first side 3102 matches the multi-radius cut 3170 in the second side 3104 in the illustrated example of the mount 3100, in other implementations the multi-radius cut 3108 in the first side 3102 does not match the multi-radius cut 3170 in the second side 3104. For example, the multi-radius cut 3108 in the first side 3102 can have slightly different dimensions than the multi-radius cut 3170 in the second side 3104. Similarly, in some implementations, the multi-radius cut in the first side 3202 of the second mount 3200 does not match the multi-radius cut in the second side 3204 of the second mount 3200. In some implementations, the multi-radius cuts in the first sides 3102, 3202 or in the second sides 3104, 3204 can include features to tip the capacitors (e.g., tip the capacitor outward at the top to allow better access to the top of the capacitors). In some implementations, the mounts include bevels to tip the capacitors. In some implementations, the multi-radius cuts 3108, 3170, 3208, 3270 can be coated with a rubber material (e.g., butadiene, butyl, silicone, latex, etc.) to increase the friction at the intersection of the surfaces 3130, 3230 of the cutouts of the mounts and the surface of the exterior side of the cylindrically shaped capacitors. For example, the rubber coating can prevent a capacitor from sliding out of the multi-radius cuts 3108, 3170, 3208, 3270.

The mounts 3100, 3200 can use straps as a securing mechanism to secure the capacitor to the mounts 3100, 3200. For example, the mounts 3100, 3200 also includes slots 3110, 3210 for straps (not shown) to wrap around the capacitors. The slots can include a channel that has dimensions of about a quarter of an inch in depth and about a half an inch in height. The slot 3110 can extend through the interior of the mount 3100, and the slot 3210 can extend through the interior of the mount 3200. In the illustrated example, the slot 3110 has open channel portions 3132 and a closed channel portion 3134. The slot 3210 has open channel portions 3232 and a closed channel portion 3234. Some designs could have multiple slots to hold multiple straps. For example, some designs can include two, three, or more slots. This can be advantageous because more securing mechanisms make the capacitor more secure within the mounts 3100, 3200. In some implementations, one of the mounts 3100, 3200 can have more or fewer slots than the other mount. While one strap can be inserted into the one of the open channels, extend through the closed channel, and emerge out of the other open channel, multiple straps could also be used. For example, the strap can include, e.g., a hook-and-loop strap, a strap with buckles, a cinch strap, etc. When implemented, the strap (or multiple straps) can secure the capacitor within the multi-radius cuts 3108, 3208.

The mounts 3100, 3200 can be mounted to a surface in a variety of ways. For example, the mounts 3100, 3200 include holes 3114, 3214 for attaching the mount to a surface, e.g., an exterior of an air-conditioning system. The holes 3114, 3214 can allow for a variety of fasteners (not shown) to attach the mount to a surface. In some implementations, the fasteners can include, e.g., wood screws, machine screws, nails, etc. In some implementations, the holes 3114, 3214 can intersect with the respective slots 3110, 3210 (e.g., with the closed portion 3134 of the slot 3110 and with the closed portion 3214 of the slot 3210, respectively) so that the fasteners attach the mounts through straps held in the slots 3110, 3210. In some implementations, the mounts 3100, 3200 can include more or fewer holes (no holes, two holes, three holes, etc.). In some implementations, one of the mounts can include more or fewer holes than the other mount. In some implementations, the mounts 3100, 3200 can be attached to a surface using a strap, cable tie, cable, etc. inserted through the slots 3110, 3210. For example, a strap can be inserted through the slots 3110, 3210 and wrapped around a post, pole, etc. to attach the mounts 3100, 3200 to the post, pole, etc.

The mount 3100 includes modular connectors 3150, 3152 on either side of the mount 3100. The modular connectors 3150, 3152 can allow for the mount 3100 to connect to similar mounts (e.g., mounts having similar connectors). For example, the mount 3200 includes similar modular connectors 3250, 3252 on either side of the mount 3200. The modular connector 3150 is a protrusion, and the modular connector 3252 is a recess that accepts the modular connector 3150 to connect the mount 3100 to the mount 3200. Multiple other mounts can be connected to the mounts 3100 and 3200 other by inserting other modular connectors into the modular connector 3152 or the modular connector 3250. The modular connectors 3150, 3152, 3250, 3252 can have a variety of shapes that allow multiple mounts 3100, 3200 to be connected together (e.g., via an interference fit, snap fit, etc.).

FIG. 33 illustrates a back view of the mounts 3100, 3200. The mounts 3100, 3200 each include two cylindrically shaped magnetic elements 3120, 3122, 3220, 3222 that can be embedded into the mounts 3100, 3200. For example, the magnetic elements 3120, 3122, 3220, 3222 can be flush with the back surface of the mounts 3100, 3200 so that the back surfaces of the mounts 3100, 3200 are flat. The magnetic elements 3120, 3122, 3220, 3222 can assist in mounting of the mounts 3100, 3200 (e.g., to an air conditioning system) such that the surface of the mounts 3100, 3200 magnetically engage the surface of the air conditioning system. For example, the magnetic elements 3120, 3122, 3220, 3222 can be similar to the magnetic elements 120, 122 of the mount 100 described above. In some implementations, one of the mounts can have more or fewer magnetic elements than the other mount.

In some implementations, the back of the mounts 3100, 3200 can include other attachment mechanisms alternatively to the magnetic elements, in addition to the magnetic elements, etc. For example, in some implementations, the back surface of the mounts 3100, 3200 can be coated with a rubber material (e.g., butadiene, butyl, silicone, latex, etc.) to increase the friction between the mounts 3100, 3200 and the mounting surface. For example, the rubber coating can prevent the mounts 3100, 3200 from sliding relative to the surface, e.g., when the mount is magnetically attached. In some implementations, the back surface of the mounts 3100, 3200 can be coated with an adhesive (e.g., double sided tape, glue, glue dots, etc.) to attach the mounts 3100, 3200 to a surface. In some implementations, fasteners can be inserted through the holes 3114, 3214 to attach the mounts 3100, 3200 to a surface and to prevent the mounts 3100, 3200 from sliding relative to the surface.

FIGS. 34 and 35 illustrate a top view of the mounts 3100, 3200 and a bottom view of the mounts 3100, 3200, respectively. FIGS. 34 and 35 illustrate the multi-radius cuts 3108, 3170, 3208, 3270 in greater detail. As illustrated, the multi-radius cuts 3108, 3170, 3208, 3270 are the same in both the top sides 3104, 3204 and the bottom sides 3102, 3104 of the mounts 3100, 3200. However, in some implementations, the multi-radius cuts in the top sides 3104, 3204 can be different than the multi-radius cuts in the bottom sides 3104, 3204, as discussed above. Similarly, in some implementations, the multi-radius cuts in the sides 3102, 3104 of the first mount 3100 can be different than the multi-radius cuts in the sides 3202, 3204 of the second mount 3200, as discussed above. The multi-radius cuts 3108, 3170, 3208, 3270 each have a first radius 3146, 3246 and a second radius 3148, 3248. In some implementations, the multi-radius cuts can have more or fewer radii (e.g., one radius, three radii, four radii, etc.). The multi-radius cuts can include larger or smaller radii within the cuts. In the illustrated implementation, the second radius 3148, 3248 is smaller than the first radius 3146, 3246 of each cut; alternatively, the second radius 3148, 3248 can be larger than the first radius 3146, 3246 of each cut. The second radius 3148, 3248 is also centered in each of the multi-radius cuts 3108, 3170, 3208, 3270 and each of the cuts has a first radius 3146, 3246 on either end of the second radius 3148, 3248. However, in some implementations, the second radius 3148, 3248 of each cut may not be centered in the respective multi-radius cuts 3108, 3170, 3208, 3270. For example, a left half of the cut 3108 can have the first radius 3146 and a second half of the cut 3108 can have the second radius 3148. Similarly, a left half of the cut 3208 can have the first radius 3246 and the second half of the cut 3208 can have the second radius 3248. In some implementations, the radius can be changing throughout the cut. For example, the radius can be variable throughout the cut. For example, the multi-radius cut can include any shape and any number of radii to provide a desired shape that accommodates housings of capacitors.

The first radii 3146, 3246 can have diameters of about 2.5 inches and the second radii 3148, 3248 can have diameters of about 2.16 inches. This can accommodate round capacitors with diameters of about 2 inches to about 2.6 inches. For example, the first radius 3146 can receive capacitors having diameters of about 2.5 inches, and the second radius 3148 can receive capacitors having diameters of about 2.16 inches. Similarly, the first radius 3246 can receive capacitors having diameters of about 2.5 inches, and the second radius 3248 can receive capacitors having diameters of about 2.16 inches. This can allow capacitors with diameters of about 2 inches to about 2.6 inches to be fit snugly into the multi-radius cuts. Having the multi-radius cuts 3170, 3270 in the top sides 3104, 3204 match the multi-radius cuts 3108, 3208 in the bottom sides 3102, 3202 allows the capacitors to be seated equally in each cut 3108, 3170, 3208, 3270. In some implementations, the multi-radius cut in the top sides 3104, 3204 can be different than the multi-radius cuts in the bottom sides 3102, 3202, as discussed above.

The mounts 3100, 3200 can also have a number of openings for different types of securing mechanisms. For example, the mount 3100 also includes openings 3136, 3138, 3140, 3142 for additional straps or cables (not shown), if desired. Similarly, the mount 3200 includes openings 3236, 3238, 3240, 3242 for additional straps or cables. The openings 3136, 3138, 3140, 3142 can be connected by closed channels that extend through the sides 3102, 3104 of the mount 3100. In some implementations, the openings 3136, 3138, 3140, 3142 can be connected by closed channels that extend through the back side 3106 of the mount 3100. The openings 3136, 3138, 3140, 3142 can have different sizes, shapes, etc. In the illustrated embodiment, the dimensions of the openings 3136, 3138, 3140, 3142 are smaller than corresponding dimensions of the slot 3110. For example, the openings can have dimensions of about a tenth of an inch in width and about a quarter of an inch in height. The dimensions can be smaller than the dimensions of the slot to allow for the use of multiple smaller straps (e.g., tie wraps cable ties, strings, etc.). The smaller straps can be used to secure the capacitor within the multi-radius cuts. In some implementations, the capacitor includes a number of wires, e.g., to conduct electricity between the AC unit and the capacitor. The smaller straps can also be used to secure wires to the mount, e.g., for wire management. Straps can be used in the openings 3136, 3138, 3140, 3142 in addition or alternatively to a strap used in the slot 3110.

Similarly, the openings 3236, 3238, 3240, 3242 can be connected by closed channels that extend through the sides 3202, 3204 of the mount 3200. In some implementations, the openings 3236, 3238, 3240, 3242 can be connected by closed channels that extend through the back side 3206 of the mount 3200. The openings 3236, 3238, 3240, 3242 can have different sizes, shapes, etc. In the illustrated embodiment, the dimensions of the openings 3236, 3238, 3240, 3242 are smaller than corresponding dimensions of the slot 3210. For example, the openings can have dimensions of about a tenth of an inch in width and about a quarter of an inch in height. The dimensions can be smaller than the dimensions of the slot to allow for the use of multiple smaller straps (e.g., tie wraps cable ties, strings, etc.). The smaller straps can be used to secure the capacitor within the multi-radius cut 3208. In some implementations, the capacitor includes a number of wires, e.g., to conduct electricity between the AC unit and the capacitor. The smaller straps can also be used to secure wires to the mount, e.g., for wire management. Straps can be used in the openings 3236, 3238, 3240, 3242 in addition or alternatively to a strap used in the slot 3210.

Figure 36:
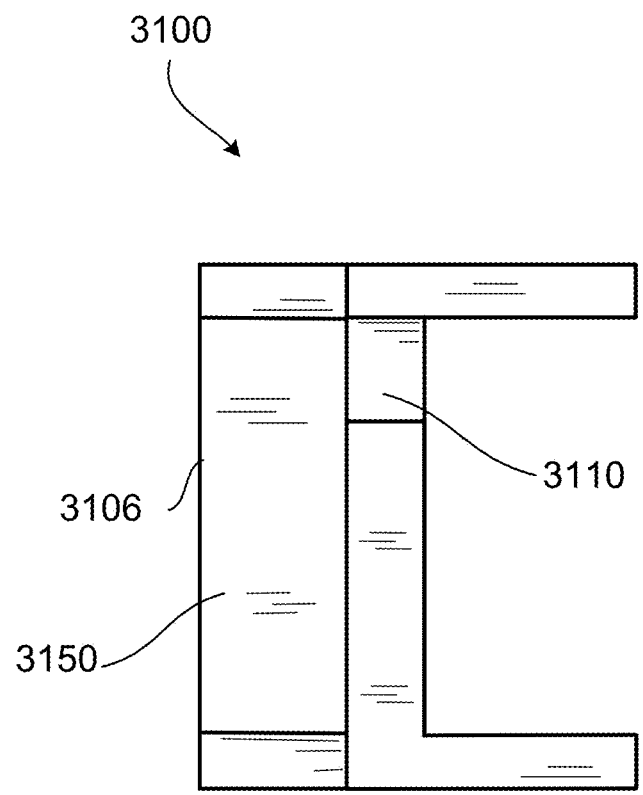
FIG. 36 is a right side view of the mount of FIG. 32.
Figure 37:
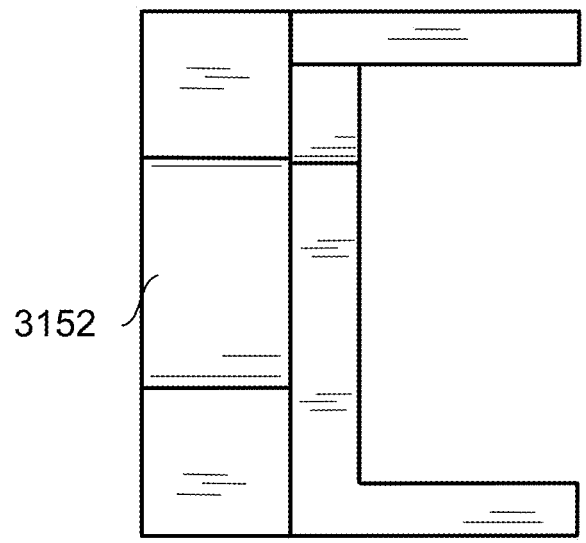
FIG. 37 is a left side view of the mount of FIG. 32.

FIGS. 36 and 37 illustrate a right view and a left view, respectively, of the mounts 3100, 3200. The back sides 3106, 3206 can each have a rubber coating (e.g., butadiene, butyl, silicone, latex, etc.) to increase the friction between the mounts 3100, 3200 and a surface to which the mounts 3100, 3200 are mounted. In some implementations, the rubber coating on the back sides 3106, 3206 can be the same as the rubber coating on the multi-radius cut. In some implementations, the rubber coating on the back side 3106, 3206 can be different than the rubber coating on the multi-radius cut. In some implementations, the back sides 3106, 3206 do not have rubber coating. In some implementations, one of the back sides has rubber coating, and the other back side does not. In some implementations, one of the back sides has a different rubber coating than the other back side. In other implementations, both of the back sides have the same rubber coating.

Also illustrated in FIGS. 36 and 37 are the slots 3110, 3210 e.g., for straps and cables. As illustrated, the slot 3110 extends completely through the mount 3100 and the slot 3210 extends completely through the mount 3200. For example, the slot 3110 extends from an open portion, to a closed portion, to an open portion on the other side. The slot 3210 also extends from an open portion, to a closed portion, to an open portion on the other side. The modular connectors 3150, 3152 are on either side of the mount 3100 and the modular connectors 3250, 3252 are on either side of the mount 3200. The modular connectors 3150, 3152 can allow for the mount 3100 to connect to the modular connectors 3250, 3252 of the mount 3200 and to similar mounts (e.g., mounts having similar connectors).

Figure 38:
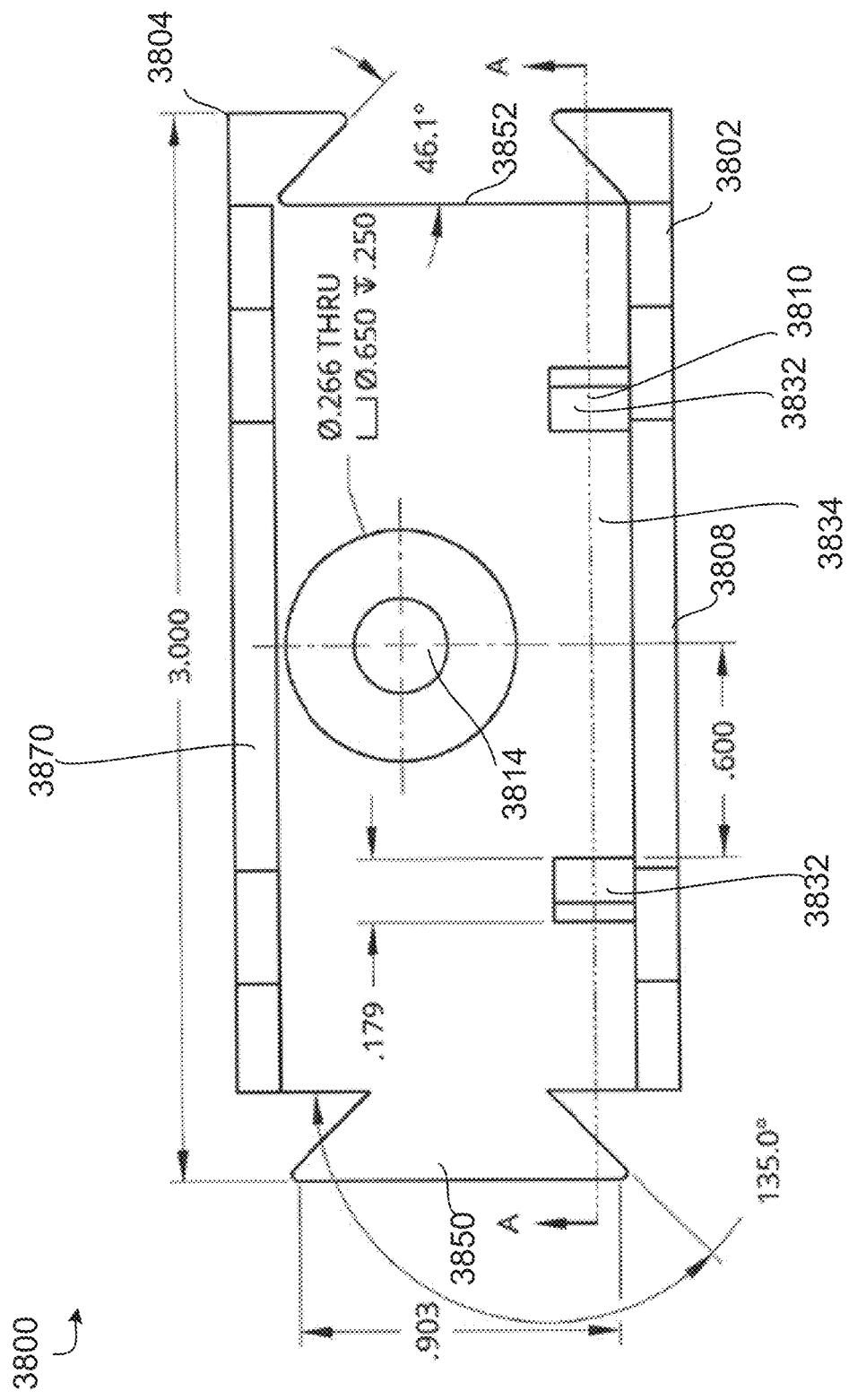
FIG. 38 is front side view of another mount for multiple types of capacitors.
Figure 45:
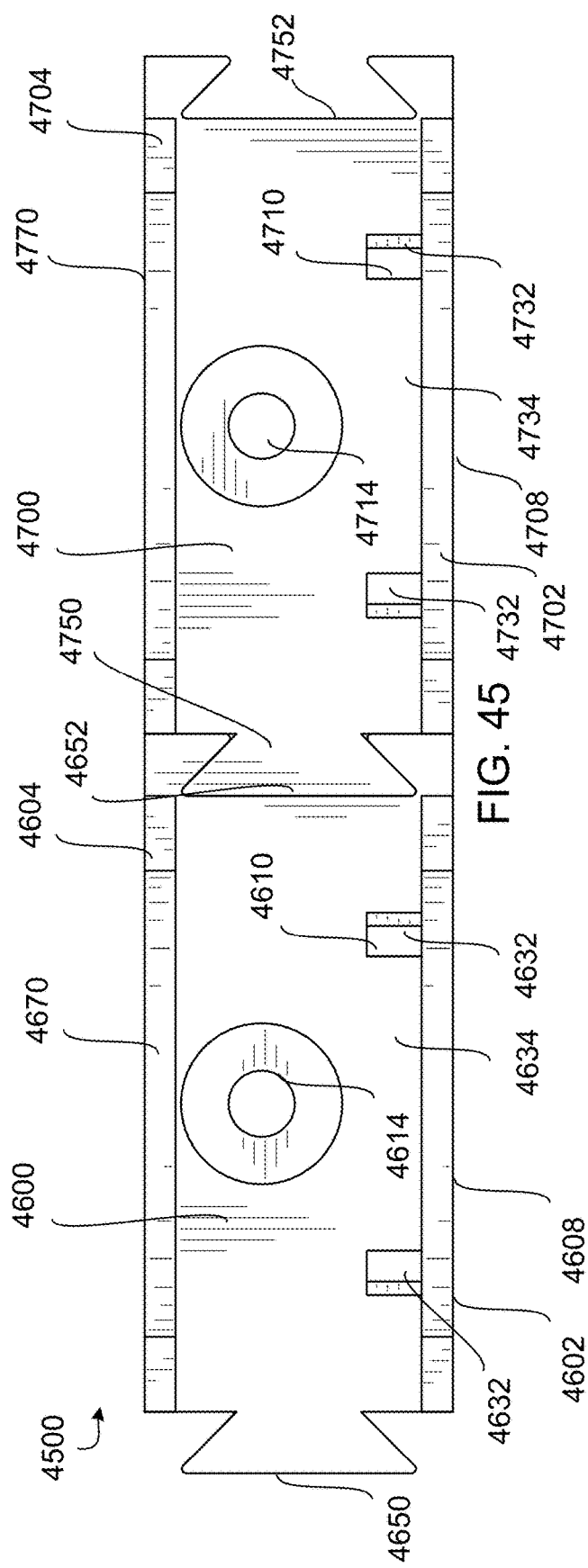
FIG. 45 is a front side view of another mount for multiple types of capacitors.

FIG. 38 illustrates an engineering drawing of another mount 3800 for a capacitor (e.g., a run capacitor, a start capacitor, etc.). For example, the mount 3800 can be used during installation of the capacitor to stabilize the capacitor and to provide wire management, as described above. The mount 3800 is modular and can be connected to other mounts (e.g., that are similar to mount 3800) to mount additional capacitors. For example, FIG. 45 illustrates multiple modular mounts that are connected together. Referring back to FIG. 38, the mount 3800 is generally a rectangular prism or cuboid, but in some implementations one or more other shapes, e.g., a pyramid, a cylinder, etc. can be employed. In general, the mount 3800 has a front side for receiving a capacitor and at least one other surface for mounting (e.g., a surface opposite the capacitor holding surface such as a back surface). The mount 3800 can have a variety of dimensions, e.g., to be sized for receiving a capacitor. For example, the mount 3800 can have a height in a range of one inch to ten inches, a width in a range of one inch to ten inches, and a depth in a range of one inch to ten inches. The height, width, and depth can be different from one another; for example, each dimensional length can be different. In some implementations, the height, width, and depth are the same to give the mount 3800 a cuboid shape.

The mount 3800 can be formed of a variety of materials. For example, the mount 3800 can be formed of a rigid material, e.g., a polymer, ceramic, metal, etc. In some implementations, the mount 3800 can be formed of a composite of materials, e.g., including polymers, ceramics, metals, etc. In some implementations, the mount 3800 can be formed of a combination of materials, e.g., including polymers, ceramics, metals, etc.

The mount 3800 can be created through a variety of manufacturing methods. In some implementations, the mount 3800 can be created via 3-D printing (e.g., stereolithography). In some implementations, the mount 3800 can be created via pre-fabrication. The mount 3800 includes two sides 3802, 3804 which extend from a back side 3806.

Each of the two sides 3802, 3804 has a multi-radius cut 3808, 3270. The multi-radius cuts 3808, 3870 can be similar to the multi-radius cuts 108, 170 of FIG. 1. For example, the multi-radius cuts 3808, 3870 can be cutouts having a shape (e.g., an arch) that reflects a portion of a circle (e.g., a 90 degree portion of a circle, a 120 degree portion of a circle, a 180 degree portion of a circle, etc.) in the center of the respective side 3802, 3804. In some implementations, the multi-radius cuts can be off-set from the centers of each respective side 3802, 3804. The multi-radius cuts 3808, 3870 each have multiple radii to allow the mount 3800 to hold a variety of capacitors securely. For example, each multi-radius cut can have two radii that reflect the diameter of start and run capacitors, so that start and run capacitors are received by the mount and fit securely and snug within the portion of each multi-radius cut. Each multi-radius cut can include radii that matches, nearly matches, etc. diameters of start and run capacitors. For example, in some implementations, each multi-radius cut 3808, 3870 has two diameters of about 2.5 inches and about 2.16 inches. This can accommodate the cylindrical shaped housing of capacitors (e.g., start capacitors, run capacitors, etc.) such as the AmRad Manufacturing Turbo 200, Turbo200 XL, EasyStart, TES5EXT, etc. that have a diameters in a range of about 1.75 inches to about 2.6 inches. The mount 3800 can accommodate a number of the capacitors produced by AmRad Manufacturing. While the multi-radius cut 3808 is described as having two radii, in some implementations each multi-radius cut 3808, 3870 can include more or fewer radii (e.g., one radius, three radii, four radii, etc.). Also, while the multi-radius cut 3808 in the first side 3802 matches the multi-radius cut 3870 in the second side 3804 in the illustrated example, in other implementations the multi-radius cut 3808 in the first side 3802 does not match the multi-radius cut 3870 in the second side 3804. For example, the multi-radius cut in the first side 3802 can have slightly different dimensions than the multi-radius cut in the second side. In some implementations, the multi-radius cut in the first side or in the second side can include features to tip the capacitor (e.g., tip the capacitor outward at the top to allow better access to the top of the capacitor). In some implementations, the mount includes bevels to tip the capacitor. In some implementations, each multi-radius cut 3808, 3870 can be coated with a rubber material (e.g., butadiene, butyl, silicone, latex, etc.) to increase the friction at the intersection of the surface 3830 of the cutouts of the mount and the surface of the exterior side of the cylindrically shaped capacitor. For example, the rubber coating can prevent a capacitor from sliding out of the multi-radius cuts 3808, 3870.

The mount 3800 can use straps as a securing mechanism to secure the capacitor to the mount 3800. For example, the mount 3800 also includes a slot 3810 for a strap (not shown) to wrap around the capacitor. The slot can include a channel that has dimensions of about a quarter of an inch in depth and about a half an inch in height. The slot 3810 can extend through the interior of the mount 3800. In the illustrated example, the slot has open channel portions 3832 and a closed channel portion 3834. Some designs could have multiple slots to hold multiple straps. For example, some designs can include two, three, or more slots. This can be advantageous because more securing mechanisms make the capacitor more secure within the mount 3800. While one strap can be inserted into the one of the open channels, extend through the closed channel, and emerge out of the other open channel, multiple straps could also be used. For example, the strap can include, e.g., a hook-and-loop strap, a strap with buckles, a cinch strap, etc. When implemented, the strap (or multiple straps) can secure the capacitor within the multi-radius cuts 3808, 3870.

The mount 3800 can be mounted to a surface in a variety of ways. For example, the mount 3800 includes a hole 3814 for attaching the mount to a surface, e.g., an exterior of an air-conditioning system. The hole 3814 can allow for a variety of fasteners (not shown) to attach the mount to a surface. In some implementations, the fasteners can include, e.g., wood screws, machine screws, nails, etc. In some implementations, the hole 3814 can intersect with the slot 3810 (e.g., with the closed portion 3834 of the slot 3810) so that the fasteners attach the mount through a strap held in the slot 3810. In some implementations, the mount 3800 can include more or fewer holes (no holes, two holes, three holes, etc.). In some implementations, the mount 3800 can be attached to a surface using a strap, cable tie, cable, etc. inserted through the slot 3810. For example, a strap can be inserted through the slot 3810 and wrapped around a post, pole, etc. to attach the mount 3800 to the post, pole, etc. The hole 3814 is illustrated as beveled, but in some implementations may not be beveled.

The mount 3800 also includes modular connectors 3850, 3852 on either side of the mount 3800. The modular connectors 3850, 3852 can allow for the mount 3800 to connect to similar mounts (e.g., mounts having similar connectors). The modular connector 3850 is a protrusion, and the modular connector 3852 is a recess configured to accept the modular connector 3850. Multiple mounts 3800 can be connected to each other by inserting the modular connector 3850 into the modular connector 3852. The modular connectors 3850, 3852 can have a variety of shapes that allow multiple mounts 3800 to be connected together (e.g., via an interference fit, snap fit, etc.). A single mount 3800 can also be used on its own to mount a capacitor, as discussed above.

Figure 39:
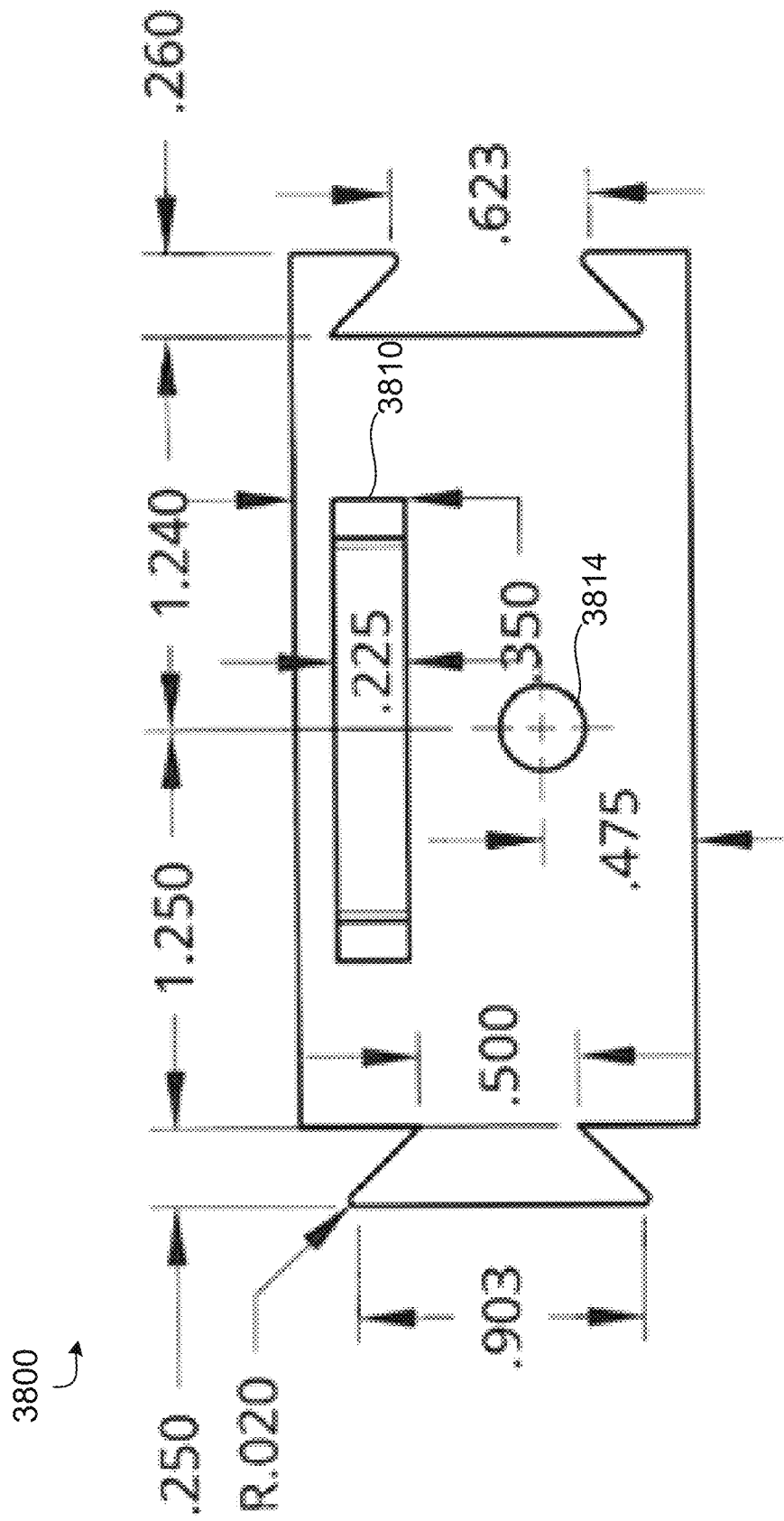
FIG. 39 is a back side view of the mount of FIG. 38.

FIG. 39 illustrates a back view of the mount 3800. In some implementations, the back of the mount 3800 can include magnetic elements, as discussed above. In some implementations, the mount 3800 can include other attachment mechanisms alternatively to the magnetic elements, in addition to the magnetic elements, etc. For example, in some implementations, the back surface of the mount 3800 can be coated with a rubber material (e.g., butadiene, butyl, silicone, latex, etc.) to increase the friction between the mount 3800 and the mounting surface. For example, the rubber coating can prevent the mount 3800 from sliding relative to the surface, e.g., when the mount is magnetically attached. In some implementations, the back surface of the mount 3800 can be coated with an adhesive (e.g., double sided tape, glue, glue dots, etc.) to attach the mount 3800 to a surface. In some implementations, fasteners can be inserted through the hole 3814 to attach the mount 3800 to a surface and to prevent the mount 3800 from sliding relative to the surface.

The slot 3810 has an open portion on the back of the mount 3800. For example, the closed portion 3834 on the front of the mount 3800 can be aligned with the open portion of the slot 3810 on the back of the mount 3800. Providing an accessible portion of the slot 3810 on the back of the mount 3800 can assist a user when feeding a strap through the slot 3810. For example, the user can pull the strap through the back of the mount 3800 while feeding the strap through the closed portion 3834 of the slot 3810.

Figure 40:
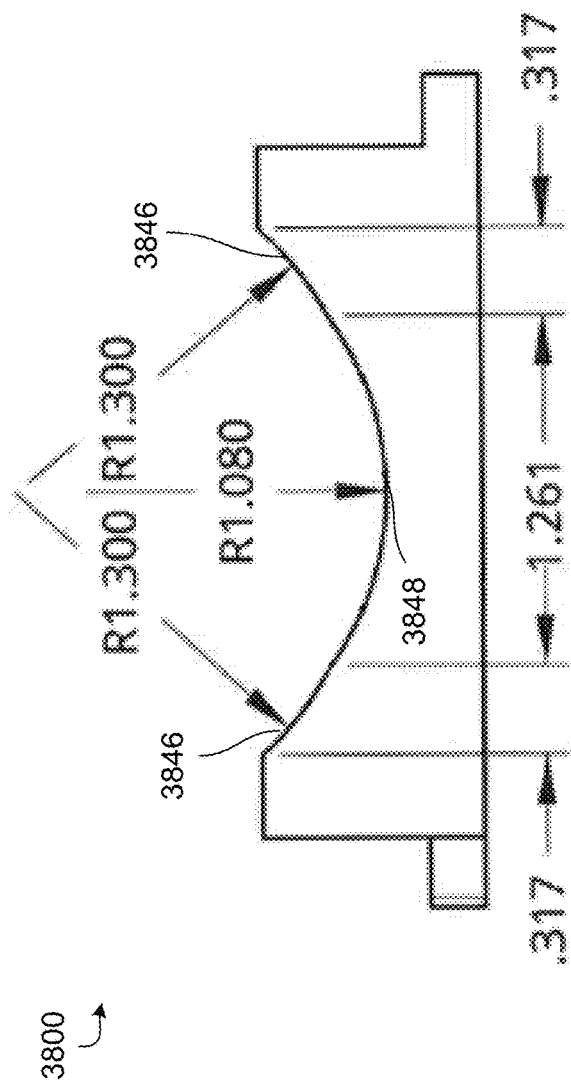
FIG. 40 is a top view of the mount of FIG. 38.

FIG. 40 illustrates a top view of the mount 3800 of FIG. 38. In the illustrated embodiment, the multi-radius cutout 3870 in the bottom side 3804 of the mount 3800 matches the multi-radius cutout 3808 in the top side 3802 of the mount 3800. However, in some implementations, the multi-radius cut in the top side 3804 can be different than the multi-radius cut in the bottom side 3802, as discussed above. The illustrated multi-radius cut 3808 has a first radius 3846 and a second radius 3848. In some implementations, the multi-radius cut can have more or fewer radii (e.g., one radius, three radii, four radii, etc.). The multi-radius cut can include larger or smaller radii within the cut. In the illustrated implementation, the second radius 3848 is smaller than the first radius 3846; alternatively, the second radius 3848 can be larger than the first radius 3846. The second radius 3848 is also centered in the multi-radius cut 3808 and the cut has a first radius 3846 on either end of the second radius 3848. However, in some implementations, the second radius 3848 may not be centered in the multi-radius cut 3808. For example, a left half of the cut 3808 can have the first radius 3846 and a second half of the cut 3808 can have the second radius 3848. In some implementations, the radius can be changing throughout the cut. For example, the radius can be variable throughout the cut. For example, the multi-radius cut can include any shape and any number of radii to provide a desired shape that accommodates housings of capacitors.

The first and second radius 3846, 3848 can have diameters of about 2.5 inches and about 2.16 inches, respectfully. This can accommodate round capacitors with diameters of about 2 inches to about 2.6 inches. For example, the first radius 3846 can receive capacitors having diameters of about 2.5 inches, and the second radius 3848 can receive capacitors having diameters of about 2.16 inches. This can allow capacitors with diameters of about 2 inches to about 2.6 inches to be fit snugly into the multi-radius cut. Having the same multi-radius cut 3808 in the top side 3804 and the bottom side 3802 allows the capacitor to be seated equally in each cut 3808. In some implementations, the multi-radius cut in the top side 3804 can be different than the multi-radius cut in the bottom side 3802, as discussed above.

Figure 41:
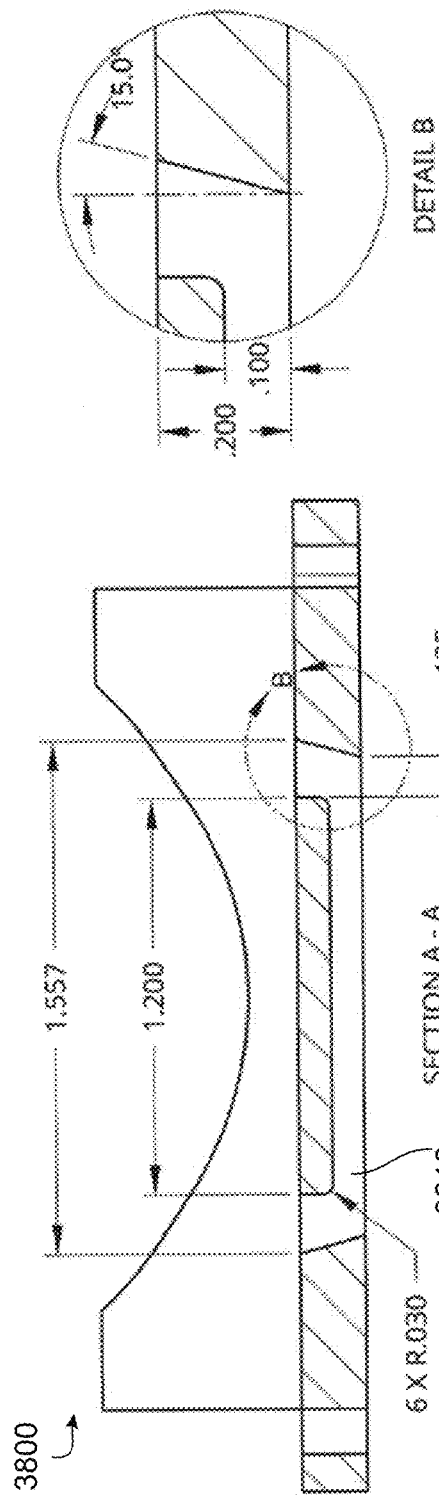
FIG. 41 is cross-section of the mount of FIG. 38.

FIG. 41 illustrates a cross-section of the mount 3800 along the axis A-A illustrated in FIG. 38. The cross-section illustrates the slot 3810 in greater detail. The slot 3810 is accessible from the front of the mount from open portions 3832, as discussed above. The slot 3810 is also accessible from the back of the mount, as discussed above. This can be advantageous, e.g., to assist a user in feeding a strap through the slot 3810 because every portion of the slot 3810 is accessible from either the front or the back of the mount 3800. The edges of the slot 3810 can be tapered, e.g., to assist the user when feeding the strap through the slot 3810. In some implementations, the edges of the slot 3810 are not tapered.

FIGS. 42 and 43 illustrate a right view and a left view, respectively, of the mount 3800 of FIG. 38. The back side 3806 can have a rubber coating (e.g., butadiene, butyl, silicone, latex, etc.) to increase the friction between the mount 3800 and a surface to which the mount 3800 is mounted. In some implementations, the rubber coating on the back side 3806 can be the same as the rubber coating on the multi-radius cut. In some implementations, the rubber coating on the back side 3806 can be different than the rubber coating on the multi-radius cut. In some implementations, the back side 3806 may not have rubber coating. The protrusion 3850 extends from one side of the mount 3800 and the recess 3852 is provided on the other side of the mount 3800. In some implementations, the protrusion 3850 is provided on the right side of the mount 3800, and the recess 3852 is provided on the left side of the mount 3800. In other implementations, the opposite is true.

Figure 44:
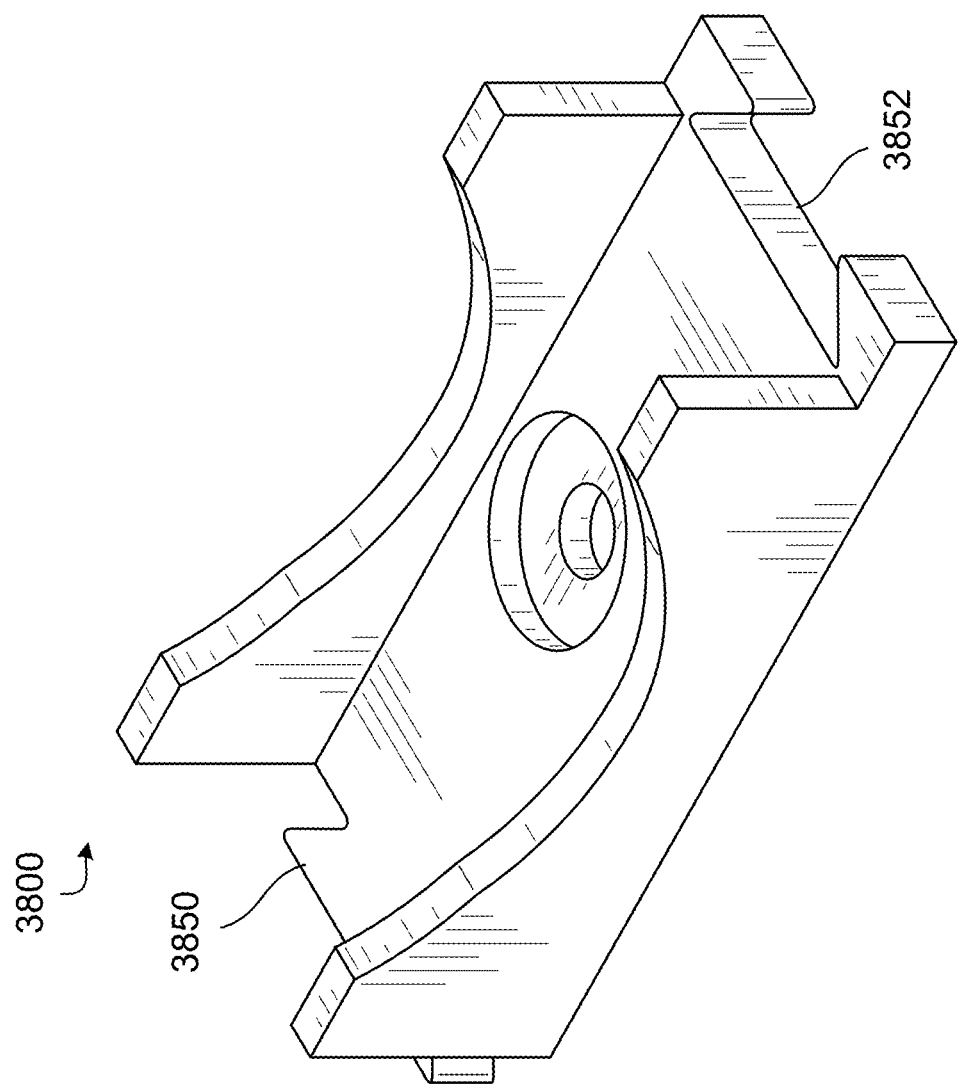
FIG. 44 is a perspective view of the mount of FIG. 38.

FIG. 44 illustrates a perspective view of the mount 3800. The modular connectors 3850, 3852 are on either side of the mount 3800 and can allow for the mount 3800 to connect to similar mounts (e.g., mounts having similar connectors).

FIG. 45 illustrates another mount 4500 for a capacitor (e.g., a run capacitor, a start capacitor, etc.). For example, the mount 4500 can be used during installation of the capacitor to stabilize the capacitor and to provide wire management, as described above. The mount 4500 is modular and is formed of multiple mounts (e.g., that are similar to the mount 3800 of FIG. 38) to mount additional capacitors. For example, FIG. 45 illustrates two modular mounts 4600, 4700 that are connected to each other. The mounts 4600, 4700 are each generally a rectangular prism or cuboid, but in some implementations one or more other shapes, e.g., a pyramid, a cylinder, etc. can be employed. In general, the mounts 4600, 4700 have a front side for receiving a capacitor and at least one other surface for mounting (e.g., a surface opposite the capacitor holding surface such as a back surface). The mounts 4600, 4700 can have a variety of dimensions, e.g., to be sized for receiving a capacitor. For example, the mounts 4600, 4700 can each have a height in a range of one inch to ten inches, a width in a range of one inch to ten inches, and a depth in a range of one inch to ten inches. The height, width, and depth can be different from one another; for example, each dimensional length can be different. In some implementations, the height, width, and depth are the same to give the mounts 4600, 4700 a cuboid shape. In some implementations, the mount 4600 can have different dimensions than the mount 4700. In other implementations, the mounts 4600, 4700 have the same dimensions.

The mounts 4600, 4700 can be formed of a variety of materials. For example, the mounts 4600, 4700 can be formed of a rigid material, e.g., a polymer, ceramic, metal, etc. In some implementations, the mounts 4600, 4700 can be formed of a composite of materials, e.g., including polymers, ceramics, metals, etc. In some implementations, the mounts 4600, 4700 can be formed of a combination of materials, e.g., including polymers, ceramics, metals, etc. In some implementations, the mount 4600 can be formed of different materials than the mount 4700. In other implementations, the mounts 4600, 4700 can be formed of the same materials.

The mounts 4600, 4700 can be created through a variety of manufacturing methods. In some implementations, the mounts 4600, 4700 can be created via 3-D printing (e.g., stereolithography). In some implementations, the mounts 4600, 4700 can be created via pre-fabrication. In some implementations, the mount 4600 can be created through different manufacturing methods than the mount 4700. In other implementations, the mounts 4600, 4700 can be created via the same manufacturing methods.

The mount 4600 includes two sides 4602, 4604 which extend from a back side 4606. The mount 4700 includes two sides 4702, 4704 which extend from a back side 4706. Each of the sides 4602, 4604 has a multi-radius cut 4608, 4670 and each of the sides 4702, 4704 has a multi-radius cut 4708, 4770. The multi-radius cuts 4608, 4670, 4708, 4770 can be similar to the multi-radius cuts 108, 170 of FIG. 1. For example, the multi-radius cuts 4608, 4670, 4708, 4770 can be a cutout having a shape (e.g., an arch) that reflects a portion of a circle (e.g., a 90 degree portion of a circle, a 120 degree portion of a circle, a 180 degree portion of a circle, etc.) in the center of the respective sides 4602, 4604, 4702, 4704. In some implementations, the multi-radius cuts can be off-set from the centers of each respective side 4602, 4604, 4702, 4704. The multi-radius cuts 4608, 4670, 4708, 4770 have multiple radii to allow the mounts 4600, 4700 to hold a variety of capacitors securely. For example, the multi-radius cuts can have two radii that reflect the diameter of start and run capacitors, so that start and run capacitors are received by the mount and fit securely and snug within the portion of the multi-radius cut. The multi-radius cuts can include radii that matches, nearly matches, etc. diameters of start and run capacitors. For example, in some implementations, the multi-radius cuts 4608, 4670, 4708, 4770 each have two diameters of about 2.5 inches and about 2.16 inches. This can accommodate the cylindrical shaped housing of capacitors (e.g., start capacitors, run capacitors, etc.) such as the AmRad Manufacturing Turbo 200, Turbo200 XL, EasyStart, TES5EXT, etc. that have a diameters in a range of about 1.75 inches to about 2.6 inches. The mounts 4600, 4700 can accommodate a number of the capacitors produced by AmRad Manufacturing. In some implementations, the mount 4600 can accommodate differently sized capacitors than the mount 4700. For example, one mount can be configured to accommodate a variety of run capacitors, while the other mount is configured to accommodate a variety of start capacitors. In other implementations, the mounts 4600, 4700 can be identical. While the multi-radius cuts 4608, 4670, 4708, 4770 are described as having two radii, in some implementations the multi-radius cuts 4608, 4670, 4708, 4770 can include more or fewer radii (e.g., one radius, three radii, four radii, etc.). Also, while the multi-radius cut 4608 in the first side 4602 matches the multi-radius cut 4670 in the second side 4604 in the illustrated example of the mount 4600, in other implementations the multi-radius cut 4608 in the first side 4602 does not match the multi-radius cut 4670 in the second side 4604. For example, the multi-radius cut 4608 in the first side 4602 can have slightly different dimensions than the multi-radius cut 4670 in the second side 4604. Similarly, in some implementations, the multi-radius cut in the first side 4702 of the second mount 4700 does not match the multi-radius cut in the second side 4704 of the second mount 4700. In some implementations, the multi-radius cuts in the first sides 4602, 4702 or in the second sides 4604, 4704 can include features to tip the capacitors (e.g., tip the capacitor outward at the top to allow better access to the top of the capacitors). In some implementations, the mounts include bevels to tip the capacitors. In some implementations, the multi-radius cuts 4608, 4670, 4708, 4770 can be coated with a rubber material (e.g., butadiene, butyl, silicone, latex, etc.) to increase the friction at the intersection of the surfaces 4630, 4730 of the cutouts of the mounts and the surface of the exterior side of the cylindrically shaped capacitors. For example, the rubber coating can prevent a capacitor from sliding out of the multi-radius cuts 4608, 4670, 4708, 4770.

The mounts 4600, 4700 can use straps as a securing mechanism to secure the capacitor to the mounts 4600, 4700. For example, the mounts 4600, 4700 also includes slots 4610, 4710 for straps (not shown) to wrap around the capacitors. The slots can include a channel that has dimensions of about a quarter of an inch in depth and about a half an inch in height. The slot 4610 can extend through the interior of the mount 4600, and the slot 4710 can extend through the interior of the mount 4700. In the illustrated example, the slot 4610 has open channel portions 4632 and a closed channel portion 4634. The slot 4710 has open channel portions 4732 and a closed channel portion 4734. Some designs could have multiple slots to hold multiple straps. For example, some designs can include two, three, or more slots. This can be advantageous because more securing mechanisms make the capacitor more secure within the mounts 4600, 4700. In some implementations, one of the mounts 4600, 4700 can have more or fewer slots than the other mount. While one strap can be inserted into the one of the open channels, extend through the closed channel, and emerge out of the other open channel, multiple straps could also be used. For example, the strap can include, e.g., a hook-and-loop strap, a strap with buckles, a cinch strap, etc. When implemented, the strap (or multiple straps) can secure the capacitor within the multi-radius cuts 4608, 4708.

The mounts 4600, 4700 can be mounted to a surface in a variety of ways. For example, the mounts 3600, 4700 include holes 4614, 4714 for attaching the mount to a surface, e.g., an exterior of an air-conditioning system. The holes 4614, 4714 can allow for a variety of fasteners (not shown) to attach the mount to a surface. In some implementations, the fasteners can include, e.g., wood screws, machine screws, nails, etc. In some implementations, the holes 4614, 4714 can intersect with the respective slots 4610, 4710 (e.g., with the closed portion 4634 of the slot 4610 and with the closed portion 4714 of the slot 4710, respectively) so that the fasteners attach the mounts through straps held in the slots 4610, 4710. In some implementations, the mounts 4600, 4700 can include more or fewer holes (no holes, two holes, three holes, etc.). In some implementations, one of the mounts can include more or fewer holes than the other mount. In some implementations, the mounts 4600, 4700 can be attached to a surface using a strap, cable tie, cable, etc. inserted through the slots 4610, 4710. For example, a strap can be inserted through the slots 4610, 4710 and wrapped around a post, pole, etc. to attach the mounts 4600, 4700 to the post, pole, etc.

The mount 4600 includes modular connectors 4650, 4652 on either side of the mount 4600. The modular connectors 4650, 4652 can allow for the mount 4600 to connect to similar mounts (e.g., mounts having similar connectors). For example, the mount 4700 includes similar modular connectors 4750, 4752 on either side of the mount 4700. The modular connector 4650 is a protrusion, and the modular connector 4752 is a recess that accepts the modular connector 4650 to connect the mount 4600 to the mount 4700. Multiple other mounts can be connected to the mounts 4600 and 4700 other by inserting other modular connectors into the modular connector 4652 or the modular connector 4750. The modular connectors 4650, 4652, 4750, 4752 can have a variety of shapes that allow multiple mounts 4600, 4700 to be connected together (e.g., via an interference fit, snap fit, etc.).

Figure 46:
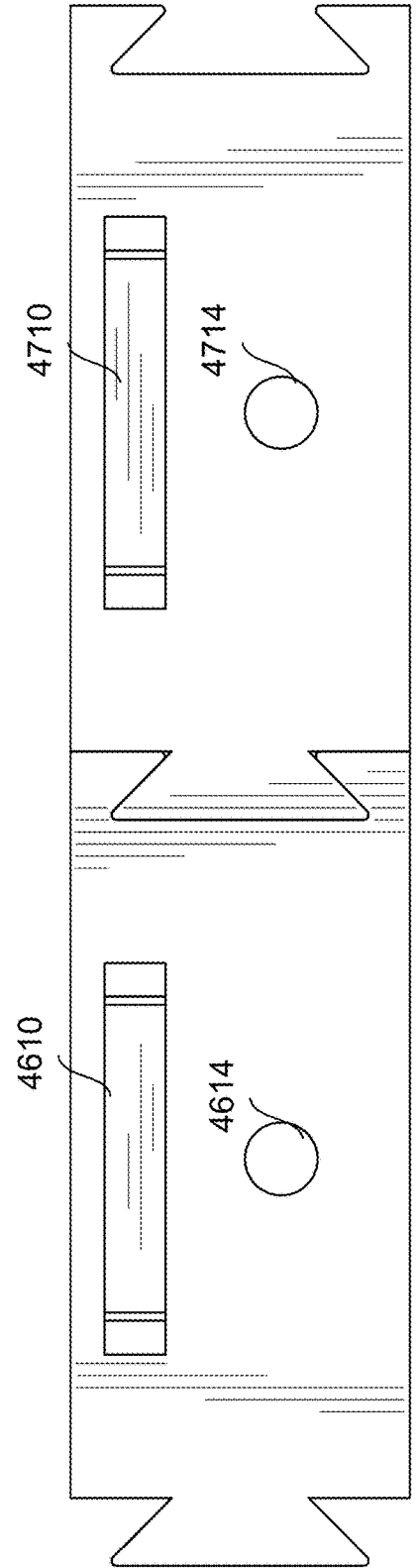
FIG. 46 is a back side view of the mount of FIG. 45.

FIG. 46 illustrates a back view of the mounts 4600, 4700. In some implementations, fasteners can be inserted through the holes 4614, 4714 to attach the mounts 4600, 4700 to a surface and to prevent the mounts 4600, 4700 from sliding relative to the surface. In some implementations, the back surface of the mounts 4600, 4700 can be coated with a rubber material (e.g., butadiene, butyl, silicone, latex, etc.) to increase the friction between the mounts 4600, 4700 and the mounting surface. For example, the rubber coating can prevent the mounts 4600, 4700 from sliding relative to the surface, e.g., when the mount is attached via fasteners in the holes 4614, 4714. In some implementations, the back surface of the mounts 4600, 4700 can be coated with an adhesive (e.g., double sided tape, glue, glue dots, etc.) to attach the mounts 4600, 4700 to a surface. In some implementations, the back surface of one of the mounts 4600, 4700 can be coated with an adhesive (e.g., double sided tape, glue, glue dots, etc.), and the back surface of the other one of the mounts 4600, 4700 does not have adhesive. In some implementations, one piece of adhesive (e.g., double sided tape, glue, glue dots, etc.) can be placed across both of the mounts 4600, 4700.

Figure 47:
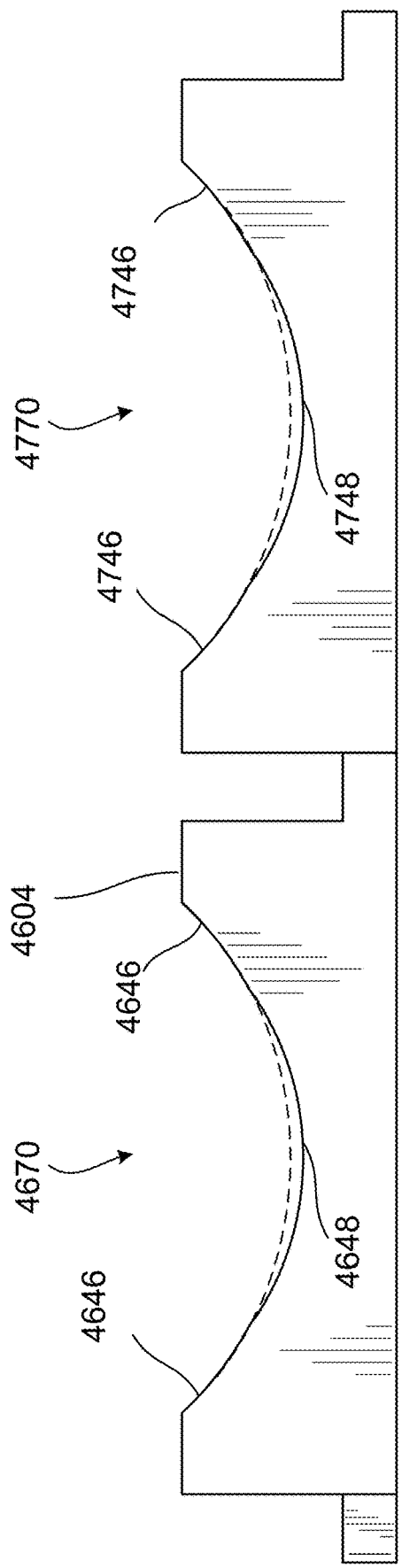
FIG. 47 is a top view of the mount of FIG. 45.
Figure 48:
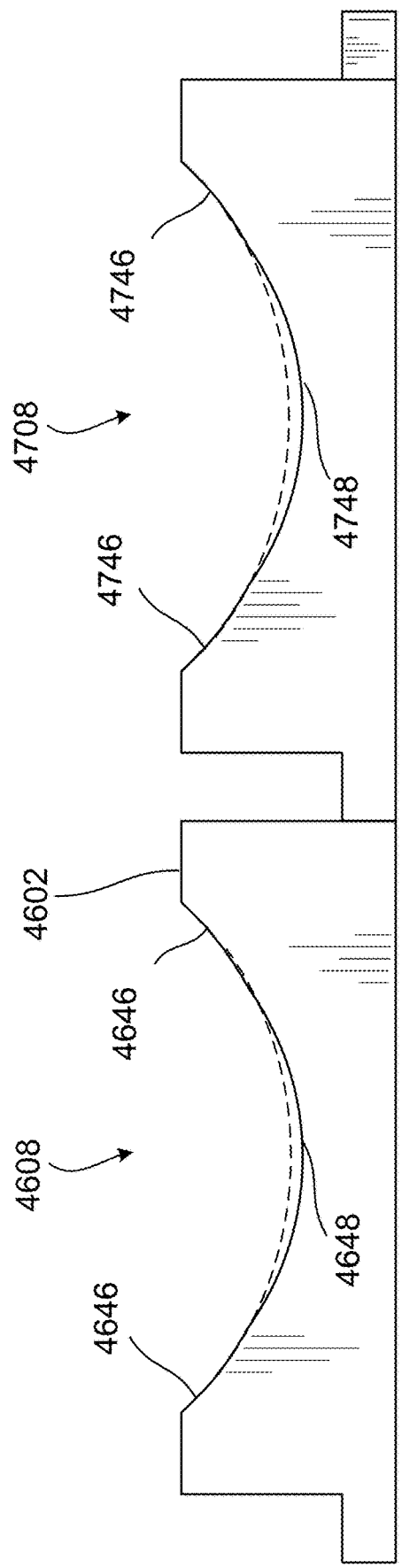
FIG. 48 is a bottom view of the mount of FIG. 45.

FIGS. 47 and 48 illustrate a top view of the mounts 4600, 4700 and a bottom view of the mounts 4600, 4700, respectively. FIGS. 47 and 48 illustrate the multi-radius cuts 4608, 4670, 4708, 4770 in greater detail. As illustrated, the multi-radius cuts 4608, 4670, 4708, 4770 are the same in both the top sides 4604, 4704 and the bottom sides 4602, 4604 of the mounts 4600, 4700. However, in some implementations, the multi-radius cuts in the top sides 4604, 4704 can be different than the multi-radius cuts in the bottom sides 4604, 4704, as discussed above. Similarly, in some implementations, the multi-radius cuts in the sides 4602, 4604 of the first mount 4600 can be different than the multi-radius cuts in the sides 4702, 4704 of the second mount 4700, as discussed above. The multi-radius cuts 4608, 4670, 4708, 4770 each have a first radius 4646, 4746 and a second radius 4648, 4748. In some implementations, the multi-radius cuts can have more or fewer radii (e.g., one radius, three radii, four radii, etc.). The multi-radius cuts can include larger or smaller radii within the cuts. In the illustrated implementation, the second radius 4648, 4748 is smaller than the first radius 4646, 4746 of each cut; alternatively, the second radius 4648, 4748 can be larger than the first radius 4646, 4746 of each cut. The second radius 4648, 4748 is also centered in each of the multi-radius cuts 4608, 4670, 4708, 4770 and each of the cuts has a first radius 4646, 4746 on either end of the second radius 4648, 4748. However, in some implementations, the second radius 4648, 4748 of each cut may not be centered in the respective multi-radius cuts 4608, 4670, 4708, 4770. For example, a left half of the cut 4608 can have the first radius 4646 and a second half of the cut 4608 can have the second radius 4648. Similarly, a left half of the cut 4708 can have the first radius 4746 and the second half of the cut 4708 can have the second radius 4748. In some implementations, the radius can be changing throughout the cut. For example, the radius can be variable throughout the cut. For example, the multi-radius cut can include any shape and any number of radii to provide a desired shape that accommodates housings of capacitors.

The first radii 4646, 4746 can have diameters of about 2.5 inches and the second radii 4648, 4748 can have diameters of about 2.16 inches. This can accommodate round capacitors with diameters of about 2 inches to about 2.6 inches. For example, the first radius 4646 can receive capacitors having diameters of about 2.5 inches, and the second radius 4648 can receive capacitors having diameters of about 2.16 inches. Similarly, the first radius 4746 can receive capacitors having diameters of about 2.5 inches, and the second radius 4748 can receive capacitors having diameters of about 2.16 inches. This can allow capacitors with diameters of about 2 inches to about 2.6 inches to be fit snugly into the multi-radius cuts. Having the multi-radius cuts 4670, 4770 in the top sides 4604, 4704 match the multi-radius cuts 4608, 4708 in the bottom sides 4602, 4702 allows the capacitors to be seated equally in each cut 4608, 4670, 4708, 4770. In some implementations, the multi-radius cut in the top sides 4604, 4704 can be different than the multi-radius cuts in the bottom sides 4602, 4702, as discussed above.

Figure 50:
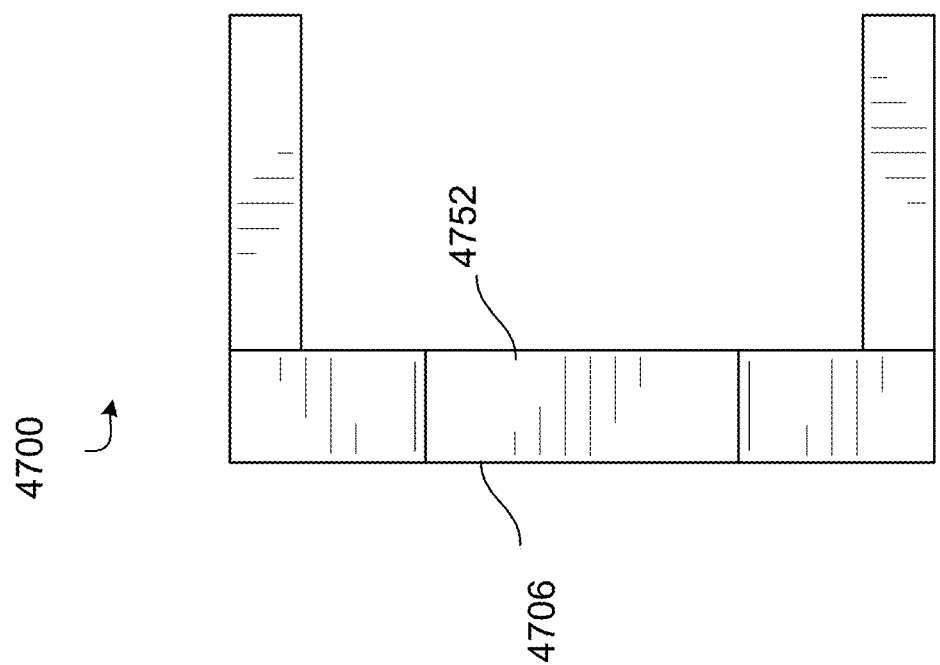
FIG. 50 is a left side view of the mount of FIG. 45.
Figure 49:
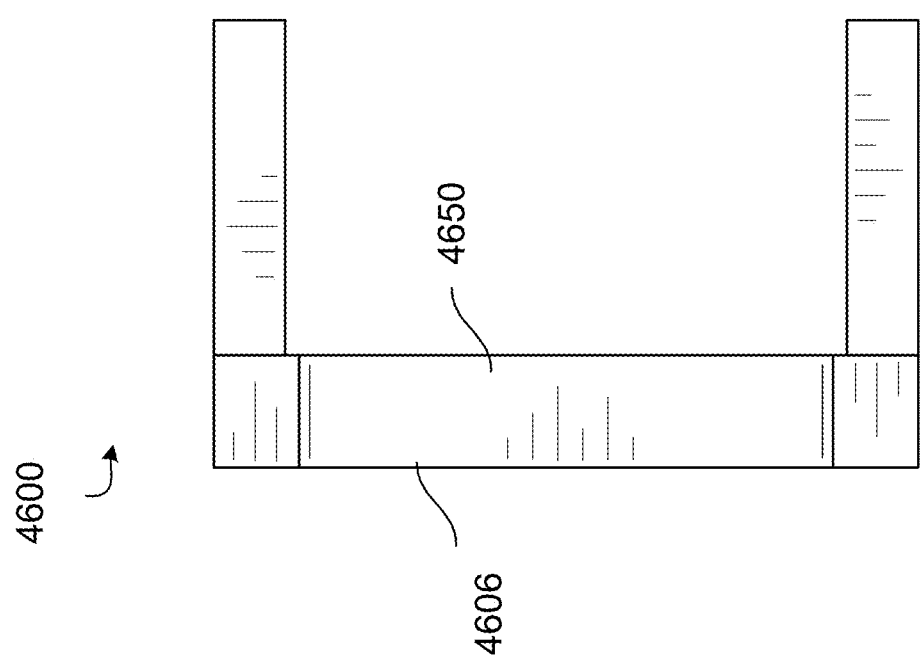
FIG. 49 is a right side view of the mount of FIG. 45.

FIGS. 49 and 50 illustrate a right view and a left view, respectively, of the mounts 4600, 4700. The back sides 4606, 4706 can each have a rubber coating (e.g., butadiene, butyl, silicone, latex, etc.) to increase the friction between the mounts 4600, 4700 and a surface to which the mounts 4600, 4700 are mounted. In some implementations, the rubber coating on the back sides 4606, 4706 can be the same as the rubber coating on the multi-radius cut. In some implementations, the rubber coating on the back side 4606, 4706 can be different than the rubber coating on the multi-radius cut. In some implementations, the back sides 4606, 4706 do not have rubber coating. In some implementations, one of the back sides has rubber coating, and the other back side does not. In some implementations, one of the back sides has a different rubber coating than the other back side. In other implementations, both of the back sides have the same rubber coating.

Figure 51:
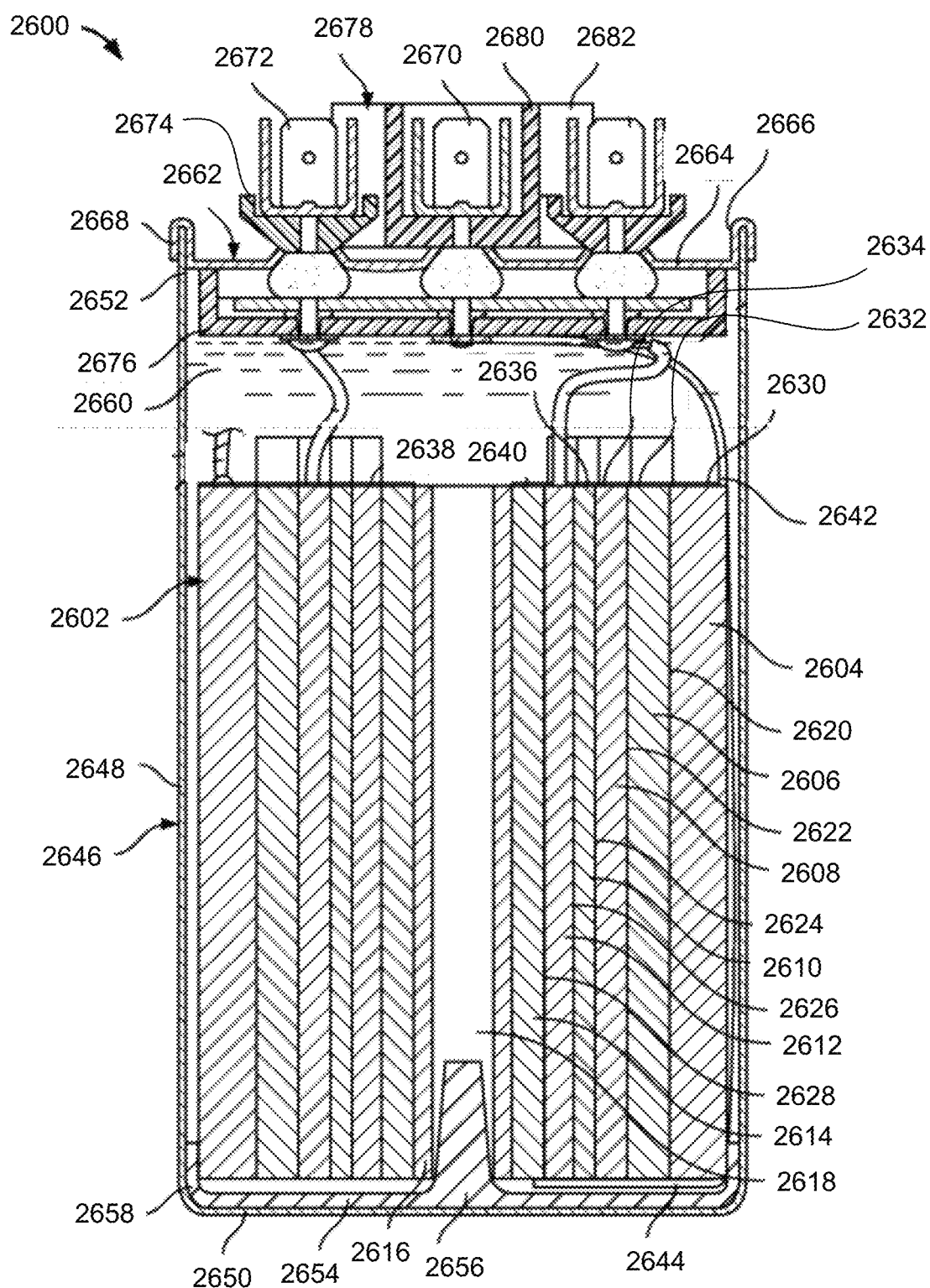
FIG. 51 is a cross sectional view of an exemplary run capacitor.

The mounts described above can be used to hold a variety of capacitors (e.g., start capacitors, run capacitors, etc.). Suitable run capacitors are described in prior U.S. Pat. No. 7,203,053, which is incorporated herein by reference in its entirety. FIG. 51 illustrates an exemplary run capacitor 2600. The run capacitor 2600 has a capacitive element 2602 having a plurality of capacitor sections, each having a capacitance value. In the preferred embodiment described herein, the capacitive element 2602 has six capacitor sections 2604, 2606, 2608, 2610, 2612, 2614. The capacitive element 2602 is a wound cylindrical element manufactured by extension of the techniques described in U.S. Pat. Nos. 3,921,041, 4,028,595, 4,352,145 and 5,313,360, each of which is incorporated herein by reference in its entirety. Those patents relate to capacitive elements having two capacitor sections rather than a larger plurality of capacitor sections, such as the six capacitor sections 2604, 2606, 2608, 2610, 2612, 2614 of the capacitive element 2602. Accordingly, the capacitive element 2602 has a central spool, mandrel, etc. 2616, which has a central opening 2618. First and second dielectric films, each having a metalized layer on one side thereof, are wound in cylindrical form on the mandrel 2616 with the non-metalized side of one film being in contact with the metalized side of the other. Selected portions of one or both of the metalized layers are removed in order to provide a multiple section capacitive element. Element insulation barriers are inserted into the winding to separate the capacitor sections, the element insulation barriers also assuming a cylindrical configuration. Five element insulation barriers 2620, 2622, 2624, 2626, 2628 are provided to separate the six capacitor sections 2604, 2606, 2608, 2610, 2612, 2614, with element insulation barrier 2620 separating capacitor sections 2604 and 2606, element insulation barrier 2622 separating capacitor sections 2606 and 2608, element insulation barrier 2624 separating capacitor sections 2608 and 2610, element insulation barrier 2626 separating capacitor sections 2610 and 2612, and element insulation barrier 2628 separating capacitor sections 2612 and 2614.

The element insulation barriers are insulating polymer sheet material, which in the capacitive element 2602 is polypropylene having a thickness of 0.005 inches, wound into the capacitive element 2602. Thickness of 0.0025 to 0.007 may be used. Other materials may also be used. The barriers each have about 2¾-4 wraps of the polypropylene sheet material, wherein the element insulation barriers have a thickness of about 0.013 to 0.020 inches. The barriers 2620, 2622, 2624, 2626, 2628 are thicker than used before in capacitors with fewer capacitor sections. The important characteristic of the barriers 2620, 2622, 2624, 2626, 2628 is that they are able to withstand heat from adjacent soldering without losing integrity of electrical insulation, such that adjacent sections can become bridged.

The metalized films each have one unmetalized marginal edge, such that the metalized marginal edge of one film is exposed at one end of the wound capacitive element 2602 and the metalized marginal edge of the other film is exposed at the other end of the capacitive element 2602. At the lower end of the capacitance element 2602, the barriers 2620, 2622, 2624, 2626, 2628 do not extend from the film, and an element common terminal is established contacting the exposed metalized marginal edges of one metalized film of all the capacitor sections 2604, 2606, 2608, 2610, 2612, 2614. The element common terminal is preferably a zinc spray applied onto the end of the capacitive element 2602.

At the top end of the capacitive element 2602, the element insulation barriers 2620, 2622, 2624, 2626, 2628 extend above the wound metalized film. An individual capacitor element section terminal is provided for each of the capacitive sections 2604, 2606, 2608, 2610, 2612, 2614, also by applying a metallic spray (e.g., a zinc spray) onto the end of the capacitive element 2602 with the zinc being deployed on each of the capacitor sections 2604, 2606, 2608, 2610, 2612, 2614 between and adjacent the element insulation barriers 2620, 2622, 2624, 2626, 2628. The element section terminals are identified by numerals 2630, 2632, 2634, 2636, 2638, 2640. Element section terminal 2630 of capacitor section 2604 extends from the outer-most element insulation barrier 2620 to the outer surface of the capacitive element 2602, and the element section terminal 2640 of capacitor section 2614 extends from the inner-most element insulation barrier 2628 to the central mandrel 2616. Element section terminals 2632, 2634, 2636, 2638, 2640 are respectively deployed on the capacitor sections 2606, 2608, 2610, 2612, 2614.

Conductors preferably in the form of six insulated wires each have one of their ends respectively soldered to the element section terminals 2630, 2632, 2634, 2636, 2638, 2640. The thickness of the polypropylene barriers 2620, 2622, 2624, 2626, 2628 resists any burn-through as a result of the soldering to connect wires to the terminals 2630, 2632, 2634, 2636, 2638, 2640.

The insulation of the wires may be color coded to facilitate identifying which wire is connected to which capacitor section. The wire connected to element section terminal 2640 of capacitor section 2604 has blue insulation, the wire connected to element section terminal 2632 of capacitor section 2606 has yellow insulation, the wire connected to element section terminal 2634 of capacitor section 2608 has red insulation, the wire connected to element section terminal 2636 of capacitor section 2610 has white insulation, the wire connection to element section terminal 2638 of capacitor section 2612 has white insulation, and the wire connected to element section terminal 2640 of capacitor section 2614 has green insulation.

The capacitive element 2602 is further provided with foil strip conductor 2642, having one end attached to the element common terminal at 2644. The foil strip conductor 2642 is coated with insulation, except for the point of attachment 2644 and the distal end thereof. The conductor connected to the outer capacitor element section 2604 and its terminal 2630 may also be a foil strip conductor. If desired, foil, wire conductors, etc. may be utilized for all connections.

In the capacitive element 2602 used in the run capacitor 2600, the capacitor section 2604 has a value of about 25.0 microfarads (e.g., about 20 microfarads to about 30 microfarads) and the capacitor section 2606 has a capacitance of about 20.0 microfarads (e.g., about 15 microfarads to about 25 microfarads). The capacitor section 2608 has a capacitance of about 10.0 microfarads (e.g., about 5 microfarads to about 15 microfarads). The capacitor section 2610 has a capacitance of about 5.5 microfarads (e.g., about 2.5 microfarads to about 10 microfarads), but can be identified as having a capacitance of 5.0 microfarads for purposes further discussed in U.S. Pat. No. 10,586,655, incorporated herein in its entirety by reference. The capacitor section 2612 has a capacitance of about 4.5 microfarads (e.g., about 2.5 microfarads to about 10 microfarads) but is labeled as having a capacitance of 5 microfarads, e.g., for purposes described in U.S. Pat. No. 10,586,655, incorporated herein in its entirety by reference. The capacitor section 2614 has a capacitance of 2.8 microfarads (e.g., about 1 microfarad to about 5 microfarads). The capacitor section 2604 with the largest capacitance value also has the most metallic film, and is therefore advantageously located as the outer section or at least one of the three outer sections of the capacitive element 2602.

The run capacitor 2600 also has a case 2646 having a cylindrical side 2648, a bottom side 2650, and an open top 2652 of side 2648. The case 2646 is formed of aluminum and the cylindrical side 2648 has an outside diameter of 2.50 inches. This is a diameter for capacitors of this type, wherein the run capacitor 2600 will be readily received in the mount described above. Other diameters may, however, be used, and the case may also be of a suitable material (e.g., plastic).

The capacitive element 2602 with the wires and the foil strip 2642 are received in the case 2646 with the element common terminal adjacent the bottom side 2664 of the case. An insulating bottom cup 2654 is preferably provided for insulating the capacitive element 2602 from the bottom side 2650, the bottom cup 2654 having a center post 2656 that is received in the center opening 2618 of the mandrel 2616, and an up-turned skirt 2658 that embraces the lower side of the cylindrical capacitive element 2602 and spaces it from the side 2648 of the case 2646.

An insulating fluid 2660 is provided within the case 2646, at least partly and preferably substantially surrounding the capacitive element 2602. The fluid 2660 may be the fluid described in U.S. Pat. No. 6,014,308, incorporated herein by reference in its entirety. In other embodiments, the fluid 2660 can be other fluids, such as polybutene, etc.

The run capacitor 2600 also has a pressure interrupter cover assembly 2662. The cover assembly 2662 includes a deformable circular cover 2664 having an upstanding cylindrical skirt 2666 and a peripheral rim 2668. The skirt 2666 fits into the open top 2652 of the cylindrical side 2648 of case 2646, and the peripheral rim 2668 is crimped to the open top 2652 of the case 2646 to seal the interior of the run capacitor 2600 and the fluid 2660 contained therein.

The pressure interrupter cover assembly 2662 includes seven cover terminals mounted on the deformable cover 2664. A common cover terminal 2670 is mounted generally centrally on the cover 2664, and section cover terminals, each respectively corresponding to one of the capacitor sections 2604, 2606, 2608, 2610, 2612, 2614, are mounted at spaced apart locations surrounding the common cover terminal 2670. The section cover terminal 2672 has three upstanding blades mounted on the upper end of a terminal post. The terminal post has a distal end, opposite the blades. The cover 2664 has an opening for accommodating the terminal post, and has a beveled lip surrounding the opening. A shaped silicone insulator fits snuggly under the cover in the beveled lip and the terminal post passes through the insulator. On the upper side of the cover, an insulator cup 2674 also surrounds the post, and the insulator cup sits atop the silicone insulator; thus, the terminal 2672 and its terminal post are well insulated from the cover 2664. The other cover section terminals are similarly mounted with an insulator cup and a silicone insulator. The pressure interrupter cover assembly 2662 provides such protection for the run capacitor 2600 and its capacitive element 2602. Outgassing can cause the circular cover 2664 to deform upwardly into a generally domed shape. When the cover 2664 deforms, the terminal posts are also displaced upwardly from the disconnect plate 2676, and the weld connection of the distal end of common cover terminal post to the distal end foil lead from the element common terminal 2636 of the capacitive element 2602 is broken, and the welds between the foil tabs and the terminal posts of the section cover terminals are also broken. Locating the common cover terminal 2670 in the center of the cover 2664, where the deformation of the cover 2664 is the greatest, ensures that the common cover terminal connection is broken both first and with certainty in the event of a failure of the capacitive element 2602.

The common cover terminal 2670 has four blades in this example, and a terminal post that passes through a silicone insulator. The common cover terminal 2670 mounts cover insulator barrier 2678 that includes an elongated cylindrical center barrier cup 2680 surrounding and extending above the blades of the common cover terminal 2670, and six barrier fins 2682 that extend respectively radially outwardly from the elongated center barrier cup 2680 such that they are deployed between adjacent section cover terminals. This provides additional protection against any arcing contact between adjacent section cover terminals, with the common cover terminal 2670, etc. Alternatively, the common cover terminal 2670 may be provided with an insulator cup 2680, preferably extending above the blades but with no separating barrier fins, although the barrier fins 2682 are preferred. The terminal post extends through an opening in the bottom of the base of the insulating barrier cup 2680, and through the silicone insulator, to a distal end.

The pressure interrupter cover assembly 2662 has a fiberboard disc through which the terminal posts of the section cover terminals extend. The disc may be also fabricated of other suitable material, such as polymers. The terminal posts are configured as rivets with rivet flanges for assembly purposes. The terminal posts are inserted through the disc, insulators, insulator cups and barrier cup 2680, and the cover terminals are spot welded to the ends of the rivets opposite the rivet flanges. Thus, the rivet flanges secure the cover terminals in the cover 2664, together with the insulator barrier 2678, insulator cups 2674, and silicone insulators. The fiberboard disc facilitates this assembly, but may be omitted, if desired. The distal ends of the terminal posts are preferably exposed below the rivet flanges.

The cover assembly 2662 has a disconnect plate 2676. The disconnect plate 2676 is made of a rigid insulating material, such as a phenolic, is spaced below the cover 2664 by a spacer in the form of a skirt. The disconnect plate 2676 is provided with openings accommodating the distal ends of the terminal posts. The disconnect plate 2676 is further described in prior U.S. Pat. No. 10,586,655, incorporated herein by reference in its entirety.

In prior capacitors having three or fewer capacitor sections, the conductors between the capacitor sections and the terminal posts were generally foil strips, such as the one used for the common element terminal 2636 of the capacitive element 2602 herein. The foil strips were positioned on a breaker plate over the distal ends of terminal posts, and were welded to the distal ends of the terminal posts. In run capacitor 2600, the distal end 2644 of the foil strip 2642 is connected to the distal end of terminal post by welding, as in prior capacitors.

The wires may not be well-configured for welding to the distal ends of the terminal posts of the cover section terminals. However, the wires are desirable in place of foil strips because they are better accommodated in the case 2646 and have good insulating properties, resist nicking and are readily available with colored insulations. In order to make the necessary connection of the wires to their respective terminal posts, foil tabs are welded to each of the distal ends of the terminal posts of the section cover terminals and the guides are helpful in positioning the foil tabs for the welding procedure. The attachment may be accomplished by welding the distal end of a foil strip to the terminal post, and then cutting the foil strip to leave the foil tab. Thereafter, the conductor of the wire is soldered to the tab, by solder. The insulation of the wire has been stripped to expose the conductor. The other wires are similarly connected to their respective cover section terminals. Alternatively, the foil tabs may be soldered to the wires and the tabs may then be welded to the terminal posts, if desired, other conductive attachment may be employed, etc.

Accordingly, each of the capacitor sections 2604, 2606, 2608, 2610, 2612, 2614 is connected to a corresponding section cover terminal by a respective one of color coded wires. The insulator cups 2674 associated with each of the section cover terminals are also color coded, using the same color scheme as used in the wires. This facilitates assembly, in that each capacitor section and its wire conductor are readily associated with the correct corresponding section cover terminal, so that the correct capacitor sections can be identified on the cover to make the desired connections for establishing a selected capacitance value.

The connections of the wires and the foil to the terminal posts are made prior to placing the capacitive element 2602 in the case 2646, adding the insulating fluid 2660, and sealing the cover 2664 of cover assembly 2662 to the case 2646. The case 2646 may be labeled with the capacitance values of the capacitance sections 2604, 2606, 2608, 2610, 2612, 2614 adjacent the cover terminals, such as on the side of case 2646 near the cover 2664, on the cover 2664, etc.

The run capacitor 2600 may be used to replace a failed capacitor of any one of over two hundred different capacitance values, including both single and dual applications. Therefore, a serviceman is able to replace virtually any failed capacitor he may encounter as he makes service calls on equipment of various manufacturers, models, ages and the like.

As noted above, the run capacitor 2600 is expected to be used most widely in servicing air conditioning units. Air conditioning units typically have two capacitors; a capacitor for the compressor motor which may or may not be of relatively high capacitance value and a capacitor of relatively low capacitance value for a fan motor. The compressor motor capacitors typically have capacitances of from 20 to about 60 microfarads. The fan motor capacitors typically have capacitance values from about 2.5 to 12.5 microfarads, and sometimes as high as 15 microfarads, although values at the lower end of the range are most common.

Figure 52:
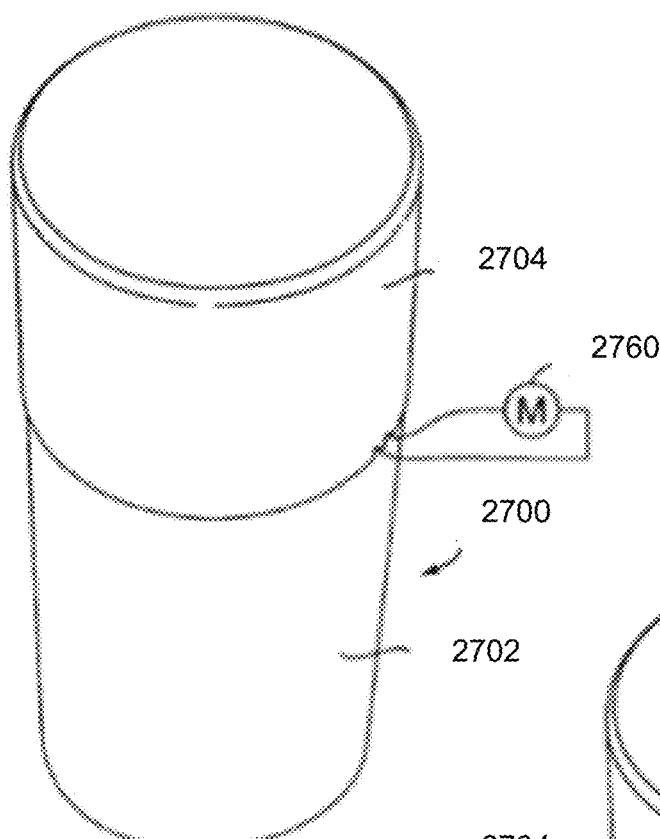
FIG. 52 is a perspective view of an exemplary hard start capacitor connected to a schematic motor.
Figure 53:
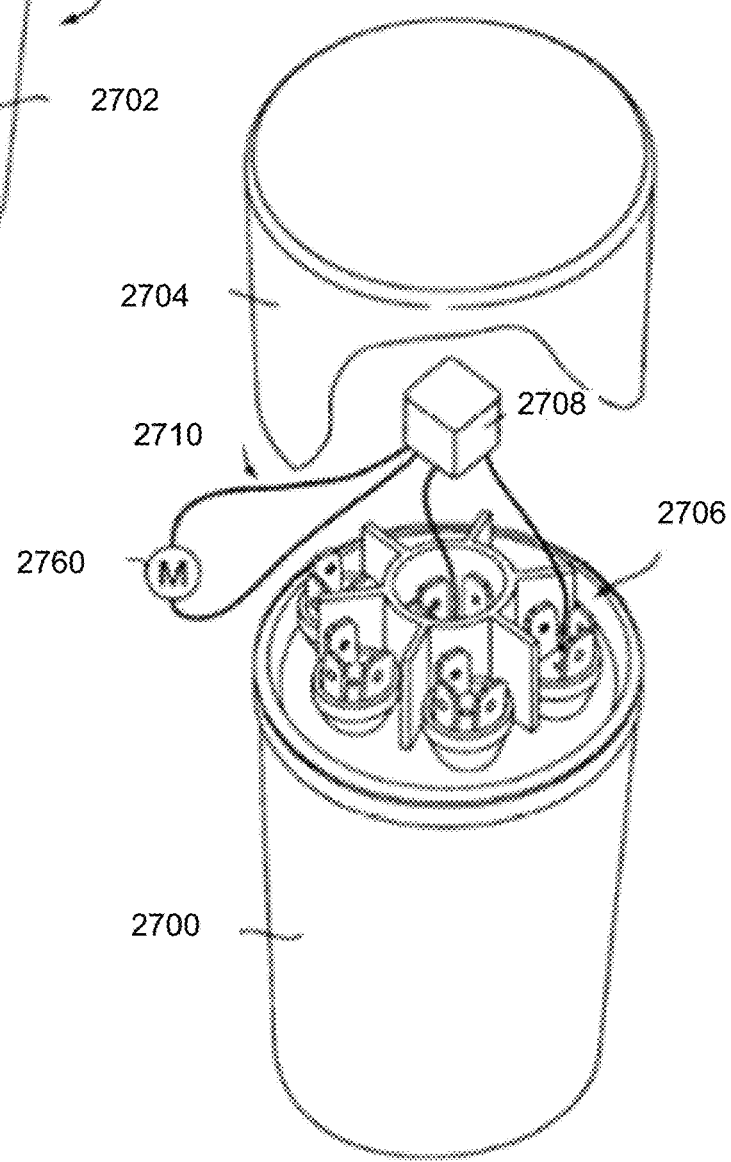
FIG. 53 is an exploded perspective view of the hard start capacitor of FIG. 52.
Figure 54:
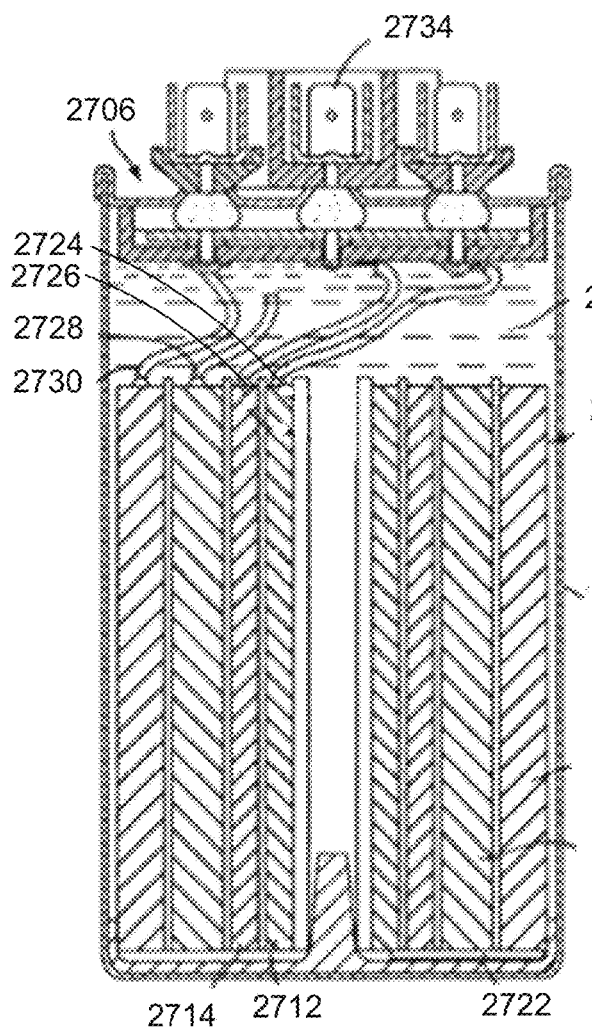
FIG. 54 is a sectional view of the capacitor, capacitor container and cover of the hard start capacitor of FIG. 52.
Figure 56:
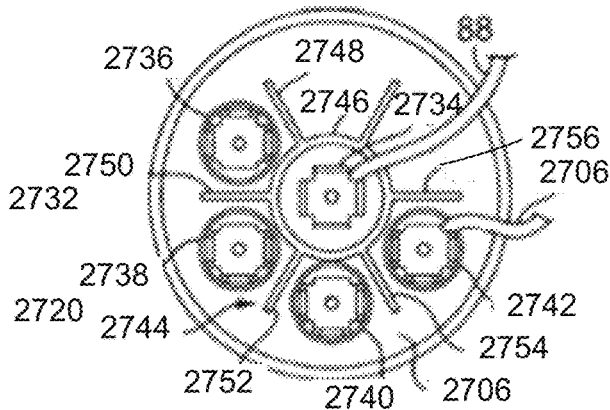
FIG. 56 is a top view of the cover and cover terminals of the hard start capacitor of FIG. 52, showing the capacitors connected to provide a first capacitance value.
Figure 57:
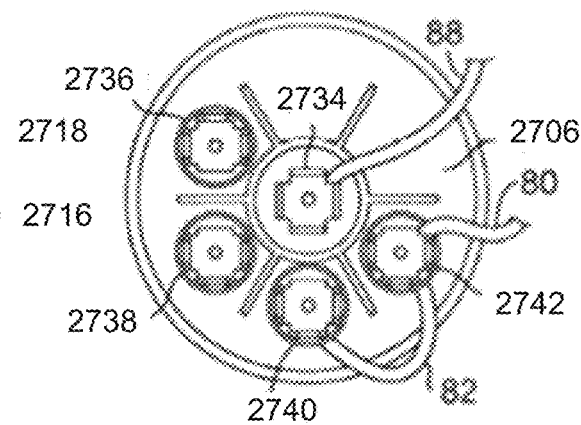
FIG. 57 is a top view of the cover and cover terminals of the hard start capacitor of FIG. 52, showing the capacitors connected to provide a second capacitance value.
Figure 58:
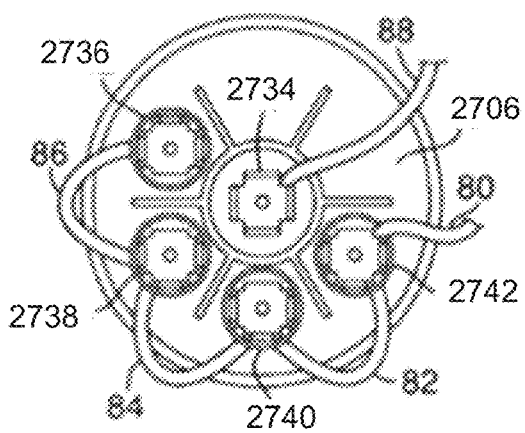
FIG. 58 is a top view of the cover and cover terminals of the hard start capacitor of FIG. 52, showing the capacitors connected to provide a third capacitance value.

The mounts described above can be used to hold capacitors other than run capacitors, e.g., start capacitors. For example, motors can use both run capacitors and start capacitors. Suitable hard start capacitors are described in prior U.S. Pat. No. 10,163,571, which is incorporated herein by reference in its entirety. FIG. 52 illustrates an exemplary hard start capacitor 2700 that can be used with the mounts described herein. The hard start capacitor 2700 includes a cylindrical capacitor container 2702 and a cylindrical cap 2704 fitted onto the container 2702 and extending therefrom. With reference to FIG. 53, the cap 2704 may be removed from the container 2702, to expose the cover 2706 of the container, an electronic relay 2708, and wire means 2710 providing desired electrical connections for the hard start capacitor replacement unit 2700 to a motor 2760.

The container 2702 is preferably 2½ inches in diameter with a length of 5¾ inches and has a plurality of capacitors therein; however other dimensions can be employed. In the embodiment shown, four capacitors 2712, 2714, 2716 and 2718 are provided within the container 2702. Also in the embodiment shown, the capacitors 2712, 2714, 2716 and 2718 are wound in a cylindrical capacitive element 2720 having a common element terminal 2722 at the bottom thereof and four capacitor terminals 2724, 2726, 2728 and 2730 at the top thereof.

The capacitors of capacitive element 2720 are preferably metallized film capacitors concentrically wound together as the cylindrical capacitance element 2720. The film is preferably polypropylene metallized with zinc and may be in a range of approximately 2-4 microns in thickness, for example. This is an advantageous film for several reasons. First, start capacitors generally require a higher capacitance value than run capacitors, i.e., run capacitors generally have typical capacitance values in the range of about 15 to about 65 microfarads, whereas start capacitors may have typical capacitance values up to about 300 microfarads. Such high start capacitance values have generally been achieved with electrolytic capacitors because 300-microfarad capacitors with typical film thicknesses would be bulky and require a large container that may not fit into the space provided in an air conditioning unit or the like. However, with recognition that a start capacitor is utilized for about one second or less as the motor starts, it does not have to be rated at high voltage over a long period of time. Therefore, a thin film may be used and the required capacitance is attained in a reasonably sized capacitive element. A further advantage is that the resultant metallized film capacitive element has stable capacitance values over a relatively wide ambient temperature range, and also has a long service life.

The container is preferably filled with a dielectric fluid 2732 and the cover 2706 is provided with circuit interruption protection in the event the capacitive element fails, such as described in U.S. Pat. No. 7,203,053. These are also advantages in fabricating the capacitors 2712, 2714, 2716 and 2718 for the hard start capacitor 2700 from metallized film. In some implementations, the container is at least partially filled with, e.g., solidified epoxy or resin (e.g., urethane, polyurethane, acrylic, cyanoacrylate, etc.) or a combination of materials. For example, the container can be halfway filled with epoxy, resin, or a combination of materials. In another example, the container can be completely filled with epoxy, resin, or a combination of materials. In some embodiments, circuit interruption protection is provided throughout the container, e.g., in the form of segmented film. For example, a circuit divided with segmented film can provide interruption protection to individual segments of the circuit (e.g., by disconnecting an individual segment of the circuit through segmented film) in the event of a capacitive failure. In some embodiments, a capacitive failure causes a reduction of capacitance as a dielectric film in the circuit segment fails. This occurs as very small links between the segmented circuit separate as high current, created by, e.g., a capacitor or motor malfunction, crosses through the dielectric film, breaking the segmented circuit (e.g., creating an open circuit), which can prevent the damage from spreading throughout the circuit. The film can be, e.g., between about 4.0 µm and 4.8 µm in thickness, between about 6.8 µm and 5.8 µm in thickness, or between about 1.0 µm and 25 µm in thickness.

Although it is preferable to provide the capacitors in a cylindrical capacitive element 30 wound of metallized film, the capacitors 2712, 2714, 2716, 2718 may be individual wound capacitors having respective ends electrically connected to form a common terminal. The individual wound capacitors can be connected in a variety of ways to provide the desired capacitances. For example, in several implementations, the individual wound capacitors can be connected in series to provide the desired capacitances. In other implementations, the individual wound capacitors can be connected in parallel to provide the desired capacitances. In some implementations, individual wound capacitors can be connected to each other in a mixture of series and parallel (e.g., some wound capacitors can be connected in series and some can be connected in parallel). The capacitive element 2720 may be provided with more or less than four capacitors if desired. The capacitors may also be provided as two or more capacitive elements each having multiple capacitors.

It is also contemplated to make a hard start capacitor replacement unit with a single multiple value electrolytic capacitor or multiple electrolytic capacitors that may be connected to provide selectable total capacitance values. However, according to present electrolytic capacitor technology, the container for such a capacitor or capacitors would necessarily be larger than the container for a metallized film capacitive element and the capacitance value would not be as stable over ambient temperature ranges.

In the hard start capacitor replacement unit 2700 shown and described herein, the capacitors can have a range of values. For example, capacitor 2712 has terminal 2724 and can have a range of values (e.g., a capacitance of 48 microfarads, 44 microfarads, 42 microfarads, etc.). Capacitor 2714 has terminal 2726, and can also have a range of values (e.g., a capacitance of 48 microfarads, 44 microfarads, 42 microfarads, etc.). Capacitor 2716 has capacitor terminal 2728, and can have a range of value (e.g., a capacitance of 88 microfarads, 84 microfarads, 82 microfarads, etc.) and capacitor 2718 has capacitor terminal 2730 and can have a range of values (e.g., a capacitance of 114 microfarads, 112 microfarads, 110 microfarads, etc.).

As perhaps as best seen in FIGS. 56-59, the cover 2706 mounts a common cover terminal 2734 in the center thereof, and mounts capacitance value terminals 2736, 2738, 2740 and 2742 spaced apart from the common cover terminal 2734 and from each other. The common cover terminal 2734 is connected to common element terminal 2722 of the capacitive element 2720 and thereby to each of the capacitors 2736, 2738, 2740 and 2742. The capacitance value cover terminal 2736 is connected with the terminal 2724 of capacitor 2712 and the capacitance cover terminal 2738 is connected with the capacitor terminal 2726 of capacitor 2714. The capacitance cover terminal 2740 is connected with the capacitor terminal 2728 of capacitor 2716 and capacitance value cover terminal 2742 is connected with the capacitor terminal 2730 of the capacitor 2718. Therefore, the capacitance values of the capacitors 2712, 2714, 2716, 2718 are respectively available for wire connections at the corresponding capacitance value cover terminals 2736, 2738, 2740, 2742 on the cover 2706 of container 2702.

A cover insulation barrier 2744 is also mounted to the cover 2706 to better isolate the cover terminals. The cover insulation barrier 2744 has a cylindrical portion 2746 surrounding the common cover terminal 2734 and has radial extending fins 2748, 2750, 2752, 2754, 2756 that separate the other capacitance value cover terminals. An extra fin is shown, which would insulate another one or two cover terminals if an additional one or two capacitors were provided.

Figure 55:
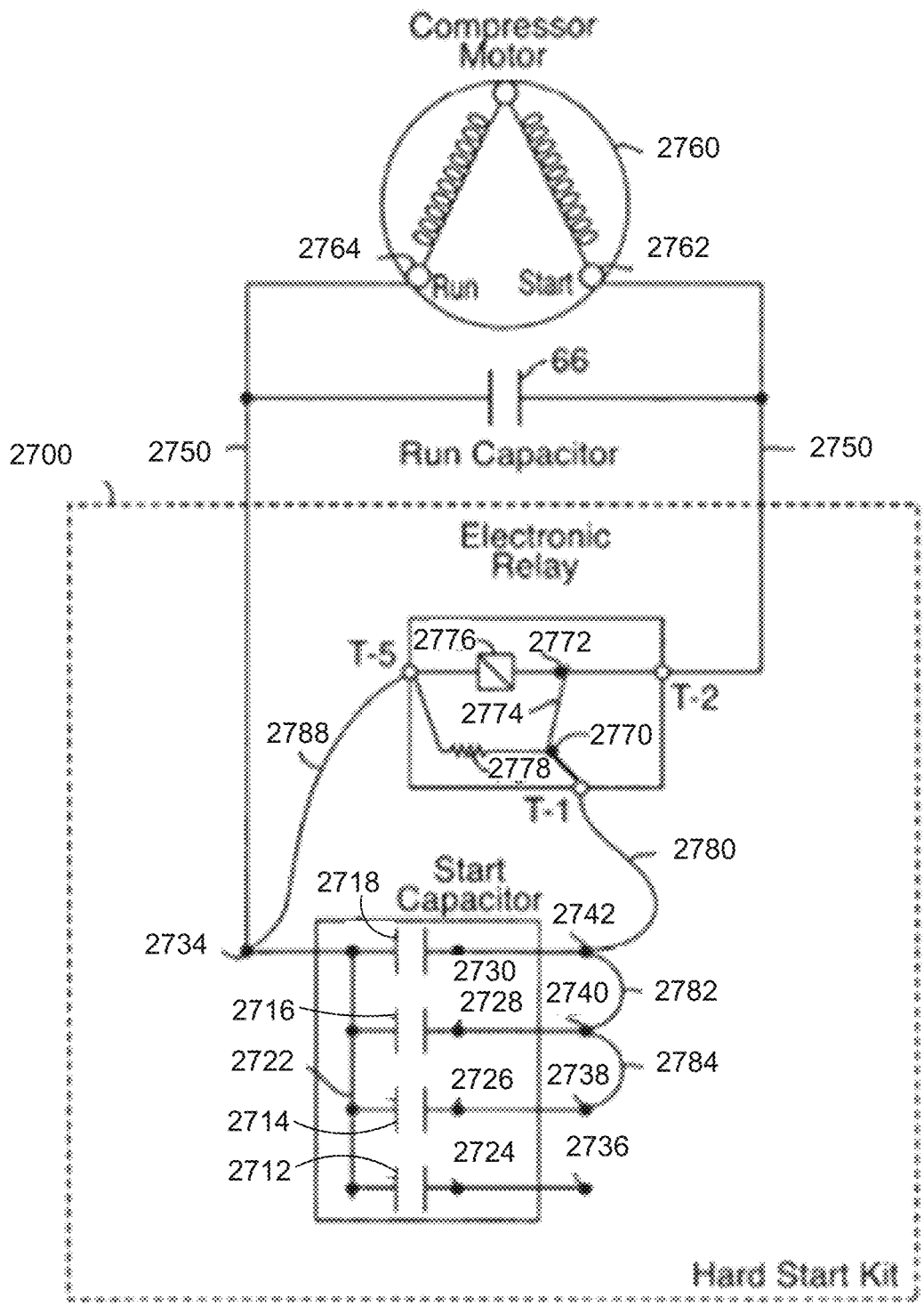
FIG. 55 is a schematic circuit diagram of the hard start capacitor of FIG. 52, shown connected to a motor.

With reference to FIG. 55, a schematic of the operation of the hard start capacitor 2700 is shown. The electronic relay 2708 has external terminals that accept wire termination clips, so that wire connections can be made between the common cover terminal 2734, and the capacitance value cover terminals 2736, 2738, 2740 and 2742, as well as with the start and run terminals 2762 and 2764 of a motor 2760. External terminals T-1 and T-2 of electronic relay 2706 are internally connected with contacts 2770 and 2772 that may be closed by a contact bar 2774, all schematically shown. The electronic relay 2708 also has external terminal T-5, and the electronic relay 2708 has circuitry indicated at 2776 that monitors the voltage and the dv/dt between terminals T-2 and T-5 and controls the opening and closing of the contacts 2770 and 2772 in response thereto. Terminals T-2 and T-5 are connected to the start and run terminals 2762 and 2764 of compressor motor 60 by wires 2750, so that the electronic relay is monitoring the voltage across the start and run windings. Terminal T-5 may also be connected between the start and run windings of motor 2760. When the contacts 2770 and 2772 are closed, the electronic relay 2708 connects the selected ones of the capacitors 2712, 2714, 2716 and 2718 across the terminals 2762 and 2764 in parallel with the run capacitor 2766 to assist in starting the motor. A bleeder resister 2778 discharges the capacitor(s) when contacts 2770, 2772 are open. A suitable electronic relay is available from Zhejiang Hongli Electric Co., Part No. HLR3800-6AM1D.

It will also be appreciated that although the capacitors of the hard start unit 2700 are shown connected across motor terminals 2762, 2764, the purpose of this connection is to connect the capacitors of the start capacitor in parallel with the motor run capacitor 2766 of the motor 2760, and any connection that accomplishes this is suitable.

Figure 59:
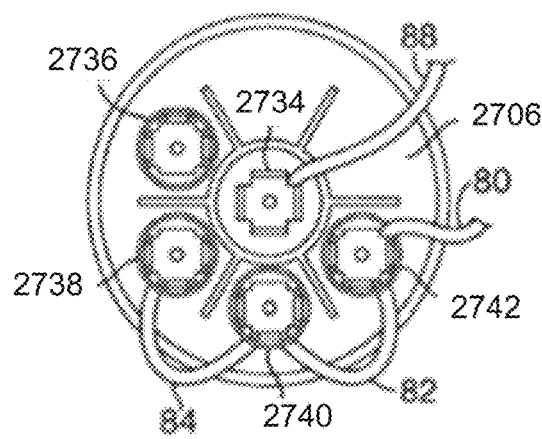
FIG. 59 is a top view of the cover and cover terminals of the hard start capacitor of FIG. 52 showing the capacitors connected to provide a fourth capacitance value.

The capacitors 2712, 2714, 2716 and 2718 are connected as also shown in FIG. 59, in which a first wire 2780 connects T-1 of the electronic relay with the capacitance value cover terminal 2742, which can provide 112 microfarads of capacitance value. Jumper wire 2782 between capacitance value cover terminals 2742 and 2740 can provide an additional 88 microfarads of capacitance value into the circuit. Wire 2788 connects the common terminal 2734 to terminal T-5 of the electronic relay 2708. Jumper wire 2784 connecting capacitance value cover terminal 2738 and capacitance value cover terminal 2740 can provide a further 48 microfarads into the circuit. Thus, in the configuration shown in FIGS. 53 and 57, a total capacitance of 248 microfarads is provided to start the motor 2760 when the contacts of the electronic relay 2708 are closed.

The mount and the features thereof described above are believed provide a practical and valuable advance in the art by facilitating efficient replacement and mounting of capacitors. Those skilled in the art will appreciate that the foregoing description is illustrative and that various modifications may be made without departing from the spirit and scope of the invention, which is defined in the following claims.

The invention claimed is:

1. A system comprising:
   an apparatus suitable for use in an air-conditioning system and configured to provide a plurality of selectable capacitance values, the apparatus comprising:
   at least three capacitive devices, each of the at least three capacitive devices providing a capacitor having a capacitance value, each of the at least three capacitive devices having a capacitor terminal;
   a case configured to receive the at least three capacitive devices, the case having an open end;
   a cover positioned at the open end of the case, the cover comprising:
   at least three capacitor cover terminals, each of the at least three capacitor cover terminals corresponding to one of the at least three capacitors, and each of the at least three capacitor cover terminals having three contacts extending from the cover;

at least three insulation structures, each of the at least three insulation structures configured to provide insulation for a respective one of the at least three capacitor cover terminals; and a common cover terminal having four contacts extending from the cover, wherein the common cover terminal is electrically connected to the at least three capacitive devices;

at least three conductors, each of the at least three conductors configured to electrically connect the capacitor terminal of one of the at least three capacitive devices to the corresponding capacitor cover terminal; and a bottom cup having a post, the bottom cup positioned within the case between at least one of the at least three capacitive devices and a bottom wall of the case; and a mount comprising:

a rectangular shaped back surface configured to interface to a surface of a separate object;

a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter;

a connector extending from the rectangular shaped back surface, the connector being configured to interface to another connector of a second mount; and a channel configured to receive a strap and that extends through the mount, the channel having a closed channel portion, a first open channel portion, and a second open channel portion;

wherein the strap extends through the channel and secures the apparatus to the mount.

2. The mount of claim 1, further comprising a plurality of openings, each opening of the plurality of openings configured to receive a cable tie and each opening of the plurality of openings extending through the mount.

3. The mount of claim 2, wherein each opening of the plurality of openings is connected through a series of channels.

4. The mount of claim 2, wherein each opening has dimensions of about 0.1 inches by about 0.25 inches.

5. The mount of claim 1, wherein the first arch having the first radius is located at a center of the first arch-shaped cutout, and the second arch having the second radius is located at a first end and a second end of the first arch-shaped cutout.

6. The mount of claim 1, further comprising a plurality of holes configured to receive fasteners and that extend through the mount to the rectangular shaped back surface.

7. The mount of claim 1, wherein the rectangular shaped back surface has a height in a range of one inch to five inches and a width in a range of one inch to ten inches.

8. The mount of claim 1, wherein the channel configured to receive the strap has dimensions of about 0.25 inches by about 0.5 inches.

9. The mount of claim 1, wherein the first radius is about 2.16 inches.

10. The mount of claim 9, wherein the second radius is about 2.5 inches.

11. The mount of claim 1, wherein the mount is formed of at least one of the following materials: polymer, ceramic, and metal.

12. A system comprising:

a first apparatus suitable for use in an air-conditioning system and configured to provide a first plurality of selectable capacitance values, the first apparatus comprising:

at least three capacitive devices, each of the at least three capacitive devices providing a first capacitor having a capacitance value, each of the at least three capacitive devices having a capacitor terminal;

a case configured to receive the at least three capacitive devices, the case having an open end;

a cover positioned at the open end of the case, the cover comprising:

at least three capacitor cover terminals, each of the at least three capacitor cover terminals corresponding to one of the at least three capacitors, and each of the at least three capacitor cover terminals having three contacts extending from the cover;

at least three insulation structures, each of the at least three insulation structures configured to provide insulation for a respective one of the at least three capacitor cover terminals; and a common cover terminal having four contacts extending from the cover, wherein the common cover terminal is electrically connected to the at least three capacitive devices;

at least three conductors, each of the at least three conductors configured to electrically connect the capacitor terminal of one of the at least three capacitive devices to the corresponding capacitor cover terminal;

a second apparatus suitable for use in the air-conditioning system and configured to provide a second plurality of selectable capacitance values, the second apparatus comprising:

a container capable of receiving a plurality of capacitive devices, each of the capacitive devices having a first capacitor terminal and a second capacitor terminal;

a cover mountable to the container, the cover comprising:

a common cover terminal having at least one contact extending from the cover;

a plurality of capacitor cover terminals, each of the plurality of capacitor cover terminals having at least one contact extending from the cover; and a plurality of insulation structures, each insulation structure associated with one of the plurality of capacitor cover terminals;

a plurality of first conductors, each first conductor electrically connectable to one of the first capacitor terminals of the plurality of capacitive devices and one of the plurality of capacitor cover terminals;

a second conductor electrically connectable to each of the second capacitor terminals of the plurality of capacitive devices and the common cover terminal; and a relay having contacts and being capable of opening said contacts in response to a condition;

a first mount comprising:

a rectangular shaped back surface configured to interface to a surface of a separate object;
a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter;
a connector extending from the rectangular shaped back surface, the connector being configured to interface to another connector of a second mount; and
a channel configured to receive a strap and that extends through the first mount, the channel having a closed channel portion, a first open channel portion, and a second open channel portion; and
a second mount comprising:
a rectangular shaped back surface configured to interface to a surface of a separate object;
a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter;
a connector extending from the rectangular shaped back surface, the connector being configured to interface to the first connector of the first mount; and
a channel configured to receive a strap and that extends through the second mount, the channel having a closed channel portion, a first open channel portion, and a second open channel portion;
wherein a first strap extends through the channel of the first mount and around the first apparatus and secures the first apparatus to the first mount, wherein a second strap extends through the channel of the second mount and around the second apparatus and secures the second apparatus to the second mount, and wherein the first mount is connected to the second mount via the interface between the connector of the first mount and the connector of the second mount.

13. The system of claim 12, wherein at least one of the first mount and the second mount further comprises a plurality of openings, each opening of the plurality of openings configured to receive a cable tie and each opening of the plurality of openings extending through the at least one of the first mount and the second mount.

14. The system of claim 13, wherein each opening of the plurality of openings is connected through a series of channels.

15. The system of claim 13, wherein each opening has dimensions of about 0.1 inches by about 0.25 inches.

16. The system of claim 12, wherein the first mount is substantially identical to the second mount.

17. The system of claim 12, wherein at least one of the first mount and the second mount comprises a plurality of holes configured to receive fasteners and that extend through the at least first mount and the second mount.

18. The system of claim 12, wherein the rectangular shaped back surface of at least one of the first mount and the second mount has a height in a range of one inch to five inches and a width in a range of one inch to ten inches.

19. The system of claim 12, wherein at least one of the first channel and the channel has dimensions of about 0.25 inches by about 0.5 inches.

20. The system of claim 12, wherein the first radius of the first mount and the first radius of the second mount are each about 2.16 inches.

21. The system of claim 20, wherein the second radius of the first mount and the second radius of the second mount are each about 2.5 inches.

22. A system comprising:
a first mount comprising:
a rectangular shaped back surface configured to interface to a surface of a separate object;
a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter;
a connector extending from the rectangular shaped back surface, the connector configured to interface to another connector of a second mount; and
a channel configured to receive a strap and that extends through the first mount, the channel having a closed channel portion, a first open channel portion, and a second open channel portion; and
a second mount comprising:
a rectangular shaped back surface configured to interface to a surface of a separate object;
a first side surface perpendicular to the rectangular back surface and having a first arch-shaped cutout, and a second side surface perpendicular to the rectangular back surface and having a second arch-shaped cutout, wherein each of the first arch-shaped cutout and the second arch-shaped cutout comprises a first arch having a first radius and a second arch having a second radius, different from the first radius, the first radius of the first arch allows the mount to receive a cylindrical-shaped capacitor having a first diameter and the second radius of the second arch allows the mount to receive a cylindrical-shaped capacitor having a second diameter, different from the first diameter;
a connector extending from the rectangular shaped back surface, the connector being configured to interface to the first connector of the first mount; and a channel configured to receive a strap and that extends through the second mount, the channel having a closed channel portion, a first open channel portion, and a second open channel portion;

wherein the first mount is connected to the second mount via the interface between the first connector of the first mount and the second connector of the second mount.

23. The system of claim 22, wherein at least one of the first mount and the second mount further comprises a plurality of openings, each opening of the plurality of openings configured to receive a cable tie and each opening of the plurality of openings extending through the at least one of the first mount and the second mount.

24. The system of claim 23, wherein each opening of the plurality of openings is connected through a series of channels.

25. The system of claim 23, wherein each opening has dimensions of about 0.1 inches by about 0.25 inches.

26. The system of claim 22, wherein the first mount is substantially identical to the second mount.

27. The system of claim 22, wherein at least one of the first mount and the second mount comprises a plurality of holes configured to receive fasteners and that extend through the at least first mount and the second mount.

28. The system of claim 22, wherein the rectangular shaped back surface of at least one of the first mount and the second mount has a height in a range of one inch to five inches and a width in a range of one inch to ten inches.

29. The system of claim 22, wherein at least one of the first channel and the channel has dimensions of about 0.25 inches by about 0.5 inches.

30. The system of claim 12, wherein the first radius of the first mount and the first radius of the second mount are each about 2.16 inches, and wherein the second radius of the first mount and the second radius of the second mount are each about 2.5 inches.

* * * * *